US012772603B2

(12) United States Patent
Tong et al.

(10) Patent No.: US 12,772,603 B2
(45) Date of Patent: Oct. 20, 2026

(54) BACK CONTACT SOLAR CELL AND METHOD FOR MANUFACTURING SAME AND PHOTOVOLTAIC MODULE

(71) Applicant: LONGI GREEN ENERGY TECHNOLOGY CO., LTD., Xi'an (CN)

(72) Inventors: Hongbo Tong, Xi'an (CN); Yupeng Jin, Xi'an (CN); Chang Liu, Xi'an (CN); Long Yu, Xi'an (CN); Shi Chen, Xi'an (CN); Chen Chen, Xi'an (CN); Xinxing Xu, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/158,323

(22) PCT Filed: Apr. 1, 2025

(86) PCT No.: PCT/CN2025/086660
§ 371 (c)(1),
(2) Date: Aug. 20, 2025

(87) PCT Pub. No.: WO2026/011854
PCT Pub. Date: Jan. 15, 2026

(65) Prior Publication Data

US 2026/0114076 A1 Apr. 23, 2026

(30) Foreign Application Priority Data

Jul. 10, 2024 (CN) ......................... 202410918519.1
Jul. 10, 2024 (CN) ......................... 202410918523.8

(51) Int. Cl.
*H10F 77/30* (2025.01)
*H10F 10/144* (2025.01)

(52) U.S. Cl.
CPC ......... *H10F 77/311* (2025.01); *H10F 10/144* (2025.01)

(58) Field of Classification Search
CPC .................. H10F 10/00–19; H10F 19/00–908
(Continued)

(56) References Cited

U.S. PATENT DOCUMENTS

2016/0284924 A1 9/2016 Bronsveld et al.
2020/0335642 A1 10/2020 Rim et al.
(Continued)

FOREIGN PATENT DOCUMENTS

AU 2022353466 A1 4/2024
CN 105122460 A 12/2015
(Continued)

OTHER PUBLICATIONS

Office Action in Australian Appln. No. 2025234300, mailed on Oct. 22, 2025, 8 pages.
(Continued)

*Primary Examiner* — Bach T Dinh
(74) *Attorney, Agent, or Firm* — Fish & Richardson P.C.

(57) ABSTRACT

The present application discloses a back contact solar cell and a photovoltaic module. An example back contact solar cell includes a semiconductor substrate, a first doped semiconductor layer, a second doped semiconductor layer, and a dielectric layer. The first doped semiconductor layer is disposed on a first region and a third region. The second doped semiconductor layer is disposed on a second region and the third region. A doping type of the first doped semiconductor layer is opposite to that of the second doped semiconductor layer. On the third region, the first doped semiconductor layer and the second doped semiconductor layer overlap in a thickness direction of the semiconductor substrate to form a stacked structure. The dielectric layer is
(Continued)

disposed at least between the first doped semiconductor layer and the second doped semiconductor layer. A leakage path is disposed in the dielectric layer.

15 Claims, 15 Drawing Sheets

(58) Field of Classification Search
USPC .................................................. 136/243–265
See application file for complete search history.

(56) References Cited

U.S. PATENT DOCUMENTS

| | | | | |
|---|---|---|---|---|
| 2024/0313136 | A1* | 9/2024 | Wang | H10F 77/147 |
| 2024/0413259 | A1 | 12/2024 | Chen et al. | |
| 2025/0331314 | A1* | 10/2025 | Li | H10F 10/16 |

FOREIGN PATENT DOCUMENTS

| | | | |
|---|---|---|---|
| CN | 216488083 | U | 5/2022 |
| CN | 115513309 | A | 12/2022 |
| CN | 116913998 | A | 10/2023 |
| CN | 117317036 | A | 12/2023 |
| CN | 117650188 | A | 3/2024 |
| CN | 117976743 | A | 5/2024 |
| CN | 118099245 | A | 5/2024 |
| CN | 118156327 | A | 6/2024 |
| CN | 118198155 | A | 6/2024 |
| CN | 118198159 | A | 6/2024 |
| CN | 118472069 | A | 8/2024 |
| CN | 118472071 | A | 8/2024 |
| DE | 102022116798 | A1 | 1/2024 |
| DE | 202023107467 | U1 | 1/2024 |
| KR | 10-2016-0016303 | A | 2/2016 |
| KR | 10-2016-0111622 | A | 9/2016 |
| KR | 10-2018-0050020 | A | 5/2018 |
| WO | 2021/232715 | A1 | 11/2021 |
| WO | 2024/000399 | A1 | 1/2024 |
| WO | WO 2024/041126 | A1 | 2/2024 |
| WO | WO 2024/114031 | A1 | 6/2024 |

OTHER PUBLICATIONS

International Search Report and Written Opinion in International Appln. No. PCT/CN2025/086660, mailed on Jul. 18, 2025, 8 pages (with machine translation).
Office Action in Chinese Appln. No. 202410918519.1, mailed on Aug. 26, 2024, 9 pages (with English translation).
Office Action in Chinese Appln. No. 202410918523.8, mailed on Aug. 24, 2024, 9 pages (with English translation).
Extended European Search Report in European Appln. No. 25765464.0, mailed on Jul. 3, 2026, 10 pages.
Office Action in Australian Appln. No. 2026205030, mailed on Jul. 3, 2026, 4 pages.

* cited by examiner

BACK CONTACT SOLAR CELL AND METHOD FOR MANUFACTURING SAME AND PHOTOVOLTAIC MODULE

CROSS-REFERENCE TO RELATED APPLICATIONS

This application is a 371 national stage application of PCT Application No. PCT/CN2025/086660, filed on Apr. 1, 2025, which claims priorities to Chinese Patent Application Nos. 202410918523.8 and 202410918519.1, both filed on Jul. 10, 2024. The disclosures of the aforementioned applications are hereby incorporated by reference in their entireties.

TECHNICAL FIELD

The present application relates to the field of photovoltaic technologies, and in particular, to a back contact solar cell and a method for manufacturing same and a photovoltaic module.

BACKGROUND

A back contact solar cell is a solar cell in which no electrode is provided on a light-receiving surface of the solar cell and both positive and negative electrodes are disposed on a back surface of the solar cell, so that the shading of the electrodes on the solar cell can be reduced, the short-circuit current of the solar cell can be increased, and the energy conversion efficiency of solar cell can be improved.

From the perspective of a back contact solar cell, two doped semiconductor layers with opposite doping types included in the back contact solar cell need to be spaced apart to suppress forward leakage, so that the back contact solar cell has high photoelectric conversion efficiency in a forward voltage region. From the perspective of a photovoltaic module, when two doped semiconductor layers with opposite doping types included in a back contact solar cell in the photovoltaic module are spaced apart, a gap between the two has large resistance and corresponds to a large reverse breakdown voltage, resulting in high hot-spot risk in the back contact solar cell. In the foregoing case, in existing solar cells, two doped semiconductor layers with opposite doping types are partially electrically connected to reduce hot-spot risk in the solar cells to some extent.

However, existing back contact solar cells with low hot-spot risk have suboptimal operating performance.

SUMMARY

An objective of the present application is to provide a back contact solar cell and a method for manufacturing same and a photovoltaic module, in which a partial region of a first doped semiconductor layer and a partial region of a second doped semiconductor layer with opposite doping types in a stacked structure are directly or indirectly connected by a leakage path disposed in a dielectric layer, so that while the back contact solar cell has low hot-spot risk, a portion of the dielectric layer in which the leakage path is not disposed can effectively reduce direct transport and recombination of carriers collected by the first doped semiconductor layer and the second doped semiconductor layer in the stacked structure, thereby effectively controlling leakage loss of the back contact solar cell, and providing the back contact solar cell with good operating performance.

To achieve the foregoing objective, according to a first aspect, the present application provides a back contact solar cell. The back contact solar cell includes a semiconductor substrate, a first doped semiconductor layer, a second doped semiconductor layer, and a dielectric layer. The semiconductor substrate includes a first surface and a second surface that are opposite to each other. The first surface includes a first region and a second region that are spaced apart and a third region that is located between the first region and the second region. The first doped semiconductor layer is disposed on the first region and the third region. The second doped semiconductor layer is disposed on the second region and the third region. A doping type of the first doped semiconductor layer is opposite to that of the second doped semiconductor layer. On the third region, the first doped semiconductor layer and the second doped semiconductor layer overlap in a thickness direction of the semiconductor substrate to form a stacked structure. The dielectric layer is disposed at least between the first doped semiconductor layer and the second doped semiconductor layer. At least one leakage path is disposed in the dielectric layer.

In the back contact solar cell provided in the present application, on the third region, the first doped semiconductor layer and the second doped semiconductor layer with opposite doping types can overlap in the thickness direction of the semiconductor substrate to form the stacked structure. Next, the back contact solar cell further includes the dielectric layer disposed at least between the first doped semiconductor layer and the second doped semiconductor layer. The dielectric layer can achieve the physical separation between the first doped semiconductor layer and the second doped semiconductor layer included in the stacked structure. The at least one leakage path is disposed in the dielectric layer. In this case, a partial region of the first doped semiconductor layer and a partial region of the second doped semiconductor layer in the stacked structure can directly or indirectly achieve an electrical connection by the leakage path. Because the doping type of the first doped semiconductor layer is opposite to that of the second doped semiconductor layer, a butt junction with a low reverse breakdown voltage can be formed between the first doped semiconductor layer and the second doped semiconductor layer in a manner of manufacturing localized leakage points, so that the back contact solar cell has high anti-burnout capability when being shaded, thereby reducing hot-spot risk in back contact solar cells.

In some embodiments, a thickness of a portion of the dielectric layer in which the leakage path is not disposed is greater than or equal to 13 nm.

A thickness of the dielectric layer is greater than or equal to 13 nm, so that the dielectric layer exhibits the functionality of electrically insulating or semi-insulating performance. Therefore, the portion of the dielectric layer in which the leakage path is not disposed can electrically isolate the partial region of the first doped semiconductor layer and the partial region of the second doped semiconductor layer in the stacked structure, so that direct transport and recombination of carriers collected by the first doped semiconductor layer and the second doped semiconductor layer in the stacked structure can be effectively reduced, thereby effectively controlling leakage loss of the back contact solar cell, and providing the back contact solar cell with good operating performance. As can be learned, in the back contact solar cell provided in the present application, leakage loss of the back contact solar cell in a forward voltage region can be effectively controlled through the insulating or semi-insulating characteristic of the portion of the dielectric layer in which the leakage path is not disposed, and controllable leakage is achieved through the leakage path disposed in the dielectric layer, so that controllability over leakage and electrical isolation is achieved while reducing hot-spot risk in the back contact solar cell, thereby facilitating the adjustment of a reverse breakdown voltage and operating efficiency corresponding to the back contact solar cell to achieve a balance. It may be understood that due to the presence of the leakage path, a thickness of the dielectric layer near the leakage path is less than 13 nm. This portion is caused by existing manufacturing process restrictions or other reasons, and as a result, a portion of the dielectric layer in the present application cannot achieve an optimal state. This should also be considered falling within the scope of protection of the present application.

In a possible implementation, the first doped semiconductor layer and the second doped semiconductor layer are connected by the dielectric layer. In this case, when the leakage path does not penetrate the dielectric layer, the connection may be an indirect connection through the dielectric layer. When the leakage path penetrates the dielectric layer, the first doped semiconductor layer may alternatively be directly connected to the second doped semiconductor layer. In a case that the leakage path is present, a portion (the portion includes an electrical conduction characteristic) corresponding to the leakage path forms a reverse leakage region, thereby reducing the reverse breakdown voltage of the back contact solar cell, and improving the anti-burnout capability of the back contact solar cell.

In a possible implementation, a thickness of a portion of the dielectric layer in which the leakage path is disposed is less than or equal to 7 nm. The thickness of the portion of the dielectric layer in which the leakage path is disposed is small. A thickness of the dielectric layer at the leakage path is controlled below 7 nm, to achieve leakage at the leakage path, thereby providing the back contact solar cell with hot-spot resistance. In addition, leakage magnitude between the first doped semiconductor layer and the second doped semiconductor layer is controlled by controlling the thickness of the portion of the dielectric layer at the leakage path, to achieve controllable leakage, and achieve controllability over leakage and electrical isolation, thereby facilitating the adjustment of the reverse breakdown voltage and the operating efficiency corresponding to the back contact solar cell to achieve a balance.

In a possible implementation, the dielectric layer is discontinuous at the leakage path. The impact of isolation by the dielectric layer no longer exists between portions of the first doped semiconductor layer and the second doped semiconductor layer that correspond to the leakage path, thereby reducing the conduction resistance of a portion of the leakage path corresponding to the two. In addition, in a process of forming the first doped semiconductor layer and the second doped semiconductor layer included in the stacked structure, an impedance level against diffusion of doping elements in one of the first doped semiconductor layer and the second doped semiconductor layer included in the stacked structure that is far away from the semiconductor substrate by the portion of the dielectric layer that corresponds to the leakage path to an opposite side of the dielectric layer through the leakage path can be further reduced, thereby increasing a butt area of a direct electrical connection region or an indirect electrical connection region between the first doped semiconductor layer and the second doped semiconductor layer, reducing the reverse breakdown voltage of the back contact solar cell, and further improving the anti-burnout capability of the back contact solar cell in an installation environment with significant shading obstructions such as dust.

In an actual case, both the two types of leakage paths (i.e., the leakage path that does not penetrate the dielectric layer, and the leakage path that penetrates the dielectric layer) may be disposed at different positions of the dielectric layer and used in combination, thereby achieving optimized configuration for leakage current.

In a possible implementation, a butt surface of the connection region between the first doped semiconductor layer and the second doped semiconductor layer has irregular topography.

Compared with that the butt surface at the connection region has smooth and regular topography, when the butt surface at the connection region has irregular topography, concave-convex fluctuation features of the butt surface are conducive to increasing a contact area between the first doped semiconductor layer and the second doped semiconductor layer at the connection region, that is, conducive to increasing a junction region area of the butt junction, thereby further reducing the reverse breakdown voltage of the back contact solar cell and reducing hot-spot risk in back contact solar cells.

In a possible implementation, an included angle less than 90° is formed between the butt surface of the connection region between the first doped semiconductor layer and the second doped semiconductor layer and the first surface included in the semiconductor substrate.

In a case that a thickness of one of the first doped semiconductor layer and the second doped semiconductor layer included in the stacked structure that is close to the semiconductor substrate is fixed, compared with that the butt surface of the connection region between the first doped semiconductor layer and the second doped semiconductor layer is perpendicular to the first surface, when the included angle less than 90° is formed between the butt surface of the connection region and the first surface, the butt surface is obliquely disposed with respect to the first surface, so that the connection region between the first doped semiconductor layer and the second doped semiconductor layer has a large contact area, and the junction region area of the butt junction can be further increased, thereby further reducing the reverse breakdown voltage of the back contact solar cell and reducing hot-spot risk in back contact solar cells. Moreover, when the butt surface of the connection region is obliquely disposed with respect to the first surface, one of the first doped semiconductor layer and the second doped semiconductor layer included in the stacked structure that is far away from the semiconductor substrate further better covers the one close to the semiconductor substrate, to avoid voids or other defects in the one that is far away from the semiconductor substrate at the connection region, thereby improving the yield of the back contact solar cell.

In a possible implementation, the back contact solar cell further includes a third doped semiconductor portion located between the first doped semiconductor layer and the second doped semiconductor layer, and the third doped semiconductor portion is connected to the first doped semiconductor layer and the second doped semiconductor layer.

In a possible implementation, a material of the third doped semiconductor portion includes at least one doping element. A doping type of the third doped semiconductor portion is the same as that of one of the first doped semiconductor layer and the second doped semiconductor layer, and a doping concentration of the doping element in the third doped semiconductor portion is less than that in one of the first doped semiconductor layer and the second doped semiconductor layer that has the same doping type as the third doped semiconductor portion.

An example in which the doping type of the third doped semiconductor portion is the same as that of the second doped semiconductor layer is used for description. When the doping concentration of the doping element in the third doped semiconductor portion is less than that of the doping element in the second doped semiconductor layer, in a direction from the first doped semiconductor layer toward the second doped semiconductor layer, a high-low junction with a doping concentration gradient may be formed between the third doped semiconductor portion and the second doped semiconductor layer. Under the action of the built-in electric field of the high-low junction, the transport and dispersion of leakage current are facilitated, so that the reverse breakdown voltage of the back contact solar cell can be further reduced, thereby improving the anti-burnout capability of the back contact solar cell.

In a possible implementation, the dielectric layer is disposed between at least one of the first doped semiconductor layer and the second doped semiconductor layer and the third doped semiconductor portion, and at least one end of the third doped semiconductor portion is connected to the first doped semiconductor layer or the second doped semiconductor layer by the dielectric layer in which the leakage path is disposed. In this case, the dielectric layer is disposed, so that electrical conduction efficiency between the third doped semiconductor portion and the at least one of the first doped semiconductor layer and the second doped semiconductor layer can be adjusted. For example, insulation or semi-insulation can be achieved through a region of the dielectric layer in which no leakage path is provided, or the control of the electrical conduction efficiency can be achieved by setting the thickness of the dielectric layer. Furthermore, the leakage path may be disposed in the dielectric layer to achieve easier conduction of localized current. Further, a contact area, carrier transport efficiency, and the like of a connection region between the at least one end of the third doped semiconductor portion and the first doped semiconductor layer (or the second doped semiconductor layer) may be controlled by adjusting the quantity and size of the leakage paths disposed in the dielectric layer, thereby achieving the control of leakage in the reverse leakage region on side surfaces of the first doped semiconductor layer and the second doped semiconductor layer included in the stacked structure, and achieving a balance between the reverse breakdown voltage and the operating efficiency corresponding to the back contact solar cell, so that hot spot prevention is achieved, and it is ensured that efficiency loss of the solar cell is minimized or even eliminated.

In a possible implementation, in a case that the dielectric layer is disposed between the at least one of the first doped semiconductor layer and the second doped semiconductor layer and the third doped semiconductor portion, and the at least one end of the third doped semiconductor portion is connected to the first doped semiconductor layer or the second doped semiconductor layer by the dielectric layer in which the leakage path is disposed, at least one Group IIIA doping element and at least one Group VA doping element are doped in a portion of the third doped semiconductor portion close to the dielectric layer, that is, a P-type doping element and an N-type doping element are doped in the portion of the third doped semiconductor portion close to the dielectric layer.

With other factors are kept unchanged, compared with that only one of a Group IIIA doping element and a Group VA doping element is doped in the portion of the third doped semiconductor portion close to the dielectric layer, when both a Group IIIA doping element and a Group VA doping element are doped in the portion of the third doped semiconductor portion close to the dielectric layer, because a doping type of the P-type doping element is opposite to that of the N-type doping element, the doping elements of the two doping types are recombined in the third doped semiconductor portion, so that the conductivity of the third doped semiconductor portion is weakened, and the control of the electrical conduction efficiency is achieved in a manner of adjusting a doping concentration of the other one of the Group IIIA doping element and the Group VA doping element in the dielectric layer, thereby achieving a balance the reverse breakdown voltage and the operating efficiency corresponding to the back contact solar cell.

In a possible implementation, at least one of a butt surface of a connection region between the third doped semiconductor portion and the first doped semiconductor layer and a butt surface of a connection region between the third doped semiconductor portion and the second doped semiconductor layer has irregular topography. For the application principle of the beneficial effects in this case, refer to the application principle of the beneficial effects of that the butt surface of the connection region between the first doped semiconductor layer and the second doped semiconductor layer have irregular topography above. Details are not described herein again.

In a possible implementation, an included angle less than 90° is formed between the first surface included in the semiconductor substrate and at least one of a butt surface of a connection region between the third doped semiconductor portion and the first doped semiconductor layer and a butt surface of a connection region between the third doped semiconductor portion and the second doped semiconductor layer. For the application principle of the beneficial effects in this case, refer to the application principle of the beneficial effects that the included angle less than 90° is formed between the butt surface of the connection region between the first doped semiconductor layer and the second doped semiconductor layer and the first surface included in the semiconductor substrate above. Details are not described herein again.

In a possible implementation, a size of grains in the third doped semiconductor portion is smaller than that in at least one of the first doped semiconductor layer and the second doped semiconductor layer included in the stacked structure. It may be understood that in reality, sizes of grains in even the same region are also inconsistent, and it cannot be ensured that every grain meets the foregoing relationship. Therefore, when sizes of most grains in the third doped semiconductor portion are smaller than the size of grains in the at least one of the first doped semiconductor layer and the second doped semiconductor layer included in the stacked structure, that is, it may be considered that the size of the grains in the third doped semiconductor portion is smaller than that of the grains in the at least one of the first doped semiconductor layer and the second doped semiconductor layer included in the stacked structure.

In a case that the foregoing technical solution is adopted, when grains in a doped semiconductor layer are smaller, more interfaces exist between the grains in the doped semiconductor layer. Therefore, the resistance at a boundary surface of the grains is large. Based on this, the size of the grains in the third doped semiconductor portion is less than that in the at least one of the first doped semiconductor layer and the second doped semiconductor layer included in the stacked structure. In this case, the resistance of the third doped semiconductor portion is greater than the resistance of the at least one of the first doped semiconductor layer and the second doped semiconductor layer included in the stacked structure, thereby enhancing control over carrier transport between the first doped semiconductor layer and the second doped semiconductor layer included in the stacked structure through the third doped semiconductor portion. Therefore, the third doped semiconductor portion with grains of small sizes is disposed between the first doped semiconductor layer and the second doped semiconductor layer included in the stacked structure, so that carrier exchange on two sides can be restricted and the passage of leakage current can be reduced, thereby preventing efficiency loss of the back contact solar cell; and part of leakage current can be consumed and part of leakage current is allowed to pass through, thereby achieving the function of hot spot prevention.

In a possible implementation, an average size of grains in the third doped semiconductor portion is smaller than that in at least one of the first doped semiconductor layer and the second doped semiconductor layer included in the stacked structure. For the application principle of the beneficial effects in this case, refer to the application principle of the beneficial effects of that the size of the grains in the third doped semiconductor portion is smaller than that in the at least one of the first doped semiconductor layer and the second doped semiconductor layer included in the stacked structure above. Details are not described herein again.

In a possible implementation, a crystallinity in the third doped semiconductor portion is less than that in at least one of the first doped semiconductor layer and the second doped semiconductor layer included in the stacked structure. For the application principle of the beneficial effects in this case, refer to the application principle of the beneficial effects that the size of the grains in the third doped semiconductor portion is smaller than that in the at least one of the first doped semiconductor layer and the second doped semiconductor layer included in the stacked structure above. Details are not described herein again.

In a possible implementation, in a case that one of the first doped semiconductor layer and the second doped semiconductor layer included in the stacked structure that is close to the semiconductor substrate is the first doped semiconductor layer, a surface of the third region is higher than a surface of the second region in a direction from the second surface to the first surface; and the dielectric layer further at least extends between a sidewall of a transition from the third region to the second region and the second doped semiconductor layer. Alternatively, in a case that one of the first doped semiconductor layer and the second doped semiconductor layer included in the stacked structure that is close to the semiconductor substrate is the second doped semiconductor layer, a surface of the third region is higher than a surface of the first region in a direction from the second surface to the first surface; and the dielectric layer further at least extends between a sidewall of a transition from the third region to the first region and the first doped semiconductor layer.

In a case that one of the first doped semiconductor layer and the second doped semiconductor layer included in the stacked structure that is close to the semiconductor substrate is the first doped semiconductor layer, when the surface of the third region is higher than the surface of the second region in the direction from the second surface to the first surface, the second doped semiconductor layer extends from the surface of the second region to a portion of the first doped semiconductor layer that corresponds to the third region through the sidewall of the transition from the third region to the second region. Based on this, when the dielectric layer further at least extends between the sidewall of the transition from the third region to the second region and the second doped semiconductor layer, a portion of the dielectric layer that extends to the sidewall of the transition from the third region to the second region can ensure that the dielectric layer fully covers the oppositely doped butt region, to ensure that the back contact solar cell effectively controls leakage loss between the first doped semiconductor layer and the second doped semiconductor layer included in the stacked structure in a case that an installation environment of the back contact solar cell has minimal shading obstructions such as dust, thereby further achieving a balance between the reverse breakdown voltage and the operating efficiency corresponding to the back contact solar cell. Moreover, the portion of the dielectric layer that at least extends to the sidewall of the transition from the third region to the second region further passivates a portion of the semiconductor substrate that corresponds to a boundary between the second region and the third region, thereby further improving the operating performance of the back contact solar cell. Moreover, for the beneficial effects that in a case that one of the first doped semiconductor layer and the second doped semiconductor layer included in the stacked structure that is close to the semiconductor substrate is the second doped semiconductor layer, the surface of the third region is higher than the surface of the first region in the direction from the second surface to the first surface; and the dielectric layer further at least extends between the sidewall of the transition from the third region to the first region and the first doped semiconductor layer, refer to the above. Details are not described herein again.

In a possible implementation, a size of the leakage path is greater than or equal to 12 nm, and/or, the size of the leakage path is smaller than or equal to the thickness of the one of the first doped semiconductor layer and the second doped semiconductor layer included in the stacked structure that is close to the semiconductor substrate.

When the size of the leakage path is greater than or equal to 12 nm, a small reduction extent of the reverse breakdown voltage of the back contact solar cell caused by a small size of the leakage path can be prevented, thereby ensuring that the back contact solar cell has low hot-spot risk. Moreover, when the size of the leakage path is smaller than or equal to the thickness of the one of the first doped semiconductor layer and the second doped semiconductor layer included in the stacked structure that is close to the semiconductor substrate, the entire region of the sidewall of the one of the first doped semiconductor layer and the second doped semiconductor layer included in the stacked structure that is far away from or close to the semiconductor substrate can be prevented from being exposed through the leakage path, thereby facilitating the control of the butt area of the connection region between the first doped semiconductor layer and the second doped semiconductor layer included in the stacked structure, thereby ensuring that the back contact solar cell has low leakage loss in the forward voltage region.

In a possible implementation, the dielectric layer is disposed between a portion of the first doped semiconductor layer and the first region included in the first surface, and the at least one leakage path is disposed in a portion of the dielectric layer that corresponds to the first region. In addition/Alternatively, the dielectric layer is disposed between a portion of the second doped semiconductor layer and the second region included in the first surface, and the at least one leakage path is disposed in a portion of the dielectric layer that corresponds to the second region. The dielectric layer is disposed between a portion of the first doped semiconductor layer and the first region, and/or, between a portion of the second doped semiconductor layer and the second region, so that while at least one of the first region and the second region is passivated, the two may collect carriers in the semiconductor substrate through the leakage path disposed in the dielectric layer, thereby achieving the control of carriers and optimizing the performance of the solar cell.

In a possible implementation, a linear distance between different leakage paths disposed in a portion of the dielectric layer that is located between the first doped semiconductor layer and the second doped semiconductor layer is L1. A linear distance between different leakage paths disposed in a portion of the dielectric layer that is located between the first doped semiconductor layer and the first region or a portion of the dielectric layer that is located between the second doped semiconductor layer and the second region is L2. L1>L2. In addition/Alternatively, a size of the leakage path disposed in the portion of the dielectric layer that is located between the first doped semiconductor layer and the second doped semiconductor layer is A. A size of the leakage path disposed in a portion of the dielectric layer that is located between the first doped semiconductor layer and the first surface or a portion of the dielectric layer that is located between the second doped semiconductor layer and the first surface is B. A>B.

When the back contact solar cell is in the forward voltage region, a portion of the first doped semiconductor layer that corresponds to the first region and a portion of the second doped semiconductor layer that corresponds to the second region need to collect and export carriers of corresponding conductivity types generated after the semiconductor substrate absorbs photons to form a photocurrent. Based on this, the carrier transport capability of the portion of the first doped semiconductor layer that corresponds to the first region and the portion of the second doped semiconductor layer that corresponds to the second region affect the operating efficiency of the back contact solar cell. When the back contact solar cell is shaded, a portion of the third region in which the first doped semiconductor layer and the second doped semiconductor layer are connected forms the reverse leakage region, thereby facilitating the export of leakage current and reducing hot-spot risk. In the foregoing case, when the linear distance L1 between different leakage paths disposed in the portion of the dielectric layer that is located between the first doped semiconductor layer and the second doped semiconductor layer is larger, the density of localized leakage points disposed between the first doped semiconductor layer and the second doped semiconductor layer is smaller. In one aspect, it is convenient to control the magnitude of leakage current, so that the back contact solar cell has high operating efficiency. In another aspect, leakage current is more dispersed, and hot spots are more scattered, to prevent a burn-out problem caused by localized heat concentration, thereby further improving the anti-burnout capability of the back contact solar cell. When the linear distance L2 between different leakage paths disposed in the portion of the dielectric layer that is located between the first doped semiconductor layer and the first region or between the second doped semiconductor layer and the second region is smaller, more channels used for achieving carrier transport may be disposed between the first doped semiconductor layer and the first region or between the second doped semiconductor layer and the second region, thereby improving the carrier collection capability of the first doped semiconductor layer or the second doped semiconductor layer, reducing carrier recombination loss, and further improving the operating efficiency of the back contact solar cell. Moreover, for the beneficial effects of that the size A of the leakage path disposed in the portion of the dielectric layer that is located between the first doped semiconductor layer and the second doped semiconductor layer is greater than the size B of the leakage path disposed in the portion of the dielectric layer that is located between the first doped semiconductor layer and the first surface or between the second doped semiconductor layer and the first surface, refer to the above. Details are not described herein again.

In a possible implementation, the back contact solar cell further includes a first electrode and a second electrode, and the first electrode is electrically connected to the first doped semiconductor layer. The second electrode is electrically connected to the second doped semiconductor layer.

In a possible implementation, the one of the first doped semiconductor layer and the second doped semiconductor layer included in the stacked structure that is close to the semiconductor substrate includes a top surface far away from the semiconductor substrate, a bottom surface close to the semiconductor substrate, and a side surface connecting the bottom surface and the top surface, and the other one of the first doped semiconductor layer and the second doped semiconductor layer included in the stacked structure that is far away from the semiconductor substrate covers a portion of the top surface and a portion of the side surface of the one that is close to the semiconductor substrate. The dielectric layer includes a first dielectric portion and a second dielectric portion. The first dielectric portion is disposed between the other one that is far away from the semiconductor substrate and the top surface of the one that is close to the semiconductor substrate. The second dielectric portion is disposed between the other one that is far away from the semiconductor substrate and the side surface of the one that is close to the semiconductor substrate.

The dielectric layer can control leakage current between the first doped semiconductor layer and the second doped semiconductor layer in the stacked structure in the thickness direction of the semiconductor substrate, and can further control the leakage current between the first doped semiconductor layer and the second doped semiconductor layer in the stacked structure in a direction parallel to the first surface, thereby ensuring that both the reverse breakdown voltage and the leakage loss of the back contact solar cell can meet operating requirements. Moreover, when the first dielectric portion is disposed between the other one that is far away from the semiconductor substrate and the top surface of the one that is close to the semiconductor substrate, and the second dielectric portion is disposed between the other one that is far away from the semiconductor substrate and the side surface of the one that is close to the semiconductor substrate, a non-zero included angle exists between extension directions of the first dielectric portion and the second dielectric portion, and a spacing between the second dielectric portion and an adjacent structure may be controlled by adjusting the included angle, to control an extension range within which the one of the first doped semiconductor layer and the second doped semiconductor layer included in the stacked structure that is far away from the semiconductor substrate can extend to the one of the first doped semiconductor layer and the second doped semiconductor layer included in the stacked structure that is close to the semiconductor substrate through the leakage path, and control the butt area of the connection region between the first doped semiconductor layer and the second doped semiconductor layer, thereby achieving a balance between the operating efficiency and the reverse breakdown voltage of the back contact solar cell.

In a possible implementation, the at least one leakage path is located in the first dielectric portion; and/or the at least one leakage path is located in the second dielectric portion; and/or the at least one leakage path is located between the first dielectric portion and the second dielectric portion.

The arrangement position of the leakage path in the dielectric layer has various possible implementations, so that the applicability of the back contact solar cell provided in the present application to different application scenarios is improved, and it is also not necessary to strictly control manufacturing precision or add an additional operation step to form the leakage path at a fixed position, thereby reducing the manufacturing difficulty of the back contact solar cell and simplifying the manufacturing procedure of the back contact solar cell.

In a possible implementation, a material of the dielectric layer is an insulating material, or, a material of the dielectric layer includes an insulating material and a semiconductor material. The material of the dielectric layer may be solely an insulating material, or may include an insulating material and a semiconductor material, so that while the applicability of the back contact solar cell to different application scenarios is improved, the difficulty of manufacturing the dielectric layer can be reduced.

In a possible implementation, the material of the dielectric layer includes an oxygen element and/or a silicon element.

In a case that the foregoing technical solution is used, a variety of insulating materials, for example, silicon oxide, silicon oxynitride, aluminum oxide, oxide titanium, hafnium dioxide, and the like, contain an oxygen element. Therefore, when the material of the dielectric layer includes an oxygen element, the applicability of the back contact solar cell provided in the present application to different application scenarios can be improved. Moreover, the insulating material containing an oxygen element typically has a high dielectric constant, so that the dielectric layer has a high insulating or semi-insulating characteristic, to further reduce the direct transport and recombination of carriers collected by the first doped semiconductor layer and the second doped semiconductor layer in the stacked structure, thereby ensuring that the back contact solar cell has high photoelectric conversion efficiency. Moreover, when the material of the dielectric layer contains a silicon element, the compatibility of the dielectric layer with each of the first doped semiconductor layer and the second doped semiconductor layer made of a semiconductor material can be improved, thereby further improving the operating performance of the back contact solar cell.

In a possible implementation, in a case that the material of the dielectric layer includes an insulating material and a semiconductor material, the type of the semiconductor material in the dielectric layer is the same as the type of the semiconductor material in the one of the first doped semiconductor layer and the second doped semiconductor layer included in the stacked structure that is close to the semiconductor substrate.

In a case that the foregoing technical solution is used, in the thickness direction of the semiconductor substrate, the dielectric layer at least covers the one of the first doped semiconductor layer and the second doped semiconductor layer included in the stacked structure that is close to the semiconductor substrate. Based on this, in an actual manufacturing process, when the type of the semiconductor material in the dielectric layer is the same as the type of the semiconductor material in the one of the first doped semiconductor layer and the second doped semiconductor layer included in the stacked structure that is close to the semiconductor substrate, during the selective etching of the entire first doped semiconductor layer or second doped semiconductor layer under the masking of the insulating material included in the dielectric layer, an etchant does not completely remove a portion of the first doped semiconductor layer or the second doped semiconductor layer the is close to the insulating material. In this case, an etching time corresponding to the etchant is relatively short, so that the impact of the etchant on the dielectric layer can be reduced, and it is ensured that the size of the leakage path opened in the dielectric layer is kept from being excessively large, thereby further improving the control level of leakage loss by the dielectric layer, and further improving the operating efficiency of the back contact solar cell.

In some embodiments, a portion of the dielectric layer disposed between the first doped semiconductor layer and the second doped semiconductor layer in the thickness direction of the semiconductor substrate is the first dielectric portion. In the dielectric layer, the at least one leakage path is disposed in the first dielectric portion. On the third region, in a direction from the first region to the second region, a width of the first dielectric portion is greater than or equal to a width of one of the first doped semiconductor layer and the second doped semiconductor layer included in the stacked structure that is far away from the semiconductor substrate.

The dielectric layer included in the back contact solar cell includes the first dielectric portion disposed between the first doped semiconductor layer and the second doped semiconductor layer in the thickness direction of the semiconductor substrate. The first dielectric portion with a width greater than or equal to that of the one of the first doped semiconductor layer and the second doped semiconductor layer included in the stacked structure that is far away from the semiconductor substrate is disposed, to achieve the control of electrical transport between the first doped semiconductor layer and the second doped semiconductor layer included in the stacked structure. At least one leakage path is disposed in the first dielectric portion. In this case, the partial region of the first doped semiconductor layer and the partial region of the second doped semiconductor layer in the stacked structure can directly or indirectly achieve the electrical connection by the leakage path. Because the doping type of the first doped semiconductor layer is opposite to that of the second doped semiconductor layer, the butt junction with the low reverse breakdown voltage can be formed between the first doped semiconductor layer and the second doped semiconductor layer in a manner of manufacturing localized leakage points, so that the back contact solar cell has high anti-burnout capability when being shaded, thereby reducing hot-spot risk in back contact solar cells. Moreover, in the dielectric layer, the leakage path is disposed in the first dielectric portion. Because the first doped semiconductor layer and the second doped semiconductor layer included in the stacked structure have surface topography approximately parallel to the first surface, the surface topography has simple surface topography compared with the side surfaces of the first doped semiconductor layer and the second doped semiconductor layer. Therefore, the leakage path is disposed in the first dielectric portion, so that without restriction in structural complexity, it is only necessary to adjust a corresponding leakage path pattern or an arrangement position, and other factors do not need to be considered. For example, compared with conventional etching, during manufacturing of the leakage path using etching, it may be additionally further necessary to adjust an etching angle, to reduce the difficulty of opening the leakage path in the dielectric layer through laser etching or another process, so that while the manufacturing difficulty of the back contact solar cell is reduced, the compatibility of the back contact solar cell provided in the present application with conventional manufacturing processes of a back contact solar cell can be improved, thereby enhancing a method for manufacturing a back contact solar cell.

Moreover, the dielectric layer can achieve physical separation, and a function layer having electrically insulating or semi-insulating performance may be chosen to achieve the control of electrical transport between the first doped semiconductor layer and the second doped semiconductor layer in the stacked structure. Therefore, the portion of the dielectric layer in which the leakage path is not disposed can electrically isolate the partial region of the first doped semiconductor layer and the partial region of the second doped semiconductor layer in the stacked structure, so that direct transport and recombination of carriers collected by the first doped semiconductor layer and the second doped semiconductor layer in the stacked structure can be effectively reduced, thereby effectively controlling leakage loss of the back contact solar cell, and providing the back contact solar cell with good operating performance. As can be learned, in the back contact solar cell provided in the present application, while hot-spot risk in back contact solar cells is reduced through the leakage path disposed in the dielectric layer, the leakage loss of the back contact solar cell in the forward voltage region can be further effectively controlled through the insulating characteristic of the portion of the dielectric layer in which the leakage path is not disposed. In addition, in the dielectric layer, compared with that the leakage path is opened at a corresponding position in the side surface of the one of the first doped semiconductor layer and the second doped semiconductor layer included in the stacked structure that is close to the semiconductor substrate using an etching process, the difficulty and precision of only opening the leakage path in the first dielectric portion between the first doped semiconductor layer and the second doped semiconductor layer disposed in the thickness direction of the semiconductor substrate are higher, so that it is easier to achieve precise control of leakage and insulation, thereby adjusting the reverse breakdown voltage and the operating efficiency corresponding to the back contact solar cell to achieve a balance.

In a possible implementation, in a single stacked structure, in an extension direction of the stacked structure, the leakage path is continuously distributed. In this case, the butt area of the electrical connection region between the first doped semiconductor layer and the second doped semiconductor layer through the leakage path is increased, to increase the area proportion of the reverse leakage region on the first surface, thereby further improving the anti-burnout capability of the back contact solar cell.

In a possible implementation, a plurality of leakage paths that are distributed at intervals are disposed in the first dielectric portion located in the single stacked structure. In this case, compared with the continuous distribution of the leakage path, a position of the first dielectric portion corresponding to a gap between adjacent leakage paths has an insulating or semi-insulating effect, so that the first doped semiconductor layer and the second doped semiconductor layer having opposite conductivity types can be electrically isolated. Therefore, compared with the continuously distributed leakage path, when the plurality of leakage paths that are distributed at intervals are disposed in the first dielectric portion located in the single stacked structure, the butt area of the electrical connection region between the first doped semiconductor layer and the second doped semiconductor layer through the leakage path is reduced, to reduce the area proportion of the reverse leakage region on the first surface, thereby further enhancing the operating performance of the back contact solar cell.

In a possible implementation, a total size of the leakage paths is greater than or equal to 50 μm and is less than or equal to 200 μm.

When the back contact solar cell provided in the present application is installed in an environment with minimal shading obstructions, the total size of the leakage paths may be set within a small range, to reduce the proportion of the reverse leakage region between the first region and the second region, thereby further reducing the leakage loss of the back contact solar cell in the forward voltage region, and ensuring that the back contact solar cell has high operating efficiency. During installation in an environment with significant shading obstructions, the total size of the leakage paths may be set within a large range, to increase the proportion of the reverse leakage region between the first region and the second region, thereby reducing the reverse breakdown voltage of the back contact solar cell, and ensuring that the back contact solar cell has low hot-spot risk. However, the excessively large total size of the leakage paths is prone to localized overheating and affects hot spot prevention, and this problem is particularly pronounced especially in the case of a single leakage path. Therefore, the control of the total size of the leakage paths within the foregoing range is conducive to improving the hot-spot resistance of the back contact solar cell. As can be learned, the total size of the leakage paths may be set according to different environmental requirements, thereby improving the applicability of the back contact solar cell provided in the present application to different actual application scenarios.

In a possible implementation, in a case that the plurality of leakage paths that are distributed at intervals are disposed in the first dielectric portion located in the single stacked structure, a size of at least one leakage path is greater than or equal to 5 μm and less than or equal to 80 μm, thereby improving the applicability of the back contact solar cell provided in the present application to different actual application scenarios. For the application principle of the beneficial effects in this case, refer to the application principle of the beneficial effects of that the total size of the leakage paths is greater than or equal to 50 μm and less than or equal to 200 μm above. Details are not described herein again. Moreover, the size of the single leakage path is reduced, so that hot-spot overheating can be avoided, thereby enhancing the risk resilience of the back contact solar cell. Multi-point configuration can ensure timely and effective dispersion of leakage current, thereby ensuring that the back contact solar cell has low hot-spot risk.

In a possible implementation, in a case that the plurality of leakage paths are disposed in the first dielectric portion, a spacing between two adjacent leakage paths is greater than or equal to 1 μm and less than or equal to 200 μm.

In a case that the size of the leakage path is fixed, a spacing between geometric centers of two adjacent leakage paths is inversely proportional to a distribution density of the leakage paths in the first dielectric portion, and the spacing between two adjacent leakage paths is also inversely proportional to the distribution density of the leakage paths in the first dielectric portion. The distribution density of the leakage paths in the first dielectric portion is approximately directly proportional to the leakage loss of the back contact solar cell in the forward voltage region, and is inversely proportional to the reverse breakdown voltage of the back contact solar cell. Based on this, when the back contact solar cell provided in the present application is disposed in an installation environment with minimal shading obstructions such as bird droppings, leaves, or dust, the spacing between the geometric centers of two adjacent leakage paths or the spacing between two adjacent leakage paths may be set within a large range, to reduce the proportion of the reverse leakage region between the first region and the second region, thereby further reducing the leakage loss of the back contact solar cell in the forward voltage region, and ensuring that the back contact solar cell has high operating efficiency. When the back contact solar cell provided in the present application is disposed in an installation environment with significant shading obstructions such as bird droppings, leaves, or dust, the spacing between the geometric centers of two adjacent leakage paths or the spacing between two adjacent leakage paths may be set within a small range, to increase the proportion of the reverse leakage region between the first region and the second region, thereby reducing the reverse breakdown voltage of the back contact solar cell, and ensuring that the back contact solar cell has low hot-spot risk. Moreover, a spacing between two adjacent hot spots may also be controlled by controlling the spacing between the geometric centers of two adjacent leakage paths or the spacing between two adjacent leakage paths, and hot spots are scattered by adjusting the spacing, to avoid overlapping of hot spots and avoid localized overheating. As can be learned, the spacing between the geometric centers of two adjacent leakage paths or the spacing between two adjacent leakage paths may be set according to different environmental requirements, thereby improving the applicability of the back contact solar cell provided in the present application to different actual application scenarios.

In a possible implementation, in a case that the plurality of leakage paths are disposed in the first dielectric portion, spacings between every two adjacent leakage paths are equal.

When the spacings between every two adjacent leakage paths are equal, spacings between adjacent leakage points between the first doped semiconductor layer and the second doped semiconductor layer in the stacked structure are equal, so that reverse leakage regions are evenly distributed on the third region, hot regions are scattered, and a burn-out problem caused by localized heat concentration of the back contact solar cell is prevented, thereby further improving the anti-burnout capability of the back contact solar cell, and effectively improving the safety performance of the back contact solar cell.

In a possible implementation, a minimum spacing between the leakage path and an edge of the first dielectric portion is greater than or equal to 5 μm and less than or equal to 50 μm.

A range of the minimum spacing is specified, so that damage caused to a portion of the first doped semiconductor layer disposed on the first region that is close to the third region and/or a portion of the second doped semiconductor layer disposed on the second region that is close to the third region by an excessively small distance between the leakage path and the edge of the first dielectric portion in a process of manufacturing the leakage path can be avoided, to avoid affecting carrier collection, thereby avoiding affecting the efficiency of the solar cell. A low distribution density of the leakage paths in the first dielectric portion caused by a large minimum spacing can be further prevented, so that the reverse leakage region has a specific proportion on the third region, thereby ensuring that the back contact solar cell has low hot-spot risk.

In a possible implementation, on the third region and in the direction from the first region to the second region, the width of the first dielectric portion is greater than or equal to 10 μm and less than or equal to 200 μm.

In a case that the distribution density of the leakage paths in the first dielectric portion has a fixed value, the width of the first dielectric portion is directly proportional to the proportion of the reverse leakage region on the first surface. Based on this, the width of the first dielectric portion may be set according to different environmental requirements, so that the back contact solar cell has lower hot-spot risk in an installation environment with significant shading obstructions such as dust, or the back contact solar cell has low leakage loss in an installation environment with minimal shading obstructions such as dust, thereby improving the applicability of the back contact solar cell provided in the present application to different actual application scenarios. Moreover, the width of the first dielectric portion is within the foregoing range, so that high difficulty of performing selective etching on a dielectric material caused by a small width of the first dielectric portion can be further prevented, thereby reducing the manufacturing difficulty of the back contact solar cell.

In a possible implementation, the back contact solar cell further includes a first electrode and a second electrode, and the first electrode is electrically connected to the first doped semiconductor layer. The second electrode is electrically connected to the second doped semiconductor layer. A minimum spacing between at least one of the first electrode and the second electrode and the leakage path disposed in the first dielectric portion is greater than or equal to 30 μm and less than or equal to 300 μm.

A specific distance needs to be kept between at least one of the first electrode and the second electrode and the leakage path adjacent thereto to avoid a short circuit caused by contact between the first electrode and the second electrode and a leakage region, thereby avoiding affecting the operating efficiency of the back contact solar cell.

In a possible implementation, the first dielectric portion is penetrated at the at least one leakage path. In this case, the impact of isolation by the dielectric layer no longer exists between the portions of the first doped semiconductor layer and the second doped semiconductor layer that correspond to the leakage path, thereby reducing the conduction resistance of a portion of the leakage path corresponding to the two. In addition, in a case that the first doped semiconductor layer and the second doped semiconductor layer included in the stacked structure are formed, the impedance level against diffusion of dopants in one of the first doped semiconductor layer and the second doped semiconductor layer included in the stacked structure that is far away from the semiconductor substrate by the portion of the dielectric layer that corresponds to the leakage path to the opposite side of the dielectric layer through the leakage path can be further reduced, thereby increasing the butt area of the direct electrical connection region or the indirect electrical connection region between the first doped semiconductor layer and the second doped semiconductor layer, reducing the reverse breakdown voltage of the back contact solar cell, and further improving the anti-burnout capability of the back contact solar cell in an installation environment with significant shading obstructions such as dust.

In a possible implementation, a thickness of a portion of the first dielectric portion that corresponds to the at least one leakage path is H1, a thickness of a portion of the first dielectric portion that does not correspond to the leakage path is H2, and a ratio of H1 to H2 is greater than 0 and is less than or equal to 0.5.

In an actual application process, the impedance level against diffusion of dopants in the one that is far away from the semiconductor substrate by the portion of the dielectric layer that corresponds to the leakage path to the opposite side of the dielectric layer through the leakage path can alternatively be reduced in a manner of removing a partial thickness at a position of the first dielectric portion that corresponds to the leakage path, so that while hot-spot risk in back contact solar cells is reduced, a diffusion range of the dopants can be controlled through a partial thickness of the first dielectric portion that remains at the leakage path, thereby achieving the control of the butt area of the direct or indirect electrical connection region between the first doped semiconductor layer and the second doped semiconductor layer, eventually controlling the reverse breakdown voltage and the leakage loss of the back contact solar cell, and improving the applicability of the back contact solar cell provided in the present application to different application scenarios.

In a possible implementation, a density of a portion of the first dielectric portion that corresponds to the leakage path is less than a density of the remaining portion of the first dielectric portion. In this case, another example may be provided for the arrangement manner of the first dielectric portion at the leakage path. In this case, the portion of the first dielectric portion that corresponds to the leakage path has a small density, and correspondingly the portion of the first dielectric portion that corresponds to the leakage path has low compactness, so that the impedance level against diffusion of dopants in the one that is far away from the semiconductor substrate by the portion of the dielectric layer that corresponds to the leakage path to the opposite side of the dielectric layer through the leakage path can be reduced, thereby reducing hot-spot risk in back contact solar cells.

In a possible implementation, in a case that one of the first doped semiconductor layer and the second doped semiconductor layer included in the stacked structure that is close to the semiconductor substrate is the first doped semiconductor layer, at least a portion of the first region and the third region form a rectangular region; or, in a case that one of the first doped semiconductor layer and the second doped semiconductor layer included in the stacked structure that is close to the semiconductor substrate is the second doped semiconductor layer, at least portions of the second region and the third region form a rectangular region.

A single rectangular region includes at least two first sides extending in a first direction. The single rectangular region includes at least two second sides extending in a second direction. The first direction is parallel to an extension direction of a long side of the rectangular region, and the second direction is parallel to an extension direction of a short side of the rectangular region. In the single rectangular region, at least one first side and an adjacent second side form a vertex angle of the rectangular region.

In a possible implementation, in a case that the single rectangular region includes the at least two first sides extending in the first direction, the single rectangular region includes the at least two second sides extending in the second direction, and in the single rectangular region, at least the first side and the adjacent second side form the vertex angle of the rectangular region, the leakage path includes at least one first leakage path, and the first leakage path is disposed at the at least one first side in the first direction included in the rectangular region; and/or, the leakage path includes at least one second leakage path, and the second leakage path is disposed at the at least one second side in the second direction included in the rectangular region.

In a possible implementation, in a case that the single rectangular region includes the at least two first sides extending in the first direction, the single rectangular region includes the at least two second sides extending in the second direction, and in the single rectangular region, at least the first side and the adjacent second side form the vertex angle of the rectangular region, the leakage path includes at least one third leakage path, and the third leakage path is disposed at the at least one vertex angle of the rectangular region.

In a case that the foregoing technical solution is used, the arrangement position of the leakage path in the rectangular region has at least the foregoing three optional examples, so that the applicability of the back contact solar cell provided in the present application to different application scenarios is improved, and it is also not necessary to strictly control manufacturing precision or add an additional operation step to form the leakage path at a fixed position, thereby reducing the manufacturing difficulty of the back contact solar cell and simplifying the manufacturing procedure of the back contact solar cell.

In a possible implementation, in a case that the leakage path includes at least one first leakage path, at least one second leakage path, and at least one third leakage path, and a cross-sectional area of the third leakage path in the direction parallel to the first surface is greater than a cross-sectional area of at least one of the first leakage path and the second leakage path in the direction parallel to the first surface.

Compared with a spacing between the long side of the rectangular region and an electrode and a spacing between the short side of the rectangular region and the electrode, a spacing between the vertex angle of the rectangular region and the electrode is larger. In this case, the third leakage path with a large cross-sectional area in the direction parallel to the first surface may be disposed. In other words, the cross-sectional area of the third leakage path in the direction parallel to the first surface may be greater than the cross-sectional area of the at least one of the first leakage path and the second leakage path in the direction parallel to the first surface. In this case, the leakage path with a large cross-sectional area may be disposed on the stacked structure with a large width, so that while it is ensured that the back contact solar cell has a low reverse breakdown voltage, it is not necessary to arrange the at least one of the first leakage path and the second leakage path with a large cross-sectional area at the position of the spacing to increase the proportion of the reverse leakage region on the first surface, so that process difficulty is reduced, thereby improving the yield of the back contact solar cell.

In a possible implementation, the third region is disposed between regions of the first region and regions of the second region.

Compared with that the third region is disposed between only a portion of the first region and only a portion of the second region, an extension length of the stacked structure disposed on the third region is large, so that the arrangement range of the leakage path in the stacked structure is increased, and the butt area of the electrical connection region between the first doped semiconductor layer and the second doped semiconductor layer through the leakage path is increased, to increase the area proportion of the reverse leakage region on the first surface, thereby further improving the anti-burnout capability of the back contact solar cell.

In a possible implementation, the first surface further includes a fourth region located between the first region and the second region. The third region is disposed between only a portion of the first region and only a portion of the second region, and the fourth region and the third region do not overlap with each other. Compared with that the third region is disposed between regions of the first region and regions of the second region, an extension length of the stacked structure disposed on the third region is small, so that the arrangement range of the leakage path in the stacked structure is reduced, and the butt area of the electrical connection region between the first doped semiconductor layer and the second doped semiconductor layer through the leakage path is reduced, to reduce the area proportion of the reverse leakage region on the first surface, thereby further improving the operating performance of the back contact solar cell.

In a possible implementation, the dielectric layer further includes the second dielectric portion disposed between the first doped semiconductor layer and the second doped semiconductor layer in the direction parallel to the first surface. In this case, the presence of the second dielectric portion may separate the first doped semiconductor layer and the second doped semiconductor layer in the direction parallel to the first surface, to further reduce the leakage loss between the first doped semiconductor layer and the second doped semiconductor layer, thereby improving the operating efficiency of the back contact solar cell in an installation environment with minimal shading obstructions such as dust or bird droppings.

In a possible implementation, the back contact solar cell further includes a first interface passivation layer. The first interface passivation layer is disposed at least between the first doped semiconductor layer and the semiconductor substrate. A passivation contact structure formed by the first interface passivation layer and the first doped semiconductor layer has an excellent interface passivation effect and can achieve selective collection of carriers, so that the carrier recombination rate of the first region of the first surface is at least reduced, thereby further improving the photoelectric conversion efficiency of the back contact solar cell.

In a possible implementation, the back contact solar cell further includes a second interface passivation layer. The second interface passivation layer is disposed at least between the second doped semiconductor layer and the semiconductor substrate. A passivation contact structure formed by the portions of the second interface passivation layer and the second doped semiconductor layer that are located at the second region can achieve selective collection of carriers, thereby reducing the carrier recombination rate of the second region of the first surface.

In a possible implementation, in a case that the one of the first doped semiconductor layer and the second doped semiconductor layer included in the stacked structure that is far away from the semiconductor substrate is the first doped semiconductor layer, on the third region and in the direction from the first region to the second region, a width of the first interface passivation layer is less than a width of the first doped semiconductor layer; or, in a case that the one of the first doped semiconductor layer and the second doped semiconductor layer included in the stacked structure that is far away from the semiconductor substrate is the second doped semiconductor layer, on the third region and in the direction from the first region to the second region, a width of the second interface passivation layer is less than a width of the second doped semiconductor layer.

When the width of the one of the first doped semiconductor layer and the second doped semiconductor layer included in the stacked structure that is far away from the semiconductor substrate is less than a width of an interface passivation layer corresponding to the one, on the third region, the corresponding interface passivation layer is no longer present between the portions of the first doped semiconductor layer and the second doped semiconductor layer that correspond to the leakage path, so that the conduction resistance between the two is reduced, thereby further reducing the reverse breakdown voltage of the back contact solar cell.

According to a second aspect, the present application provides a photovoltaic module. The photovoltaic module includes a solar cell string and an encapsulation layer. The solar cell string is formed by connecting a plurality of back contact solar cells provided in the first aspect and various embodiments thereof. The encapsulation layer is used for covering a surface of the solar cell string.

For beneficial effects of the second aspect and various implementations of the second aspect in the present application, refer to the analysis of the beneficial effects of the first aspect and various implementations of the first aspect. Details are not described herein again.

According to a third aspect, the present application provides a method for manufacturing a back contact solar cell. The method for manufacturing a back contact solar cell includes the following steps. First, a semiconductor substrate is provided. The semiconductor substrate includes a first surface and a second surface. The first surface includes a first region and a second region that are spaced apart and a third region that is located between the first region and the second region. Next, a first doped semiconductor layer disposed on the first region and the third region is formed. Next, a dielectric layer disposed at least on a portion of the first doped semiconductor layer that corresponds to the third region is formed. Next, a second doped semiconductor layer disposed on the second region and the third region is formed. A conductivity type of the second doped semiconductor layer is opposite to that of the first doped semiconductor layer. On the third region, the first doped semiconductor layer and the second doped semiconductor layer overlap in a thickness direction of the semiconductor substrate to form a stacked structure. At least one leakage path is disposed in the dielectric layer.

In a possible embodiment, a portion of the dielectric layer disposed between the first doped semiconductor layer and the second doped semiconductor layer in the thickness direction of the semiconductor substrate is the first dielectric portion. In the dielectric layer, the at least one leakage path is disposed in the first dielectric portion. On the third region, in a direction from the first region to the second region, a width of the first dielectric portion is greater than or equal to a width of one of the first doped semiconductor layer and the second doped semiconductor layer included in the stacked structure that is far away from the semiconductor substrate.

In a possible embodiment, a laser etching process is used, and the leakage path is opened in the first dielectric portion.

For beneficial effects of the third aspect and various implementations of the second aspect in the present application, refer to the analysis of the beneficial effects of the first aspect and various implementations of the first aspect. Details are not described herein again.

BRIEF DESCRIPTION OF THE DRAWINGS

The accompanying drawings described herein are used to provide a further understanding of the present application, and form portion of the present application. Exemplary embodiments of the present application and descriptions thereof are used to explain the present application, and do not constitute any inappropriate limitation to the present application. In the accompanying drawings.

Figure 1:
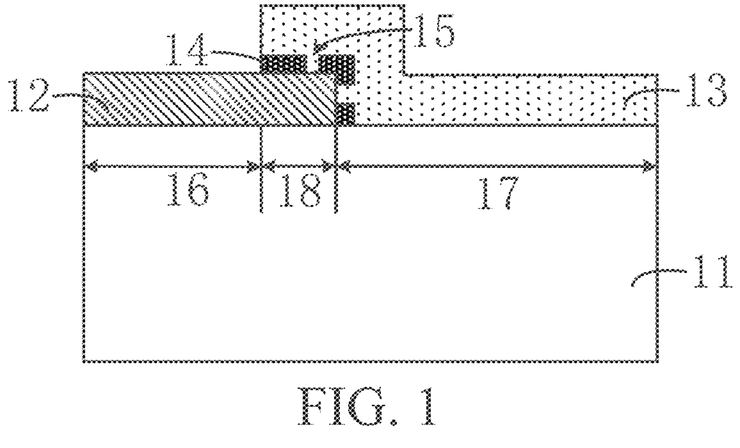
FIG. 1 is a schematic longitudinal structural diagram 1 of a back contact solar cell according to a first group of embodiments of the present application.

Reference numerals: 11. semiconductor substrate, 12. first doped semiconductor layer, 13. second doped semiconductor layer, 14. dielectric layer, 15. leakage path, 16. first region, 17. second region, 18. third region, 19. first dielectric portion, 20. second dielectric portion, 21. first interface passivation layer, 22. second interface passivation layer, 23. third doped semiconductor portion, 220. digitate region, 221. connection region, 222. first leakage path, 223. second leakage path, and 224. third leakage path.

DETAILED DESCRIPTION

The embodiments of the present application are described below in detail with reference to the accompanying drawings. However, it should be understood that, these descriptions are merely exemplary, and are not intended to limit the scope of the present application. In addition, in the following descriptions, descriptions of well-known structures and technologies are omitted, to avoid unnecessarily confusing the concepts of the present application.

The accompanying drawings show various schematic structural diagrams according to the embodiments of the present application. The accompanying drawings are not drawn to scale, some details are enlarged for clearer description, and some details may be omitted. Shapes of various regions and layers shown in the drawings and relative dimensions and positional relationships between the various regions and layers are merely exemplary, and may deviate in practice due to manufacturing tolerances or technical limitations, and a person skilled in the art may additionally design regions/layers with different shapes, dimensions, and relative positions according to actual requirements.

In the context of the present application, when one layer/element is referred to as being located "on" another layer/element, the layer/element may be directly located on the another layer/element, or an intermediate layer/element may exist between the layer/element and the another layer/element. In addition, if one layer/element is located "above" another layer/element in an orientation, when the orientation is inverted, the layer/element may be located "below" the another layer/element. To make the technical problems to be resolved in the present application, the technical solutions, and beneficial effects more comprehensible, the following further describes the present application in detail with reference to the accompanying drawings and embodiments. It should be understood that the specific embodiments described herein are merely used to explain the present application but are not intended to limit the present application.

In addition, terms "first" and "second" are used merely for the purpose of description, and shall not be construed as indicating or implying relative importance or implying a quantity of indicated technical features. Therefore, a feature limited by "first" or "second" may explicitly or implicitly include one or more of the features. In the descriptions of the present application, "a plurality of" means two or more, unless otherwise definitely and specifically limited.

In the descriptions of the present application, it should be noted that, unless otherwise explicitly specified or limited, the terms such as "install", "connect", and "connection" should be understood in a broad sense. For example, the connection may be a fixed connection, a detachable connection, or an integral connection; or the connection may be a mechanical connection or an electrical connection; or the connection may be a direct connection, an indirect connection through an intermediate medium, internal communication between two components, or an interaction relationship between two components. A person of ordinary skill in the art may understand the specific meanings of the foregoing terms in the present application according to specific situations.

A back contact solar cell is a solar cell in which no electrode is provided on a light-receiving surface of the solar cell and both positive and negative electrodes are disposed on a back surface of the solar cell, so that the shading of the electrodes on the solar cell can be reduced, the short-circuit current of the solar cell can be increased, and the energy conversion efficiency of solar cell can be improved.

From the perspective of a back contact solar cell, two doped semiconductor layers with opposite doping types included in the back contact solar cell need to be spaced apart to suppress forward leakage, so that the back contact solar cell has high photoelectric conversion efficiency in a forward voltage region. From the perspective of a photovoltaic module, when two doped semiconductor layers with opposite doping types included in a back contact solar cell in the photovoltaic module are spaced apart, a gap between the two has large resistance and corresponds to a large reverse breakdown voltage, resulting in high hot-spot risk in the back contact solar cell. In the foregoing case, in existing solar cells, two doped semiconductor layers with opposite doping types are partially electrically connected to reduce hot-spot risk in the solar cells to some extent.

In a back contact solar cell having low hot-spot risk, all portions of two doped semiconductor layers with opposite doping types that overlap each other in a thickness direction of a semiconductor substrate are in electrical contact. As a result, the back contact solar cell has large leakage current in a forward voltage region, leading to low operating efficiency of the back contact solar cell and suboptimal operating performance of the back contact solar cell.

Figure 17:
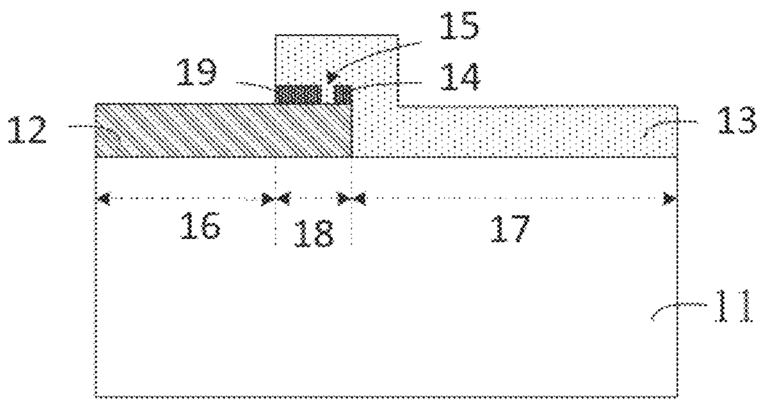
FIG. 17 is a schematic longitudinal cross-sectional view of a first structure of a back contact solar cell according to a second group of embodiments of the present application.
Figure 18:
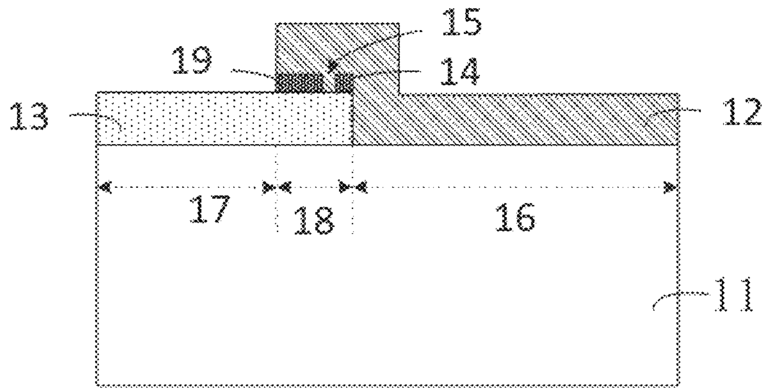
FIG. 18 is a schematic longitudinal cross-sectional view of a second structure of the back contact solar cell according to the second group of embodiments of the present application.
Figure 19:
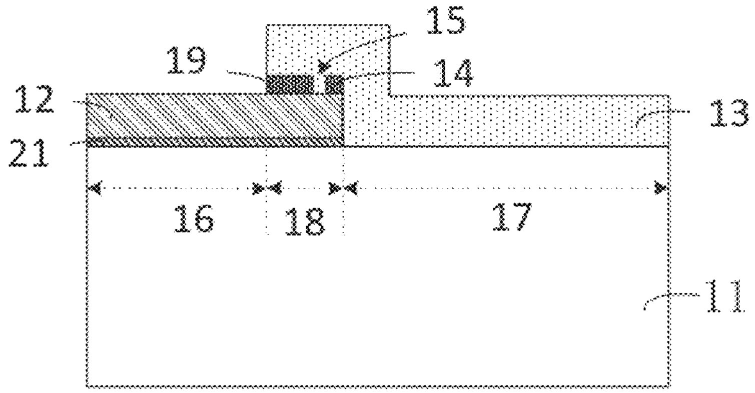
FIG. 19 is a schematic longitudinal cross-sectional view of a third structure of the back contact solar cell according to the second group of embodiments of the present application.

To resolve the foregoing technical problems, according to a first aspect, an embodiment of the present application provides a back contact solar cell. As shown in FIG. 1 and FIG. 17, the back contact solar cell provided in the embodiments of the present application includes a semiconductor substrate 11, a first doped semiconductor layer 12, a second doped semiconductor layer 13, and a dielectric layer 14. The semiconductor substrate 11 includes a first surface and a second surface that are opposite to each other. The first surface includes a first region 16 and a second region 17 that are spaced apart and a third region 18 that is located between the first region 16 and the second region 17. The first doped semiconductor layer 12 is disposed on the first region 16 and the third region 18. The second doped semiconductor layer 13 is disposed on the second region 17 and the third region 18. A doping type of the first doped semiconductor layer 12 is opposite to that of the second doped semiconductor layer 13. On the third region 18, the first doped semiconductor layer 12 and the second doped semiconductor layer 13 overlap in a thickness direction of the semiconductor substrate 11 to form a stacked structure. The dielectric layer 14 is disposed at least between the first doped semiconductor layer 12 and the second doped semiconductor layer 13. At least one leakage path 15 is disposed in the dielectric layer 14.

As shown in FIG. 1, in the back contact solar cell provided in the embodiments of the present application, on the third region 18, the first doped semiconductor layer 12 and the second doped semiconductor layer 13 with opposite doping types (also opposite doping types) can overlap in the thickness direction of the semiconductor substrate 11 to form the stacked structure. Next, the back contact solar cell further includes at least the dielectric layer 14 disposed between the first doped semiconductor layer 12 and the second doped semiconductor layer 13. The at least one leakage path 15 is disposed in the dielectric layer 14. In this case, a partial region of the first doped semiconductor layer 12 and a partial region of the second doped semiconductor layer 13 in the stacked structure can achieve an electrical connection by the leakage path 15. Because the doping type of the first doped semiconductor layer 12 is opposite to that of the second doped semiconductor layer 13, a butt junction with a low reverse breakdown voltage can be formed between the first doped semiconductor layer 12 and the second doped semiconductor layer 13 in a manner of manufacturing localized leakage points, so that the back contact solar cell has high anti-burnout capability when being shaded, thereby reducing hot-spot risk in back contact solar cells.

A first group of back contact solar cells in the first aspect of the present application are described below with reference to FIG. 1 to FIG. 16.

In this group of embodiments, as shown in FIG. 1, in some embodiments, in the back contact solar cell provided in the embodiments of the present application, the thickness of the dielectric layer 14 is greater than or equal to 13 nm.

The dielectric layer 14 can achieve the physical separation between the first doped semiconductor layer 12 and the second doped semiconductor layer 13 included in the stacked structure, and a thickness of the dielectric layer 14 is greater than or equal to 13 nm, so that the dielectric layer 14 exhibits the specific electrically insulating or semi-insulating performance. Therefore, the portion of the dielectric layer 14 in which the leakage path 15 is not disposed can achieve electrical isolation between the partial region of the first doped semiconductor layer 12 and the partial region of the second doped semiconductor layer 13 in the stacked structure, so that direct transport and recombination of carriers collected by the first doped semiconductor layer 12 and the second doped semiconductor layer 13 in the stacked structure can be effectively reduced, thereby effectively controlling leakage loss of the back contact solar cell, and providing the back contact solar cell with good operating performance. As can be learned, in the back contact solar cell provided in the embodiments of the present application, leakage loss of the back contact solar cell in a forward voltage region can be effectively controlled through the insulating or semi-insulating characteristic of the portion of the dielectric layer 14 in which the leakage path 15 is not disposed, and through the leakage path 15 disposed in the dielectric layer 14, controllability over leakage and electrical isolation is achieved while reducing hot-spot risk in the back contact solar cell, thereby facilitating the adjustment of a reverse breakdown voltage and operating efficiency corresponding to the back contact solar cell to achieve a balance.

In an actual application process, the structure and material of the semiconductor substrate are not specifically limited in the embodiments of the present application, provided that the structure and material can be used in the back contact solar cell provided in the embodiments of the present application.

The semiconductor substrate may be a semiconductor base layer on which no structure is formed. Alternatively, the semiconductor substrate may be a semiconductor base layer on which some structures are formed. In this case, the structures formed on the semiconductor base layer may be disposed according to actual requirements, and are not specifically limited herein. For example, the semiconductor substrate may include a semiconductor substrate layer and a passivation anti-reflection layer that is disposed on a side of the semiconductor base layer away from the first doped semiconductor layer and the second doped semiconductor layer, to passivate the side of the semiconductor base layer away from the first doped semiconductor layer and the second doped semiconductor layer, thereby reducing the carrier recombination rate on the side, facilitating reflection of more light into the semiconductor base layer via the side, and further improving the operating efficiency of the back contact solar cell. A material of the semiconductor base layer may include any semiconductor material such as silicon, silicon germanium, germanium, or gallium arsenide. A material of the passivation anti-reflection layer may include silicon oxide, silicon nitride, aluminum oxide, or the like.

Moreover, the first surface of the semiconductor substrate corresponds to a back surface of the back contact solar cell, and the second surface of the semiconductor substrate corresponds to a light-receiving surface of the back contact solar cell. The distribution of the first region, the second region, and the third region on the first surface of the semiconductor substrate may be determined according to the distribution of the first doped semiconductor layer and the second doped semiconductor layer on the first surface. Because the first doped semiconductor layer included in the back contact solar cell is disposed on the first region and on the third region, a distribution range of the first region and the third region on the first surface may be determined according to a distribution requirement of the first doped semiconductor layer in an actual application scenario. Because a partial region of the second doped semiconductor layer included in the back contact solar cell is disposed on the second region of the first surface, a distribution range of the second region on the first surface may be determined according to a distribution requirement of the second doped semiconductor layer on the semiconductor substrate in an actual application scenario.

It may be understood that the first region corresponds to a first emitter region, and the second region corresponds to a second emitter region. One of the first region and the second region corresponds to a P region, the other one of the first region and the second region corresponds to an N region, and the third region corresponds to a PN stacked structure.

The topography of the first region and the second region in the first surface may be determined according to the topography of the electrode structure of the back contact solar cell and an actual application scenario. For example, the first region and the second region may be alternately spaced apart in a striped pattern, or may be alternately spaced apart in an interdigitated pattern.

Figure 2:
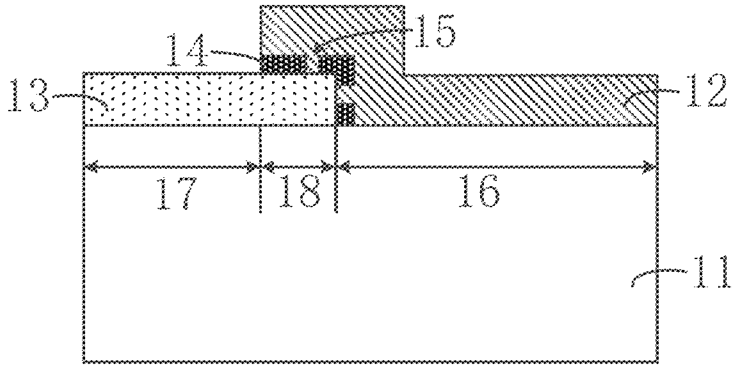
FIG. 2 is a schematic longitudinal structural diagram 2 of the back contact solar cell according to the first group of embodiments of the present application.

Moreover, as described above, the first doped semiconductor layer and the second doped semiconductor layer are disposed on the first surface of the semiconductor substrate. As shown in FIG. 1, in a case that one of the first doped semiconductor layer 12 and the second doped semiconductor layer 13 included in the stacked structure that is close to the semiconductor substrate 11 is the first doped semiconductor layer 12, a surface of the second region 17 may be flush with a surface of the third region 18. As shown in FIG. 2, in a case that one of the first doped semiconductor layer 12 and the second doped semiconductor layer 13 included in the stacked structure that is close to the semiconductor substrate 11 is the second doped semiconductor layer 13, a surface of the second region 16 may be flush with the surface of the third region 18.

Figure 3:
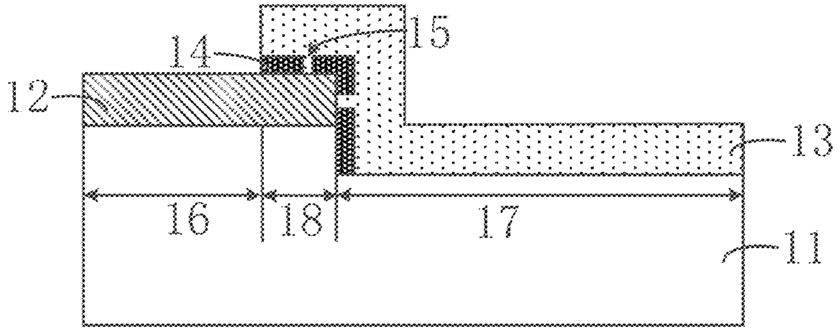
FIG. 3 is a schematic longitudinal structural diagram 3 of the back contact solar cell according to the first group of embodiments of the present application.
Figure 4:
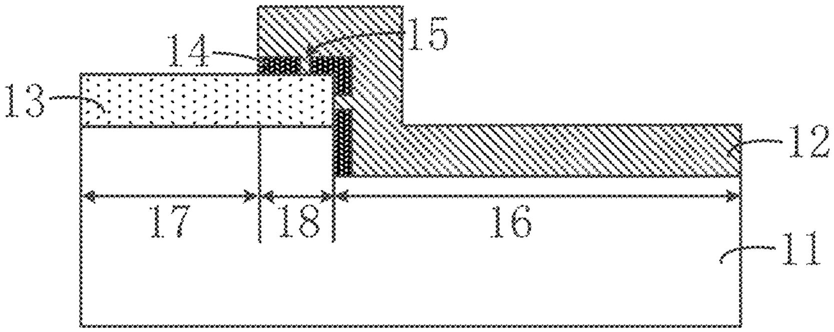
FIG. 4 is a schematic longitudinal structural diagram 4 of the back contact solar cell according to the first group of embodiments of the present application.

Alternatively, as shown in FIG. 3, in a case that one of the first doped semiconductor layer 12 and the second doped semiconductor layer 13 included in the stacked structure that is close to the semiconductor substrate 11 is the first doped semiconductor layer 12, the surface of the third region 18 may be higher than the surface of the second region 17 in a direction from the second surface to the first surface. As shown in FIG. 4, in a case that one of the first doped semiconductor layer 12 and the second doped semiconductor layer 13 included in the stacked structure that is close to the semiconductor substrate 11 is the second doped semiconductor layer 13, the surface of the third region 18 may be higher than the surface of the first region 16 in the direction from the second surface to the first surface. With such an arrangement, it is ensured that after a portion of one of the first doped semiconductor layer 12 and the second doped semiconductor layer 13 that is formed first that is formed on a region in which the other one of the first doped semiconductor layer 12 and the second doped semiconductor layer 13 is in contact with the semiconductor substrate 11 is removed through selective etching, the portion does not remain on the region, thereby avoiding a short circuit.

For the first doped semiconductor layer and the second doped semiconductor layer, in terms of the doping type, the doping type of the first doped semiconductor layer may be an N type, and in this case, the doping type of the second doped semiconductor layer is a P type. Alternatively, the doping type of the first doped semiconductor layer may be a P type, and in this case, the doping type of the second doped semiconductor layer is an N type. The doping types of the first doped semiconductor layer and the second doped semiconductor layer are not specifically limited in the embodiments of the present application, provided that the doping types of the two are opposite.

In terms of materials, a material of at least one of the first doped semiconductor layer and the second doped semiconductor layer may include any semiconductor material such as silicon, silicon germanium, or germanium. In terms of arrangement of substances, a phase of at least one of the first doped semiconductor layer and the second doped semiconductor layer may be an amorphous phase, a microcrystalline phase, a nanocrystalline phase, a monocrystalline phase, a polycrystalline phase, or the like.

In terms of stacking manners, as shown in FIG. 1 and FIG. 3, in the stacked structure, the first doped semiconductor layer 12 may be disposed between the second doped semiconductor layer 13 and the semiconductor substrate 11. In this case, in the stacked structure, the first doped semiconductor layer 12 is closer to the semiconductor substrate 11 than the second doped semiconductor layer 13. Alternatively, as shown in FIG. 2 and FIG. 4, in the stacked structure, the second doped semiconductor layer 13 may be disposed between the first doped semiconductor layer 12 and the semiconductor substrate 11. In this case, in the stacked structure, the second doped semiconductor layer 13 is closer to the semiconductor substrate 11 than the first doped semiconductor layer 12.

Figure 5:
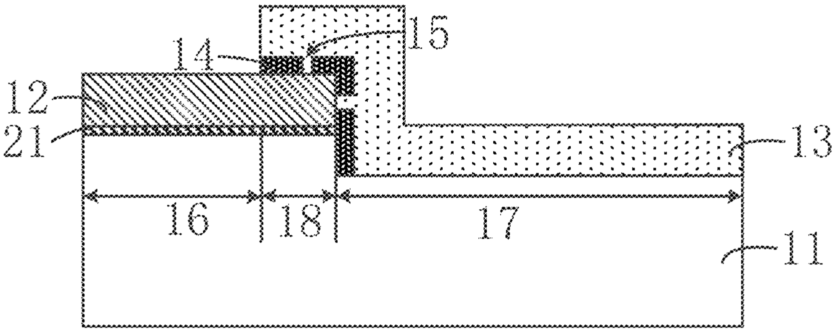
FIG. 5 is a schematic longitudinal structural diagram 5 of the back contact solar cell according to the first group of embodiments of the present application.
Figure 6:
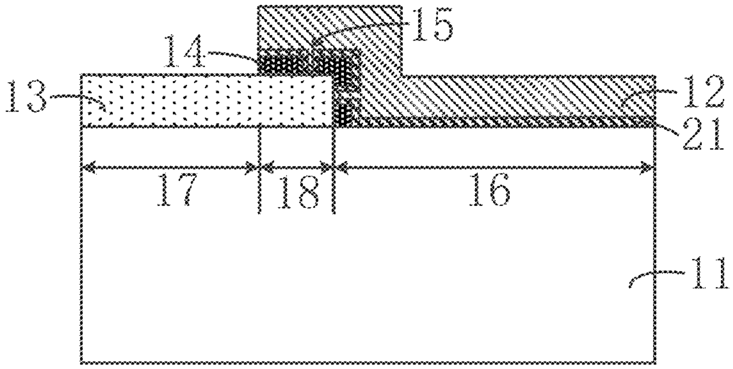
FIG. 6 is a schematic longitudinal structural diagram 6 of the back contact solar cell according to the first group of embodiments of the present application.

In terms of arrangement positions, as shown in FIG. 1 to FIG. 4, at least a partial region of the first doped semiconductor layer 12 may be directly formed on the semiconductor substrate 11. Alternatively, as shown in FIG. 5 and FIG. 6, the back contact solar cell includes the first interface passivation layer 21. When one of the first doped semiconductor layer 12 and the second doped semiconductor layer 13 included in the stacked structure that is close to the semiconductor substrate 11 is the first doped semiconductor layer 12, the first interface passivation layer 21 is disposed between the first doped semiconductor layer 12 and the semiconductor substrate 11. When one of the first doped semiconductor layer 12 and the second doped semiconductor layer 13 included in the stacked structure that is close to the semiconductor substrate 11 is the second doped semiconductor layer 13, the first interface passivation layer 21 is disposed between the first doped semiconductor layer 12 and the semiconductor substrate 11, and extends between the first doped semiconductor layer 12 and the second doped semiconductor layer 13. A material and a thickness of the first interface passivation layer 21 may be set according to the material of the first doped semiconductor layer 12 and an actual requirement, and are not specifically limited herein. For example, when the first doped semiconductor layer is a doped polycrystalline silicon layer, the first interface passivation layer is a tunnel passivation layer. For another example, when the first doped semiconductor layer is a doped amorphous silicon layer, the first interface passivation layer is an intrinsic amorphous silicon layer.

Figure 7:
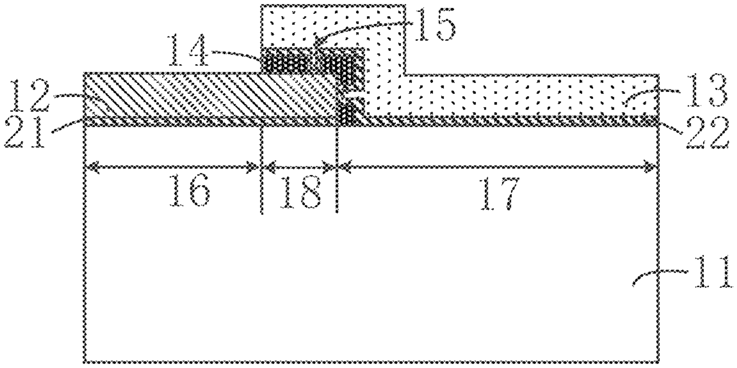
FIG. 7 is a schematic longitudinal structural diagram 7 of the back contact solar cell according to the first group of embodiments of the present application.
Figure 8:
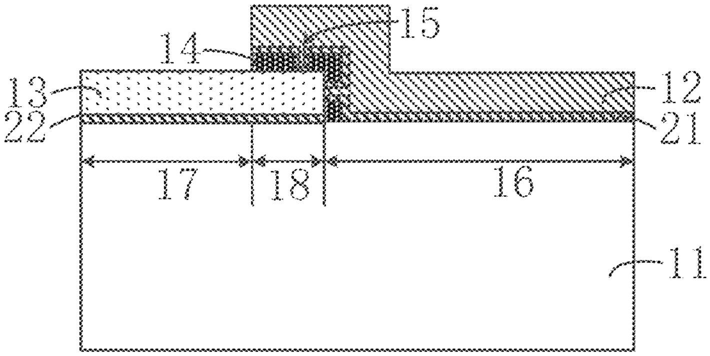
FIG. 8 is a schematic longitudinal structural diagram 8 of the back contact solar cell according to the first group of embodiments of the present application.

As for the second doped semiconductor layer, as shown in FIG. 1 to FIG. 6, at least a partial region of the second doped semiconductor layer 13 may be directly formed on the semiconductor substrate 11. Alternatively, as shown in FIG. 7 and FIG. 8, the back contact solar cell includes the second interface passivation layer 22. When one of the first doped semiconductor layer 12 and the second doped semiconductor layer 13 included in the stacked structure that is close to the semiconductor substrate 11 is the first doped semiconductor layer 12, the second interface passivation layer 22 is disposed between the second doped semiconductor layer 13 and the semiconductor substrate 11 and extends between the second doped semiconductor layer 13 and the first doped semiconductor layer 12. When one of the first doped semiconductor layer 12 and the second doped semiconductor layer 13 included in the stacked structure that is close to the semiconductor substrate 11 is the second doped semiconductor layer 13, the second interface passivation layer 22 is disposed between the second doped semiconductor layer 13 and the semiconductor substrate 11. A material and a thickness of the second interface passivation layer 22 may be set according to the material of the second doped semiconductor layer 13 and an actual requirement, and are not specifically limited herein. For example, when the second doped semiconductor layer is a doped polycrystalline silicon layer, the second interface passivation layer is a tunnel passivation layer. For another example, when the second doped semiconductor layer is a doped amorphous silicon layer, the second interface passivation layer is an intrinsic amorphous silicon layer.

Figure 9:
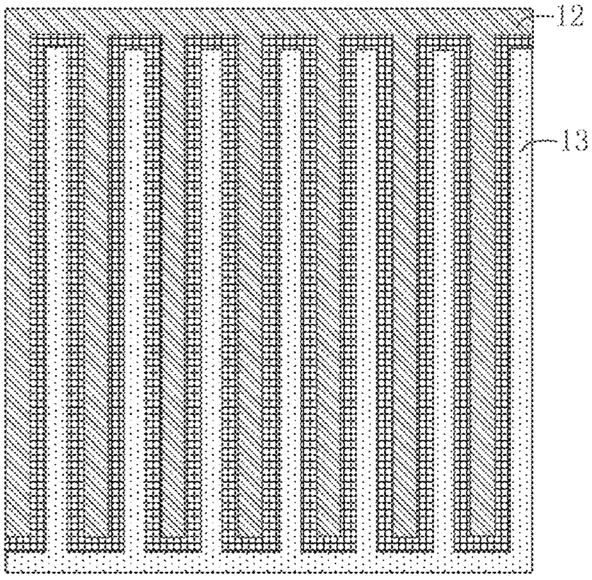
FIG. 9 is a schematic top view 1 from a side of a first doped semiconductor layer and a second doped semiconductor layer of a back contact solar cell according to an embodiment of the present application.
Figure 10:
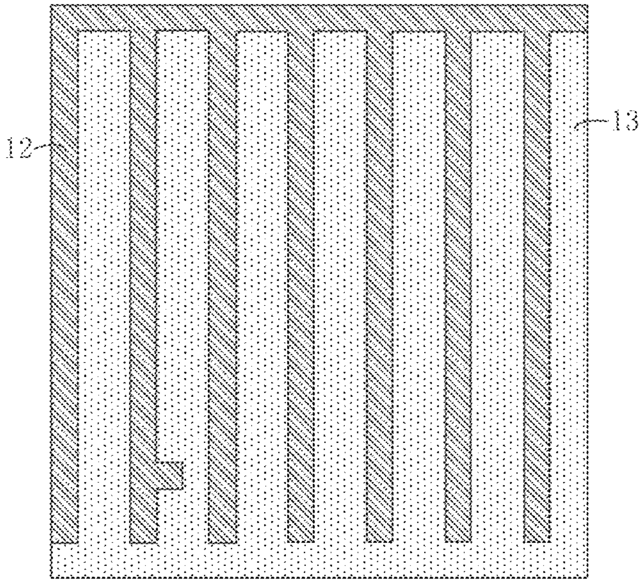
FIG. 10 is a schematic top view 2 from a side of a first doped semiconductor layer and a second doped semiconductor layer of a back contact solar cell according to an embodiment of the present application.
Figure 11:
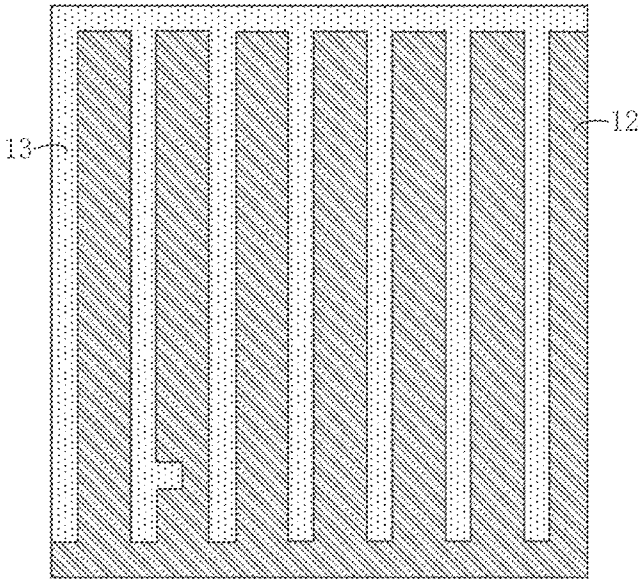
FIG. 11 is a schematic top view 3 from a side of a first doped semiconductor layer and a second doped semiconductor layer of the back contact solar cell according to the first group of embodiments of the present application.
Figure 12:
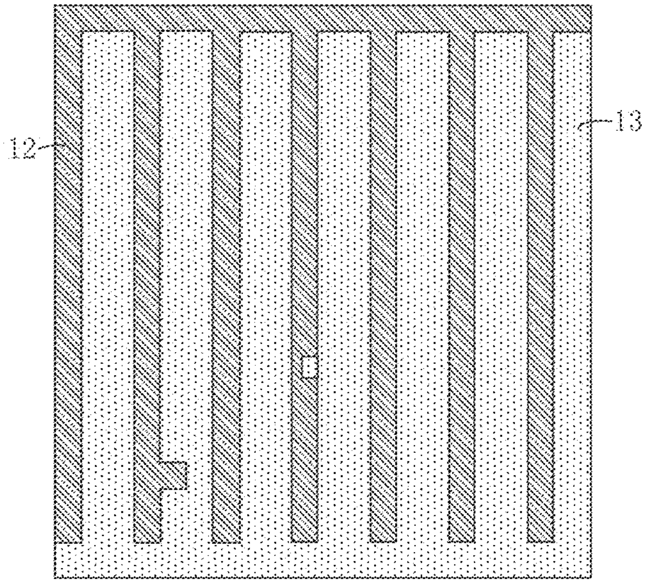
FIG. 12 is a schematic top view 4 from a side of a first doped semiconductor layer and a second doped semiconductor layer of the back contact solar cell according to the first group of embodiments of the present application.

In terms of an arrangement range, as shown in FIG. 9, the third region (as shown by the position of a grid-patterned region in the figure) formed with the stacked structure may be disposed between the entire first region and the entire second region. In this case, in an extension direction of the third region, that is, in an extension direction of the stacked structure, edge regions of the first doped semiconductor layer 12 and the second doped semiconductor layer 13 that are close to each other overlap in the thickness direction of the semiconductor substrate 11 (as shown by the region shown by the grid pattern in the figure). The extension direction of the stacked structure may be determined according to specific shapes of the first region 16 and the second region 17. For example, in a case that the first region 16 and the second region 17 are spaced apart in a striped pattern, the extension direction of the stacked structure is parallel to an extension direction of the first region 16 or the second region 17. For another example, in a case that the first region 16 and the second region 17 are spaced apart in an interdigitated pattern, when the stacked structure is disposed between two digitate regions, the extension direction of the stacked structure is parallel to an extension direction of the digitate regions. When the stacked structure is disposed between a digitate region and a connection region, the extension direction of the stacked structure is parallel to an extension direction of the connection region. Alternatively, as shown in FIG. 10 to FIG. 12, the third region formed with the stacked structure may be only disposed between a portion of the first region and a portion of the second region between. In this case, only portions of the edge regions of the first doped semiconductor layer 12 and the second doped semiconductor layer 13 that are close to each other overlap in the thickness direction of the semiconductor substrate 11. In addition, in this case, the first surface further includes a fourth region. The fourth region is disposed between the first region and the second region, and the fourth region and the third region do not overlap with each other. In this case, only portions of the edge regions of the first doped semiconductor layer 12 and the second doped semiconductor layer 13 that are close to each other overlap in the thickness direction of the semiconductor substrate 11. As shown in FIG. 10 to FIG. 13, on the fourth region, only the first doped semiconductor layer 12 may be disposed, or only the second doped semiconductor layer 13 may be disposed, or only an insulating groove or another physical gap or a chemical film layer made of an intrinsic semiconductor material or insulating material or another nonconductive structure may be disposed, or one of the first doped semiconductor layer 12 and the second doped semiconductor layer 13 and the foregoing nonconductive structure may be disposed. The determination principle of the extension direction of the stacked structure in this case is the same as that of the extension direction of the stacked structure when the third region formed with the stacked structure 18 is disposed between regions of the first region 16 and regions of the second region 17 above. Details are not described herein again.

Moreover, in an actual application process, connection manners of the first doped semiconductor layer and the second doped semiconductor layer may at least include the following two.

Figure 16:
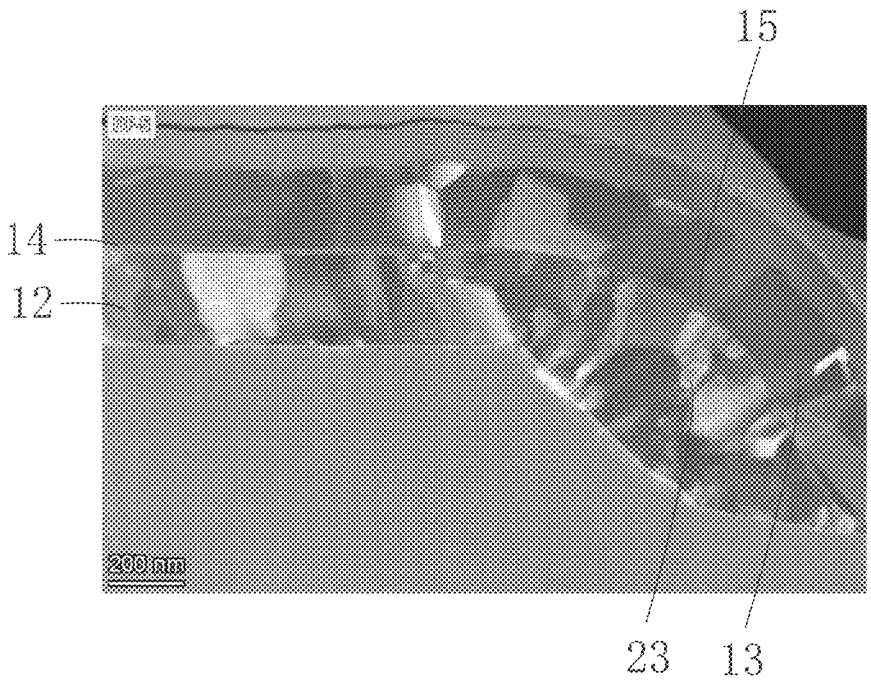
FIG. 16 is a structural SEM micrograph 3 of the back contact solar cell at a stacked structure according to the first group of embodiments of the present application.

In a first case, the first doped semiconductor layer and the second doped semiconductor layer are connected by the dielectric layer in which the leakage path is disposed. As shown in FIG. 1 to FIG. 5, the connection may be a direct connection between the first doped semiconductor layer 12 and the second doped semiconductor layer 13; or may be, as shown in FIG. 6, FIG. 7, and FIG. 16, an indirection connection by the portion of the dielectric layer that corresponds to the leakage path (the portion has an electrical conduction characteristic) in a case that the leakage path does not penetrate the dielectric layer, to form a reverse leakage region, thereby reducing the reverse breakdown voltage of the back contact solar cell, and improving the anti-burnout capability of the back contact solar cell. Moreover, in this case, a butt area of a connection region disposed at the leakage path 15 is approximately only equal to a channel cross-sectional area of the leakage path 15. In this case, the butt area relatively small, thereby further reducing direct transport and recombination of carriers collected by the first doped semiconductor layer 12 and the second doped semiconductor layer 13 in the stacked structure, and further effectively controlling the leakage loss of the back contact solar cell, so that the back contact solar cell has high operating efficiency.

In the first case, as shown in FIG. 1 to FIG. 7, a butt surface of a connection region between the first doped semiconductor layer 12 and the second doped semiconductor layer 13 may include regular topography such as a flat surface or a curved surface. Alternatively, the butt surface of the connection region between the first doped semiconductor layer and the second doped semiconductor layer may have irregular topography. It may be understood that compared with that the butt surface at the connection region has smooth and regular topography, when the butt surface at the connection region has irregular topography, concave-convex fluctuation features of the butt surface are conducive to increasing a contact area between the first doped semiconductor layer and the second doped semiconductor layer at the connection region, that is, conducive to increasing a junction region area of the butt junction, thereby further reducing the reverse breakdown voltage of the back contact solar cell and reducing hot-spot risk in back contact solar cells.

Moreover, in the first case, the butt surface of the connection region between the first doped semiconductor layer and the second doped semiconductor layer may be only disposed between the first doped semiconductor layer and the second doped semiconductor layer in a direction perpendicular to the first surface. Alternatively, an included angle less than 90° may be formed between the butt surface of the connection region between the first doped semiconductor layer and the second doped semiconductor layer and the first surface included in the semiconductor substrate. For example, an included angle of 0°, 10°, 20°, 30°, 40°, 50°, 60°, 70°, 80°, or the like is formed between the butt surface and the first surface. In a case that a thickness of one of the first doped semiconductor layer and the second doped semiconductor layer included in the stacked structure that is close to the semiconductor substrate is fixed, compared with that the butt surface of the connection region between the first doped semiconductor layer and the second doped semiconductor layer is perpendicular to the first surface, when the included angle less than 90° is formed between the butt surface of the connection region and the first surface, the butt surface is obliquely disposed with respect to the first surface, so that the connection region between the first doped semiconductor layer and the second doped semiconductor layer has a large contact area, and the junction region area of the butt junction can be further increased, thereby further reducing the reverse breakdown voltage of the back contact solar cell and reducing hot-spot risk in back contact solar cells. Moreover, when the butt surface of the connection region is obliquely disposed with respect to the first surface, one of the first doped semiconductor layer and the second doped semiconductor layer included in the stacked structure that is far away from the semiconductor substrate further better covers the one close to the semiconductor substrate, to avoid voids or other defects in the one that is far away from the semiconductor substrate at the connection region, thereby improving the yield of the back contact solar cell.

Figure 14:
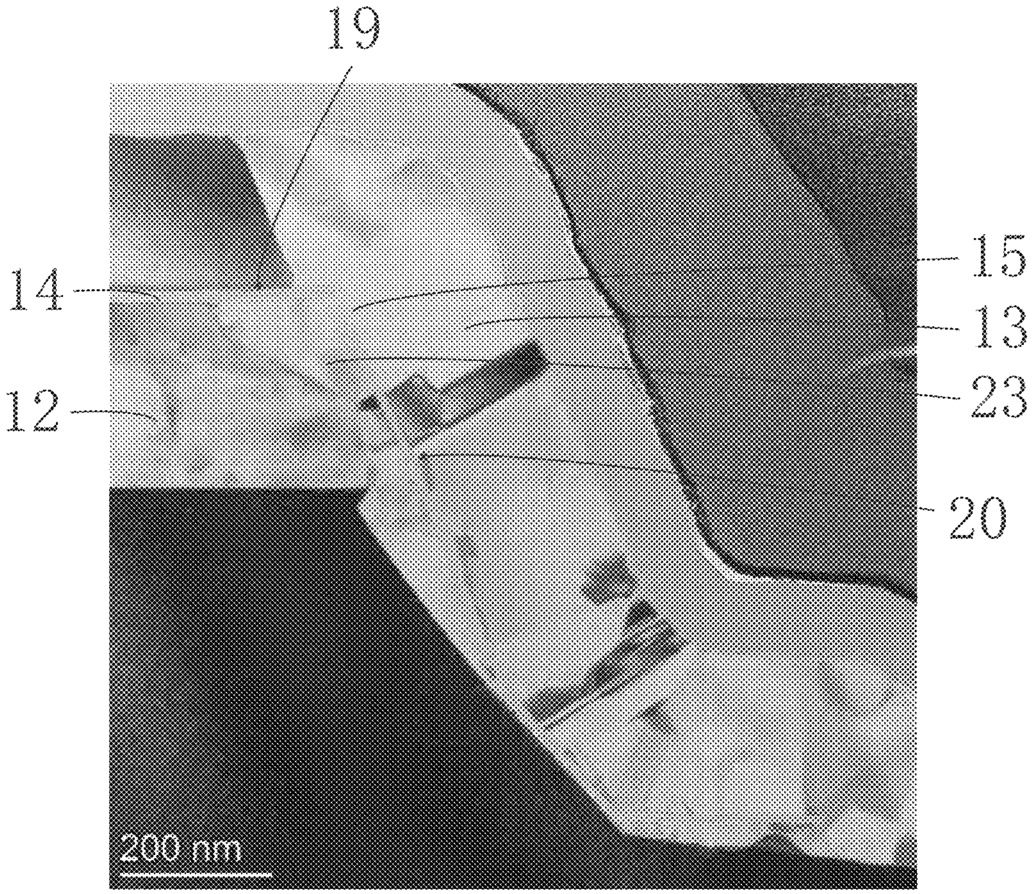
FIG. 14 is a structural SEM micrograph 1 of the back contact solar cell at a stacked structure according to the first group of embodiments of the present application.
Figure 15:
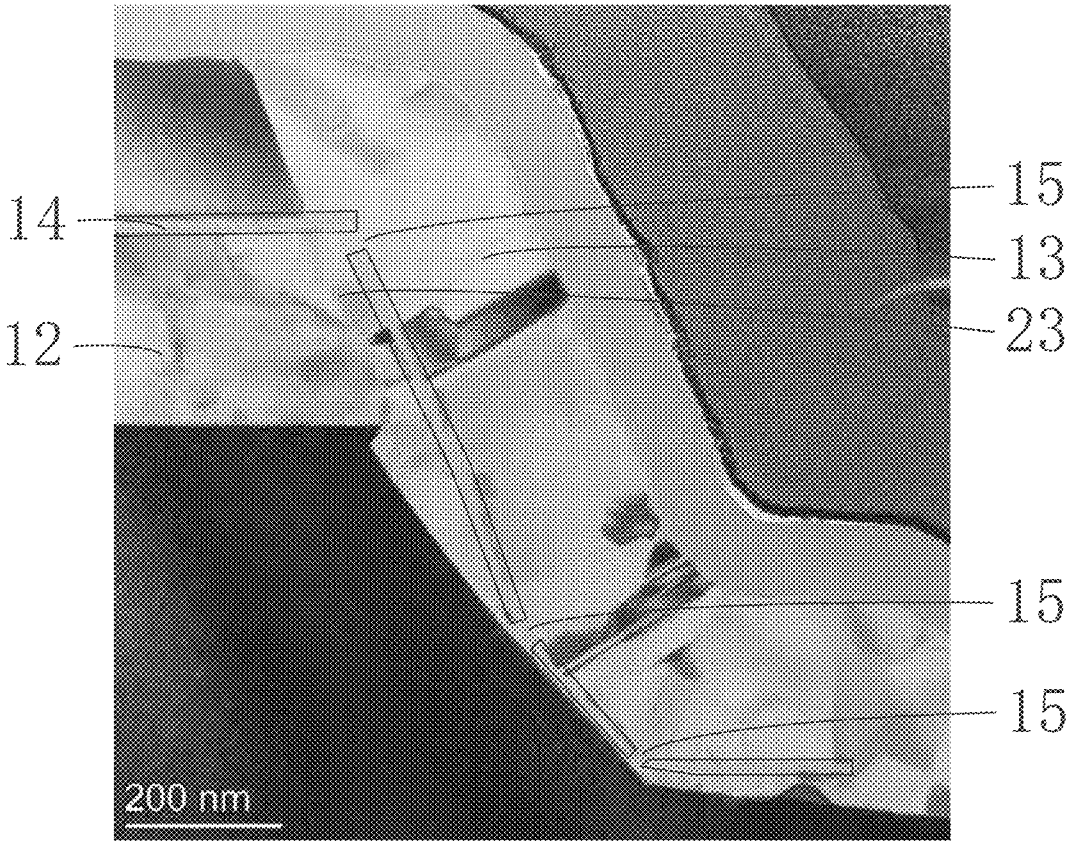
FIG. 15 is a structural SEM micrograph 2 (an approximate position of a dielectric layer is delineated by dash lines in the figure) of the back contact solar cell at a stacked structure according to the first group of embodiments of the present application.

In a second case, as shown in FIG. 14 to FIG. 16, the back contact solar cell may further include a third doped semiconductor portion 23 located between the first doped semiconductor layer 12 and the second doped semiconductor layer 13, and the third doped semiconductor portion 23 is connected to the first doped semiconductor layer 12 and the second doped semiconductor layer 13. In other words, the first doped semiconductor layer 12 is connected to the second doped semiconductor layer 13 by the third doped semiconductor portion 23.

When the back contact solar cell further includes the third doped semiconductor portion, in terms of positions, as shown in FIG. 14 to FIG. 16, the dielectric layer 14 is disposed between at least one of the first doped semiconductor layer 12 and the second doped semiconductor layer 13 and the third doped semiconductor portion 23, and at least one end of the third doped semiconductor portion 23 is connected to the first doped semiconductor layer 12 or the second doped semiconductor layer 13 by the dielectric layer 14 in which the leakage path 15 is disposed. The foregoing connection may be a direct connection between the at least one end of the third doped semiconductor portion 23 and the first doped semiconductor layer 12 or the second doped semiconductor layer 13; or may be, as shown in FIG. 6 and FIG. 7, an indirection connection by the portion of the dielectric layer that corresponds to the leakage path 14 (the portion has an electrical conduction characteristic) in a case that the leakage path does not penetrate the dielectric layer 14. Based on this, the dielectric layer 14 is disposed, so that electrical conduction efficiency between the third doped semiconductor portion 23 and the at least one of the first doped semiconductor layer 12 and the second doped semiconductor layer 13 can be adjusted. For example, insulation or semi-insulation can be achieved through a region of the dielectric layer 14 in which no leakage path 15 is provided, or the control of the electrical conduction efficiency can be achieved by setting the thickness of the dielectric layer 14. Furthermore, the leakage path 15 may be disposed in the dielectric layer 14 to achieve easier conduction of localized current. Further, a contact area, carrier transport efficiency, and the like of a connection region between the at least one end of the third doped semiconductor portion 23 and the first doped semiconductor layer 12 (or the second doped semiconductor layer 13) may be controlled by adjusting the quantity and size of the leakage paths 15 disposed in the dielectric layer 14 and through the thickness of the portion of the dielectric layer 14 that corresponds to the leakage path 15, thereby achieving the control of leakage in the reverse leakage region on side surfaces of the first doped semiconductor layer 12 and the second doped semiconductor layer 13 included in the stacked structure, and achieving a balance between the reverse breakdown voltage and the operating efficiency corresponding to the back contact solar cell, so that hot spot prevention is achieved, and it is ensured that efficiency loss of the solar cell is minimized or even eliminated.

In the first doped semiconductor layer and the second doped semiconductor layer, only the dielectric layer may be disposed between the first doped semiconductor layer and the third doped semiconductor portion. In this case, the third doped semiconductor portion may be connected to the first doped semiconductor layer by the leakage path disposed in the dielectric layer, and the third doped semiconductor portion can be connected to the second doped semiconductor layer without a leakage path. Alternatively, as shown in FIG. 14 to FIG. 16, only the dielectric layer 14 may be disposed between the second doped semiconductor layer 13 and the third doped semiconductor portion 23. In this case, the third doped semiconductor portion 23 can be connected to the second doped semiconductor layer 13 by the leakage path 15 disposed in the dielectric layer 14, and the third doped semiconductor portion 23 can also be connected to the first doped semiconductor layer 12 without the leakage path 15. Further alternatively, dielectric layers may be provided between the first doped semiconductor layer and the third doped semiconductor portion and between the second doped semiconductor layer and the third doped semiconductor portion. In this case, the third doped semiconductor portion needs to be connected to the first doped semiconductor layer and the second doped semiconductor layer respectively by the leakage paths disposed in the dielectric layers.

As for the doping type of the third doped semiconductor portion, the doping type of the third doped semiconductor portion may be determined according to a relative position relationship between the third doped semiconductor portion and the dielectric layer. The doping type of the third doped semiconductor portion may be the same as a doping type of one of the first doped semiconductor layer and the second doped semiconductor layer included in the stacked structure between which and the third doped semiconductor portion the dielectric layer is not disposed, to reduce the manufacturing difficulty of the third doped semiconductor portion. For example, as shown in FIG. 14 to FIG. 16, only the dielectric layer 14 is disposed between the second doped semiconductor layer 13 and the third doped semiconductor portion 23. In this case, the doping type of the third doped semiconductor portion 23 may be the same as the doping type of the first doped semiconductor layer 12.

For example, a material of the third doped semiconductor portion may include at least one doping element. In addition, the doping type of the third doped semiconductor portion is the same as that of one of the first doped semiconductor layer and the second doped semiconductor layer, and a doping concentration of the doping element in the third doped semiconductor portion may be less than that in one of the first doped semiconductor layer and the second doped semiconductor layer that has the same doping type as the third doped semiconductor portion. An example in which the doping type of the third doped semiconductor portion is the same as that of the second doped semiconductor layer is used for description. When the doping concentration of the doping element in the third doped semiconductor portion is less than that of the doping element in the second doped semiconductor layer, in a direction from the first doped semiconductor layer toward the second doped semiconductor layer, a high-low junction with a doping concentration gradient may be formed between the third doped semiconductor portion and the second doped semiconductor layer. Under the action of the built-in electric field of the high-low junction, the transport and dispersion of leakage current are facilitated, so that the reverse breakdown voltage of the back contact solar cell can be further reduced, thereby improving the anti-burnout capability of the back contact solar cell.

It needs to be noted that in an actual application process, when the doping type of the third doped semiconductor portion is the same as that of one of the first doped semiconductor layer and the second doped semiconductor layer, the doping concentration of the doping element in the third doped semiconductor portion may be equal to that in one of the first doped semiconductor layer and the second doped semiconductor layer that has the same doping type as the third doped semiconductor portion. Moreover, specifically which of the first doped semiconductor layer and the second doped semiconductor layer has the same doping type as the third doped semiconductor portion may be determined according to the arrangement position of the dielectric layer and an actual application scenario, and is not specifically limited herein.

For example, in a case that the doping type of the third doped semiconductor portion is the same as the doping type of one of the first doped semiconductor layer and the second doped semiconductor layer, in some embodiments, the doping type of the third doped semiconductor portion may be opposite to that of one of the first doped semiconductor layer and the second doped semiconductor layer included in the stacked structure that is close to the semiconductor substrate, and the third doped semiconductor portion is connected to the one that is far away from the semiconductor substrate by the dielectric layer in which the leakage path is disposed. For example, in a case that one of the first doped semiconductor layer and the second doped semiconductor layer included in the stacked structure that is close to the semiconductor substrate is the first doped semiconductor layer, the doping type of the third doped semiconductor portion is opposite to that of the first doped semiconductor layer, and the third doped semiconductor portion is connected to the second doped semiconductor layer by the dielectric layer in which the leakage path is disposed. For another example, in a case that one of the first doped semiconductor layer and the second doped semiconductor layer included in the stacked structure that is close to the semiconductor substrate is the second doped semiconductor layer, the doping type of the third doped semiconductor portion is opposite to that of the second doped semiconductor layer, and the third doped semiconductor portion is connected to the first doped semiconductor layer by the dielectric layer in which the leakage path is disposed. As shown in FIG. 1 to FIG. 7, FIG. 14, and FIG. 15, compared with that the first doped semiconductor layer 12 is connected to the second doped semiconductor layer 13 by the dielectric layer 14 in which the leakage path 15 is disposed, a butt area of a connection region between the third doped semiconductor portion 23 and the one that is close to the semiconductor substrate 11 that have opposite conductivity types in this case is large (greater than the channel cross-sectional area of the leakage path 15), and therefore the hot-spot risk in back contact solar cells can be further reduced in this case, thereby improving the anti-burnout capability of the back contact solar cell. Next, it may be understood that the portion of the dielectric layer 14 in which the leakage path 15 is not disposed can effectively suppress a formation range of the third doped semiconductor portion 23 and/or reduce a doping concentration of a doping element in the third doped semiconductor portion 23, to affect a butt area between the third doped semiconductor portion 23 and the one that is close to the semiconductor substrate 11, thereby achieving effective control of leakage loss.

For another example, in a case that the doping type of the third doped semiconductor portion is the same as the doping type of one of the first doped semiconductor layer and the second doped semiconductor layer, the doping type of the third doped semiconductor portion may be opposite to that of one of the first doped semiconductor layer and the second doped semiconductor layer included in the stacked structure that is far away from the semiconductor substrate, and the third doped semiconductor portion is connected to the one that is close to the semiconductor substrate by the dielectric layer in which the leakage path is disposed. For example, in a case that one of the first doped semiconductor layer and the second doped semiconductor layer included in the stacked structure that is close to the semiconductor substrate is the first doped semiconductor layer, the doping type of the third doped semiconductor portion is opposite to that of the second doped semiconductor layer, and the third doped semiconductor portion is connected to the first doped semiconductor layer by the dielectric layer in which the leakage path is disposed. For another example, in a case that one of the first doped semiconductor layer and the second doped semiconductor layer included in the stacked structure that is close to the semiconductor substrate is the second doped semiconductor layer, the doping type of the third doped semiconductor portion is opposite to that of the first doped semiconductor layer, and the third doped semiconductor portion is connected to the second doped semiconductor layer by the dielectric layer in which the leakage path is disposed. In this case, a proportion of the reverse leakage region is increased, thereby further reducing the anti-burnout capability of the back contact solar cell.

Next, the type and the doping concentration of the doping element in the third doped semiconductor portion are not specifically limited in the embodiments of the present application. The portions of the third doped semiconductor portion may have the same type and doping concentration of the doping element. In this case, the portions of the third doped semiconductor portion are only doped with a Group IIIA doping element or a Group VA doping element. The portions of the third doped semiconductor portion may be doped with only one type of Group IIIA doping element or one type of Group VA doping element, or may be doped with a plurality of types of Group IIIA doping elements or a plurality of types of Group VA doping elements.

Alternatively, in a case that the dielectric layer is disposed between the at least one of the first doped semiconductor layer and the second doped semiconductor layer and the third doped semiconductor portion, and the at least one end of the third doped semiconductor portion is connected to the first doped semiconductor layer or the second doped semiconductor layer by the dielectric layer in which the leakage path is disposed, the portion of the third doped semiconductor portion close to the dielectric layer may include a Group IIIA doping element and a Group VA doping element, that is, a P-type doping element and an N-type doping element are doped in the portion of the third doped semiconductor portion close to the dielectric layer. It may be understood that with other factors are kept unchanged, compared with that only one of a Group IIIA doping element and a Group VA doping element is provided in the portion of the third doped semiconductor portion close to the dielectric layer, when both a Group IIIA doping element and a Group VA doping element are provided in the portion of the third doped semiconductor portion close to the dielectric layer, because a doping type of the P-type doping element is opposite to that of the N-type doping element, after the third doped semiconductor portion that is originally doped with only one of a Group IIIA doping element and a Group VA doping element is doped with the other one of the Group IIIA doping element and the Group VA doping element, the doping elements of the two doping types are recombined, so that the conductivity of the third doped semiconductor portion is weakened, and the control of the electrical conduction efficiency is achieved in a manner of adjusting a doping concentration of the other one of the Group IIIA doping element and the Group VA doping element in the dielectric layer, thereby achieving a balance the reverse breakdown voltage and the operating efficiency corresponding to the back contact solar cell. The portion of the third doped semiconductor portion close to the dielectric layer may include one or more types of Group IIIA doping elements, and may further include one or more types of Group VA doping elements. In addition, a specific doping type of the third doped semiconductor portion may be determined according to respective position relationships of the first doped semiconductor layer, the second doped semiconductor layer, and the third doped semiconductor portion with respect to the dielectric layer. When the dielectric layer is not included between the first doped semiconductor layer and the third doped semiconductor portion and the dielectric layer is disposed between the second doped semiconductor layer and the third doped semiconductor portion, the doping type of the third doped semiconductor portion is the same as the doping type of the first doped semiconductor layer. When the dielectric layer is not included between the second doped semiconductor layer and the third doped semiconductor portion and the dielectric layer is disposed between the first doped semiconductor layer and the third doped semiconductor portion, the doping type of the third doped semiconductor portion is the same as the doping type of the second doped semiconductor layer.

Moreover, in the second case, at least one of the butt surface of the connection region between the third doped semiconductor portion and the first doped semiconductor layer and the butt surface of the connection region between the third doped semiconductor portion and the second doped semiconductor layer may be only disposed between the first doped semiconductor layer and the second doped semiconductor layer in a direction perpendicular to the first surface. Alternatively, as shown in FIG. 14 to 16, an included angle less than 90° may be formed between the first surface included in the semiconductor substrate 11 and at least one of a butt surface of a connection region between the third doped semiconductor portion 23 and the first doped semiconductor layer 12 and a butt surface of a connection region between the third doped semiconductor portion 23 and the second doped semiconductor layer 13. For example, an included angle of 0°, 10°, 20°, 30°, 40°, 50°, 60°, 70°, 80°, or the like is formed between the butt surface and the first surface. For the application principle of the beneficial effects in this case, refer to the application principle of the beneficial effects that the included angle less than 90° is formed between the butt surface of the connection region between the first doped semiconductor layer 12 and the second doped semiconductor layer 13 and the first surface included in the semiconductor substrate 11 above. Details are not described herein again.

In terms of sizes of grains, a size of grains in the third doped semiconductor portion may be equal to sizes of grains in the first doped semiconductor layer and the second doped semiconductor layer. Alternatively, as shown in FIG. 16, a size of grains in the third doped semiconductor portion 23 may be smaller than that in at least one of the first doped semiconductor layer 12 and the second doped semiconductor layer 13 included in the stacked structure. In other words, the size of grains in the third doped semiconductor portion 23 may be smaller than that in one of the first doped semiconductor layer 12 and the second doped semiconductor layer 13 included in the stacked structure that is close to the semiconductor substrate; and/or, the size of grains in the third doped semiconductor portion 23 may be smaller than that in one of the first doped semiconductor layer 12 and the second doped semiconductor layer 13 included in the stacked structure that is far away from the semiconductor substrate. It may be understood that when grains in a doped semiconductor layer are smaller, more interfaces exist between the grains in the doped semiconductor layer. Therefore, the resistance at a boundary surface of the grains is large. Based on this, the size of the grains in the third doped semiconductor portion 23 is less than that in the at least one of the first doped semiconductor layer 12 and the second doped semiconductor layer 13 included in the stacked structure. In this case, the resistance of the third doped semiconductor portion 23 is greater than the resistance of the at least one of the first doped semiconductor layer 12 and the second doped semiconductor layer 13 included in the stacked structure, thereby enhancing control over carrier transport between the first doped semiconductor layer 12 and the second doped semiconductor layer 13 included in the stacked structure through the third doped semiconductor portion 23. Therefore, the third doped semiconductor portion 23 with grains of small sizes is located between the first doped semiconductor layer 12 and the second doped semiconductor layer 13 included in the stacked structure, so that carrier exchange on two sides can be restricted and the passage of leakage current can be reduced, thereby preventing efficiency loss of the solar cell; and part of leakage current can be consumed and part of leakage current is allowed to pass through, thereby achieving the function of hot spot prevention.

Alternatively, as shown in FIG. 16, an average size of grains in the third doped semiconductor portion 23 may be smaller than that in at least one of the first doped semiconductor layer 12 and the second doped semiconductor layer 13 included in the stacked structure. In other words, the average size of grains in the third doped semiconductor portion 23 may be smaller than that in one of the first doped semiconductor layer 12 and the second doped semiconductor layer 13 included in the stacked structure that is close to the semiconductor substrate; and/or, the average size of some grains in the third doped semiconductor portion 23 may be smaller than that in one of the first doped semiconductor layer 12 and the second doped semiconductor layer 13 included in the stacked structure that is far away from the semiconductor substrate. Crystallinities of the three may be estimated from the sizes of grains, and a crystallinity in the third doped semiconductor portion 23 may be less than that in at least one of the first doped semiconductor layer 12 and the second doped semiconductor layer 13 included in the stacked structure. In other words, the crystallinity in the third doped semiconductor portion 23 may be less than that in one of the first doped semiconductor layer 12 and the second doped semiconductor layer 13 included in the stacked structure that is close to the semiconductor substrate; and/or, the crystallinity in the third doped semiconductor portion 23 may be less than that in one of the first doped semiconductor layer 12 and the second doped semiconductor layer 13 included in the stacked structure that is far away from the semiconductor substrate. For the application principle of the beneficial effects in these cases, refer to the application principle of the beneficial effects that the size of the grains in the third doped semiconductor portion is smaller than that in the at least one of the first doped semiconductor layer and the second doped semiconductor layer included in the stacked structure above. Details are not described herein again.

For the dielectric layer, in terms of thickness directions, the thickness of the dielectric layer in the embodiments of the present application may be any thickness greater than or equal to 13 nm, and is not specifically limited herein.

For example, the thickness of the dielectric layer may be less than or equal to 150 nm. For example, the thickness of the dielectric layer may be 13 nm, 14 nm, 14.5 nm, 15 nm, 16 nm, 17 nm, 18 nm, 20 nm, 30 nm, 50 nm, 60 nm, 80 nm, 100 nm, 120 nm, 150 nm, or the like. A high consumption of materials for manufacturing the dielectric layer due to the large thickness of the dielectric layer can be prevented, which is beneficial to controlling the manufacturing costs of the back contact solar cell. In addition, because the thickness of the dielectric layer may further affect the length of the leakage path and the length of the leakage path is directly proportional to the transport resistance of leakage current, high heat generation power from the transport resistance at the leakage path when the back contact solar cell is shaded due to an excessively large length of the leakage path caused by a large thickness of the dielectric layer can be further prevented, thereby ensuring that the back contact solar cell has high anti-burnout capability.

Moreover, as shown in FIG. 14 and FIG. 15, the dielectric layer 14 may be discontinuous at the leakage path 15. In this case, a thickness of a portion of the dielectric layer 14 in which the leakage path 15 is disposed is 0, and the leakage path 15 penetrates the dielectric layer 14. Alternatively, as shown in FIG. 16, the thickness of the portion of the dielectric layer 14 in which the leakage path 15 is disposed may be greater than 0. In this case, because the thickness of the portion of the dielectric layer 14 in which the leakage path 15 is disposed affects an impedance effect against diffusion of doping elements in one of the first doped semiconductor layer 12 and the second doped semiconductor layer 13 included in the stacked structure that is far away from the semiconductor substrate to the other one by the leakage path 15 during manufacturing of the one that is far away from the semiconductor substrate, an extension range of doping elements after crossing the leakage path is affected, and the proportion of the reverse leakage region between the first doped semiconductor layer 12 and the second doped semiconductor layer 13 is affected. Based on this, the thickness of the portion of the dielectric layer in which the leakage path is disposed may be determined according to requirements of the reverse breakdown voltage and the leakage loss of the back contact solar cell in an actual application scenario, and is not specifically limited herein.

For example, as shown in FIG. 16, the thickness of the portion of the dielectric layer 14 in which the leakage path 15 is disposed may be less than or equal to 7 nm. For example, the thickness of the portion of the dielectric layer 14 in which the leakage path 15 is disposed may be 0, 1 nm, 2 nm, 3 nm, 4 nm, 5 nm, 6 nm, 7 nm, or the like. The thickness of the portion of the dielectric layer 14 in which the leakage path 15 is disposed is small. A thickness of the dielectric layer 14 at the leakage path 15 is controlled below 7 nm, to achieve leakage at the leakage path, thereby providing the back contact solar cell with hot-spot resistance. In addition, leakage magnitude between the first doped semiconductor layer 12 and the second doped semiconductor layer 13 is controlled by controlling the thickness of the portion of the dielectric layer 14 at the leakage path 15, to achieve controllable leakage, and achieve controllability over leakage and electrical isolation, thereby facilitating the adjustment of the reverse breakdown voltage and the operating efficiency corresponding to the back contact solar cell to achieve a balance. Next, the thickness of the dielectric layer 14 affects the electric transport performance of the dielectric layer 14, especially for the dielectric layer 14 of the same material, when the thickness is smaller, the electric transport performance is better, so that an electrical connection can be achieved. When the thickness is larger, the electric transport performance is lower, and the insulation is better, so that electric isolation can be achieved. When the thickness of the dielectric layer 14 at the leakage path is less than or equal to 7 nm, an effective electrical connection can be achieved.

In terms of film layer structures, the dielectric layer may be a single-layer structure, or may be a multi-layer structure. For example, the dielectric layer may be a single-layer structure formed by only a doped silicon glass layer or an etch mask layer (for example, a silicon nitride layer). For another example, the dielectric layer may alternatively be a stack layer including at least one of a doped silicon glass layer and an etch mask layer and a portion of the third region corresponding to the first interface passivation layer or the second interface passivation layer. For still another example, the dielectric layer may alternatively be a stack layer including at least one of a doped silicon glass layer and an etch mask layer and a doped semiconductor material.

In terms of materials, a material of the dielectric layer may be solely an insulating material, or, a material of the dielectric layer may include an insulating material and a semiconductor material. With such an arrangement, while the applicability of the back contact solar cell to different application scenarios is improved, the difficulty of manufacturing the dielectric layer can be reduced. The types of the insulating material and the semiconductor material and the distribution of the insulating material and the semiconductor material in the dielectric layer when the material of the dielectric layer includes the insulating material and the semiconductor material are not specifically limited in the embodiments of the present application, provided that the insulating material and the semiconductor material is applicable to the back contact solar cell provided in the embodiments of the present application.

For example, the material of the dielectric layer may include an oxygen element and/or a silicon element. A variety of insulating materials, for example, silicon oxide, silicon oxynitride, aluminum oxide, oxide titanium, hafnium dioxide, and the like, contain an oxygen element. Therefore, when the material of the dielectric layer includes an oxygen element, the applicability of the back contact solar cell provided in the embodiments of the present application to different application scenarios can be improved. Moreover, the insulating material containing an oxygen element typically has a high dielectric constant, so that the dielectric layer has a high insulating or semi-insulating characteristic, to further reduce the direct transport and recombination of carriers collected by the first doped semiconductor layer and the second doped semiconductor layer in the stacked structure, thereby ensuring that the back contact solar cell has high photoelectric conversion efficiency. Moreover, when the material of the dielectric layer contains a silicon element (which may be silicon, silicon germanium, or another semiconductor material that contains a silicon element, or may be silicon oxide, silicon nitride, silicon oxynitride, or another insulating material that contains a silicon element), the compatibility of the dielectric layer with each of the first doped semiconductor layer and the second doped semiconductor layer made of a semiconductor material can be improved, thereby further improving the operating performance of the back contact solar cell.

For example, in a case that the material of the dielectric layer includes an insulating material and a semiconductor material, the type of the semiconductor material in the dielectric layer may be the same as the type of the semiconductor material in the one of the first doped semiconductor layer and the second doped semiconductor layer included in the stacked structure that is close to the semiconductor substrate. When one of the first doped semiconductor layer and the second doped semiconductor layer included in the stacked structure that is close to the semiconductor substrate is the first doped semiconductor layer, the type of the semiconductor material in the dielectric layer may be the same as the type of the semiconductor material in the first doped semiconductor layer. Alternatively, when one of the first doped semiconductor layer and the second doped semiconductor layer included in the stacked structure that is close to the semiconductor substrate is the second doped semiconductor layer, the type of the semiconductor material in the dielectric layer may be the same as the type of the semiconductor material in the second doped semiconductor layer. As shown in FIG. 14 and FIG. 15, in the thickness direction of the semiconductor substrate 11, the dielectric layer 14 at least covers the one of the first doped semiconductor layer 12 and the second doped semiconductor layer 13 included in the stacked structure that is close to the semiconductor substrate 11. Based on this, in an actual manufacturing process, when the type of the semiconductor material in the dielectric layer 14 is the same as the type of the semiconductor material in the one of the first doped semiconductor layer 12 and the second doped semiconductor layer 13 included in the stacked structure that is close to the semiconductor substrate 11, during the selective etching of the entire first doped semiconductor layer 12 or second doped semiconductor layer 13 under the masking of the insulating material included in the dielectric layer 14, an etchant does not completely remove a portion of the first doped semiconductor layer 12 or the second doped semiconductor layer 13 the is close to the insulating material. In this case, an etching time corresponding to the etchant is relatively short, so that the impact of the etchant on the dielectric layer 14 can be reduced, and it is ensured that the size of the leakage path 15 opened in the dielectric layer 14 is kept from being excessively large, thereby further improving the control level of leakage loss by the dielectric layer 14, and further improving the operating efficiency of the back contact solar cell.

It needs to be noted that, in a case that the material of the dielectric layer includes an insulating material and a semiconductor material, the type of the semiconductor material in the dielectric layer may be different from the type of the semiconductor material in the one of the first doped semiconductor layer and the second doped semiconductor layer included in the stacked structure that is close to the semiconductor substrate. In an actual manufacturing process, before the insulating material included in the dielectric layer is formed, the semiconductor material included in the dielectric layer may be formed on the one of the first doped semiconductor layer and the second doped semiconductor layer included in the stacked structure that is close to the semiconductor substrate according to actual requirements.

In an actual application process, the material of the dielectric layer may include silicon oxide, silicon nitride, intrinsic/doped amorphous silicon, intrinsic/doped poly crystalline silicon, intrinsic/doped monocrystalline silicon, doped phosphorosilicate/borosilicate glass, aluminum oxide, aluminum nitride, phosphorus nitride, titanium nitride, or silicon carbide. One or more of the foregoing materials are selected according to an actual case. The dielectric layer at the position of the leakage path may be made of the same material as the dielectric layer at other positions. For example, electrical connections and electrical isolation at different positions are achieved by adjusting thicknesses of the same material. The manufacturing process of this manner is simple, and no matching obstacle exists between film layers. The dielectric layer at the position of the leakage path and the dielectric layer at other positions may alternatively be made of different materials. For example, a conductive dielectric layer is disposed at the leakage path, and insulating or semi-insulating dielectric layers are disposed at other positions. The combined use of film layers can keep different regions from interfering with each other.

Figure 13:
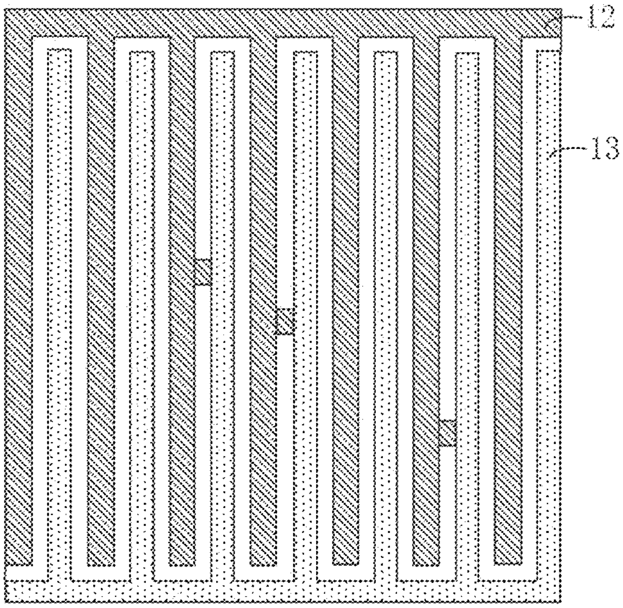
FIG. 13 is a schematic top view 5 from a side of a first doped semiconductor layer and a second doped semiconductor layer of the back contact solar cell according to the first group of embodiments of the present application.

In terms of formation ranges, the dielectric layer may be only disposed between the first doped semiconductor layer and the second doped semiconductor layer included in the stacked structure in the thickness direction of the semiconductor substrate. Alternatively, as shown in FIG. 1 to FIG. 7, the dielectric layer 14 may be disposed between the first doped semiconductor layer 12 and the second doped semiconductor layer 13 included in the stacked structure in the thickness direction of the semiconductor substrate 11, and is disposed between the first doped semiconductor layer 12 and the second doped semiconductor layer 13 included in the stacked structure in a direction parallel to the first surface. Further alternatively, as shown in FIG. 13 and FIG. 14, the dielectric layer 14 is disposed between the first doped semiconductor layer 12 and the second doped semiconductor layer 13 included in the stacked structure, and is also partially disposed on the semiconductor substrate 11. In this case, in a case that one of the first doped semiconductor layer 12 and the second doped semiconductor layer 13 included in the stacked structure that is close to the semiconductor substrate 11 is the first doped semiconductor layer 12, the dielectric layer 14 is further disposed between the second doped semiconductor layer 13 and the semiconductor substrate 11, and at least a partial region of the dielectric layer 14 is in contact with the semiconductor substrate 11; or, in a case that one of the first doped semiconductor layer 12 and the second doped semiconductor layer 13 included in the stacked structure that is close to the semiconductor substrate 11 is the second doped semiconductor layer 13, the dielectric layer 14 is further disposed between the first doped semiconductor layer 12 and the semiconductor substrate 11, and at least a partial region of the dielectric layer 14 is in contact with the semiconductor substrate 11. The dielectric layer 14 can passivate a partial region of the semiconductor substrate 11, to reduce the carrier recombination rate on a side of the semiconductor substrate 11 that is formed with the dielectric layer 14, thereby improving the operating performance of the back contact solar cell.

In a possible implementation, in a case that one of the first doped semiconductor layer and the second doped semiconductor layer included in the stacked structure that is close to the semiconductor substrate is the first doped semiconductor layer, a surface of the third region is higher than a surface of the second region in a direction from the second surface to the first surface; and the dielectric layer further at least extends between a sidewall of a transition from the third region to the second region and the second doped semiconductor layer. The dielectric layer may only extend between the sidewall of the transition from the third region to the second region and the second doped semiconductor layer, or the dielectric layer may extend between the sidewall of the transition from the third region to the second region and the second doped semiconductor layer and between a portion of the second region and the second doped semiconductor layer.

In a case that one of the first doped semiconductor layer and the second doped semiconductor layer included in the stacked structure that is close to the semiconductor substrate is the second doped semiconductor layer, when the surface of the third region is higher than the surface of the first region in the direction from the second surface to the first surface, the dielectric layer may further at least extend between a sidewall of a transition from the third region to the first region and the first doped semiconductor layer. The dielectric layer may only extend between the sidewall of the transition from the third region to the first region and the first doped semiconductor layer, or the dielectric layer may extend between the sidewall of the transition from the third region to the first region and the first doped semiconductor layer and between a portion of the first region and the first doped semiconductor layer.

In a case that one of the first doped semiconductor layer and the second doped semiconductor layer included in the stacked structure that is close to the semiconductor substrate is the first doped semiconductor layer, when the surface of the third region is higher than the surface of the second region in the direction from the second surface to the first surface, the second doped semiconductor layer extends from the surface of the second region to a portion of the first doped semiconductor layer that corresponds to the third region through the sidewall of the transition from the third region to the second region. Based on this, when the dielectric layer further at least extends between the sidewall of the transition from the third region to the second region and the second doped semiconductor layer, a portion of the dielectric layer that extends to the sidewall of the transition from the third region to the second region can ensure that the dielectric layer fully covers the oppositely doped butt region, to ensure that the back contact solar cell effectively controls leakage loss between the first doped semiconductor layer and the second doped semiconductor layer included in the stacked structure in a case that an installation environment of the back contact solar cell has minimal shading obstructions such as dust, thereby further achieving a balance between the reverse breakdown voltage and the operating efficiency corresponding to the back contact solar cell. Moreover, the portion of the dielectric layer that at least extends to the sidewall of the transition from the third region to the second region further passivates a portion of the semiconductor substrate that corresponds to a boundary between the second region and the third region, thereby further improving the operating performance of the back contact solar cell. Moreover, for the beneficial effects that in a case that one of the first doped semiconductor layer and the second doped semiconductor layer included in the stacked structure that is close to the semiconductor substrate is the second doped semiconductor layer, the surface of the third region is higher than the surface of the first region in the direction from the second surface to the first surface; and the dielectric layer further at least extends between the sidewall of the transition from the third region to the first region and the first doped semiconductor layer, refer to the above. Details are not described herein again.

In an actual application process, when the dielectric layer is disposed between the first doped semiconductor layer and the second doped semiconductor layer in both the thickness direction of the semiconductor substrate and the direction parallel to the first surface, an average thickness of the portion of the dielectric layer that is disposed between the first doped semiconductor layer and the second doped semiconductor layer in the thickness direction of the semiconductor substrate may be equal an average thickness of the portion of the dielectric layer that is disposed between the first doped semiconductor layer and the second doped semiconductor layer in the direction parallel to the first surface; or, an average thickness of the portion of the dielectric layer that is disposed between the first doped semiconductor layer and the second doped semiconductor layer in the thickness direction of the semiconductor substrate may be greater than an average thickness of the portion of the dielectric layer that is disposed between the first doped semiconductor layer and the second doped semiconductor layer in the direction parallel to the first surface, to prevent high leakage loss between the first doped semiconductor layer and the second doped semiconductor layer in the thickness direction of the semiconductor substrate caused by a large lap joint width (compared with the thickness of the one of the first doped semiconductor layer and the second doped semiconductor layer included in the stacked structure that is close to the semiconductor substrate) of the stacked structure, thereby ensuring that the back contact solar cell has high operating efficiency.

Next, when the dielectric layer is disposed between the first doped semiconductor layer and the second doped semiconductor layer in the direction parallel to the first surface and is further disposed between the semiconductor substrate and at least one of the first doped semiconductor layer and the second doped semiconductor layer, an average thickness of the portion of the dielectric layer that is disposed between the first doped semiconductor layer and the second doped semiconductor layer in the direction parallel to the first surface may be equal to an average thickness of the portion of the dielectric layer that is disposed between the semiconductor substrate and at least one of the first doped semiconductor layer and the second doped semiconductor layer; or, an average thickness of the portion of the dielectric layer that is disposed between the first doped semiconductor layer and the second doped semiconductor layer in the direction parallel to the first surface may be less than an average thickness of the portion of the dielectric layer that is disposed between the semiconductor substrate and at least one of the first doped semiconductor layer and the second doped semiconductor layer, to ensure leakage current of a specific magnitude between the first doped semiconductor layer and the second doped semiconductor layer in the direction parallel to the first surface, thereby ensuring that the back contact solar cell has low hot-spot risk.

Moreover, as shown in FIG. 14 to FIG. 16, it is defined that the one of the first doped semiconductor layer 12 and the second doped semiconductor layer 13 included in the stacked structure that is close to the semiconductor substrate 11 includes a top surface far away from the semiconductor substrate 11, a bottom surface close to the semiconductor substrate 11, and a side surface connecting the bottom surface and the top surface, and the other one of the first doped semiconductor layer 12 and the second doped semiconductor layer 13 included in the stacked structure that is far away from the semiconductor substrate 11 covers a portion of the top surface and a portion of the side surface of the one that is close to the semiconductor substrate 11. The dielectric layer 14 includes a first dielectric portion 19 and a second dielectric portion 20. The first dielectric portion 19 is disposed between the other one that is far away from the semiconductor substrate 11 and the top surface of the one that is close to the semiconductor substrate 11. For example, the first dielectric portion 19 is disposed between the first doped semiconductor layer 12 and the second doped semiconductor layer 13 in the thickness direction of the semiconductor substrate 11. The second dielectric portion 20 is disposed between the other one that is far away from the semiconductor substrate 11 and the side surface of the one that is close to the semiconductor substrate 11. For example, the second dielectric portion 20 is disposed between the first doped semiconductor layer 12 and the second doped semiconductor layer 13 in the direction parallel to the first surface. The dielectric layer 14 can control leakage current between the first doped semiconductor layer 12 and the second doped semiconductor layer 13 in the stacked structure in the thickness direction of the semiconductor substrate 11, and can further control the leakage current between the first doped semiconductor layer 12 and the second doped semiconductor layer 13 in the stacked structure in a direction parallel to the first surface, thereby ensuring that both the reverse breakdown voltage and the leakage loss of the back contact solar cell can meet operating requirements. Moreover, when the first dielectric portion 19 is disposed between the other one that is far away from the semiconductor substrate 11 and the top surface of the one that is close to the semiconductor substrate 11, and the second dielectric portion 20 is disposed between the other one that is far away from the semiconductor substrate 11 and the side surface of the one that is close to the semiconductor substrate 11, a non-zero included angle exists between extension directions of the first dielectric portion 19 and the second dielectric portion 20, and a spacing between the second dielectric portion 20 and an adjacent structure may be controlled by adjusting the included angle, to control an extension range within which the third doped semiconductor portion 23 can extend to the one that is close to the semiconductor substrate 11 through the leakage path 15, and control the butt area of the connection region between the third doped semiconductor portion 23 and the first doped semiconductor layer 12 (or the second doped semiconductor layer 13), thereby achieving a balance between the operating efficiency and the reverse breakdown voltage of the back contact solar cell. In the case of the foregoing content, the included angle between the first dielectric portion 19 and the second dielectric portion 20 may be determined according to the form of a side surface of the one of the first doped semiconductor layer 12 and the second doped semiconductor layer 13 included in the stacked structure that is close to the semiconductor substrate 11, requirements of the operating efficiency and the reverse breakdown voltage of the back contact solar cell, and an actual manufacturing process in an actual application scenario.

Moreover, the topography, size, and distribution of the leakage path in the dielectric layer may be randomly set. Next, as described above, the first doped semiconductor layer and the second doped semiconductor layer included in the stacked structure can achieve a localized electrical connection through the leakage path disposed in the dielectric layer, thereby reducing the reverse breakdown voltage of the back contact solar cell. As can be learned, the size and distribution of the leakage path in the dielectric layer affect the distribution and butt area of the connection region between the first doped semiconductor layer and the second doped semiconductor layer, to affect the leakage loss and the reverse breakdown voltage of the back contact solar cell. Based on this, the size and distribution of the leakage path may be determined according to requirements of the operating efficiency and hot-spot risk of the back contact solar cell and an actual manufacturing process in an actual application scenario, and are not specifically limited herein. It needs to be noted that the meaning specifically represented by the size of the leakage path may be determined according to specific topography of the leakage path, and is not specifically limited herein. Generally, the size of the leakage path is a cross-sectional size in a direction perpendicular to the first doped semiconductor layer to the second doped semiconductor layer. For example, when the cross-sectional shape of the leakage path is a circle, the size of the leakage path may be a radius or diameter of the circle.

For example, the size of the leakage path may be greater than or equal to 12 nm, and/or, the size of the leakage path is smaller than or equal to the thickness of the one of the first doped semiconductor layer and the second doped semiconductor layer included in the stacked structure that is close to the semiconductor substrate. For example, the size of the leakage path may be 12 nm, 15 nm, 18 nm, 20 nm, 30 nm, 50 nm, 60 nm 80 nm, or the like. When the size of the leakage path is greater than or equal to 12 nm, a small reduction extent of the reverse breakdown voltage of the back contact solar cell caused by a small size of the leakage path can be prevented, thereby ensuring that the back contact solar cell has low hot-spot risk. Moreover, when the size of the leakage path is smaller than or equal to the thickness of the one of the first doped semiconductor layer and the second doped semiconductor layer included in the stacked structure that is close to the semiconductor substrate, the entire region of the sidewall of the one of the first doped semiconductor layer and the second doped semiconductor layer included in the stacked structure that is far away from or close to the semiconductor substrate can be prevented from being exposed through the leakage path, thereby facilitating the control of the junction region area of the butt junction between the first doped semiconductor layer and the second doped semiconductor layer included in the stacked structure, thereby ensuring that the back contact solar cell has low leakage loss in the forward voltage region.

For example, as shown in FIG. 1 to FIG. 7, the at least one leakage path 15 may be located in the first dielectric portion 19; and/or, the at least one leakage path 15 may be located in the second dielectric portion 20; and/or, the at least one leakage path 15 may be located between the first dielectric portion 19 and the second dielectric portion 20. The arrangement position of the leakage path 15 in the dielectric layer 14 has various possible implementations, so that the applicability of the back contact solar cell provided in the embodiments of the present application to different application scenarios is improved, and it is also not necessary to strictly control manufacturing precision or add an additional operation step to form the leakage path 15 at a fixed position, thereby reducing the manufacturing difficulty of the back contact solar cell and simplifying the manufacturing procedure of the back contact solar cell. In some scenarios, the combined use of the first dielectric portion 19, the second dielectric portion 20, the leakage path 15, and the third doped semiconductor portion 23 yields optimal results, and the leakage path 15 may be preferentially disposed on the dielectric layer between the third doped semiconductor portion 23 and the first doped semiconductor layer 12 or the second doped semiconductor layer 13. In this way, the transport of carriers in the leakage region can be further controlled through the third doped semiconductor portion 23, thereby increasing or reducing the transport capability of leakage current as required.

In some embodiments, on the third region, a distribution density of the leakage path in the second dielectric portion is greater than a distribution density of the leakage path in other portions of the dielectric layer.

In a possible implementation, the dielectric layer 14 is disposed between a portion of the second doped semiconductor layer 12 and the first region 16 included in the first surface, and the at least one leakage path 15 is disposed in a portion of the dielectric layer 14 that corresponds to the first region 16. In addition/Alternatively, the dielectric layer 14 is disposed between a portion of the second doped semiconductor layer 13 and the second region 17 included in the first surface, and the at least one leakage path 15 is disposed in a portion of the dielectric layer 14 that corresponds to the second region 17. While at least one of the first region 16 and the second region 17 is passivated through the dielectric layer 14, the two may collect carriers in the semiconductor substrate 11 through the leakage path 15 disposed in the dielectric layer 14, thereby achieving the control of carriers and optimizing the performance of the solar cell.

When the dielectric layer is disposed between the portion of the first doped semiconductor layer and the first region included in the first surface and/or the dielectric layer is disposed between the portion of the second doped semiconductor layer and the second region included in the first surface, the size of the leakage path disposed in the portion of the dielectric layer that corresponds to at least one of the first region and the second region, a linear distance between different leakage paths, and arrangement ranges of the dielectric layer on the first region and the second region may be set according to actual requirements, and are not specifically limited herein.

For example, it is defined that a linear distance between different leakage paths disposed in a portion of the dielectric layer that is located between the first doped semiconductor layer and the second doped semiconductor layer is L1. A linear distance between different leakage paths disposed in a portion of the dielectric layer that is located between the first doped semiconductor layer and the first region or a portion of the dielectric layer that is located between the second doped semiconductor layer and the second region is L2. L1>L2. It may be understood that when the back contact solar cell is in the forward voltage region, a portion of the first doped semiconductor layer that corresponds to the first region and a portion of the second doped semiconductor layer that corresponds to the second region need to collect and export carriers of corresponding conductivity types generated after the semiconductor substrate absorbs photons to form a photocurrent. Based on this, the carrier transport capability of the portion of the first doped semiconductor layer that corresponds to the first region and the portion of the second doped semiconductor layer that corresponds to the second region affect the operating efficiency of the back contact solar cell. When the back contact solar cell is shaded, a portion of the third region in which the first doped semiconductor layer and the second doped semiconductor layer are connected forms the reverse leakage region, thereby facilitating the export of leakage current and reducing hot-spot risk. When the linear distance L1 between different leakage paths disposed in the portion of the dielectric layer that is located between the first doped semiconductor layer and the second doped semiconductor layer is larger, the density of localized leakage points disposed between the first doped semiconductor layer and the second doped semiconductor layer is smaller. In one aspect, it is convenient to control the magnitude of leakage current, so that the back contact solar cell has high operating efficiency. In another aspect, leakage current is more dispersed, and hot spots are more scattered, to prevent a burn-out problem caused by localized heat concentration, thereby further improving the anti-burnout capability of the back contact solar cell. When the linear distance L2 between different leakage paths disposed in the portion of the dielectric layer that is located between the first doped semiconductor layer and the first region or between the second doped semiconductor layer and the second region is smaller, more channels used for achieving carrier transport may be disposed between the first doped semiconductor layer and the first region or between the second doped semiconductor layer and the second region, thereby improving the carrier collection capability of the first doped semiconductor layer or the second doped semiconductor layer, reducing carrier recombination loss, and further improving the operating efficiency of the back contact solar cell.

For example, it is defined that a size of the leakage path disposed in the portion of the dielectric layer that is located between the first doped semiconductor layer and the second doped semiconductor layer is A. It is defined that a size of the leakage path disposed in a portion of the dielectric layer that is located between the first doped semiconductor layer and the first surface or a portion of the dielectric layer that is located between the second doped semiconductor layer and the first surface is B. A>B. For the beneficial effects in this case, refer to the beneficial effects of that L1 is greater than L2 above. Details are not described herein again.

Certainly, L2 may be equal to or greater than L1, and/or, A may be equal to or less than B, thereby improving the passivation effect of the dielectric layer in at least one of a portion of the first region and a portion of the second region.

In addition, the back contact solar cell may further include a first electrode and a second electrode, and the first electrode is electrically connected to the first doped semiconductor layer. The second electrode is electrically connected to the second doped semiconductor layer. When one of the first doped semiconductor layer and the second doped semiconductor layer included in the stacked structure that is close to the semiconductor substrate is the first doped semiconductor layer, a spacing between the dielectric layer and the second electrode may be less than or equal to 400 μm. When one of the first doped semiconductor layer and the second doped semiconductor layer included in the stacked structure that is close to the semiconductor substrate is the second doped semiconductor layer, a spacing between the dielectric layer and the first electrode may be less than or equal to 400 μm. The impact on the collection of carriers by the first doped semiconductor layer and the second doped semiconductor layer due to the presence of the dielectric layer can be reduced, thereby ensuring that the first doped semiconductor layer and the second doped semiconductor layer have high carrier collection capability.

Optionally, embodiments of the present application further provide a method for manufacturing a back contact solar cell. The method for manufacturing a back contact solar cell may include the following steps.

First, a semiconductor substrate is provided. The semiconductor substrate includes a first surface and a second surface that are opposite. The first surface includes a first region and a second region that are spaced apart and a third region that is located between the first region and the second region.

An integral continuous first doped semiconductor layer may then be formed across the first surface of the semiconductor substrate by using chemical vapor deposition or another process. If a material of the first doped semiconductor layer includes silicon and the first doped semiconductor layer is doped by using a diffusion process, after the first doped semiconductor layer is obtained, a doped silicon glass layer is formed on a side of the first doped semiconductor layer away from the semiconductor substrate. A portion of the doped silicon glass layer that corresponds to the second region (or portions corresponding to a local region of the first region and the second region, or portions corresponding to the second region and the third region; or portions corresponding to the second region, the third region, and a fourth region; or portions corresponding to a local region of the first region, the second region, and the third region; or portions corresponding to a local region of the first region, the second region, the third region, and the fourth region) is then processed by using a laser irradiation process, so that a leakage path is formed in the doped silicon glass layer in the corresponding regions, and the doped silicon glass layer in regions that are not irradiated with laser is kept as a mask layer. Next, the first doped semiconductor layer in a region that is not covered by the mask layer is selectively removed by using a wet chemical etching process under the masking of the mask layer. After etching, the remaining portion of the doped silicon glass layer after the irradiation of the regions with laser covers a side surface of the first doped semiconductor layer, and even covers a portion of the semiconductor substrate that corresponds to a boundary between the first region and the third region and a portion of the doped silicon glass layer that corresponds to a boundary between the third region and the second region, and a position at which the doped silicon glass layer is discontinuous is the leakage path. Based on this, after the wet chemical etching, the remaining portion of the doped silicon glass layer forms a dielectric layer.

Next, an integral continuous second doped semiconductor layer may be formed across the second region and the first doped semiconductor layer of the semiconductor substrate by using a chemical vapor deposition or another process. A portion of the second doped semiconductor layer that covers the first region corresponding to the first doped semiconductor layer (or a portion of the second doped semiconductor layer that covers the first region corresponding to the first doped semiconductor layer and a portion of the second doped semiconductor layer that covers the fourth region) is then selectively removed by using an etching process.

In a case that the back contact solar cell provided in the embodiments of the present application is manufactured in the foregoing manner, the distribution and size of the leakage path in the dielectric layer may be controlled by controlling the laser irradiation position, spot size, laser energy, spot arrangement, and the like.

In other embodiments, the dielectric layer may be manufactured by using an atomic layer deposition process, a plasma-enhanced chemical vapor deposition process, a low-pressure chemical vapor deposition process, or the like, to form a single-layer film, or a composite film with two or more layers. For example, a silicon oxide layer may be deposited on a surface of the doped silicon glass layer (for the manufacturing manner, refer to the foregoing descriptions) including the leakage path formed through laser irradiation that is far away from a silicon substrate. The silicon oxide layer may be manufactured by using a low-pressure chemical vapor deposition process. The silicon oxide layer is further formed on the leakage path. The dielectric layer is a stack layer of the doped silicon glass layer and the silicon oxide layer. The dielectric layer for achieving an electrical connection may exist at the leakage path.

In other embodiments, the leakage path may be obtained through chemical etching. For example, a region other than a preset region of the leakage path may be covered with a mask, and then chemical etching is performed to obtain a thinned region of a film layer or a locally discontinuous region of a film layer, thereby obtaining the leakage path.

A second group of back contact solar cells in the first aspect of the present application are described below with reference to FIG. 17 to FIG. 35.

As shown in FIG. 17, in some embodiments, in the back contact solar cell provided in the embodiments of the present application, a portion of the dielectric layer 14 that is disposed between the first doped semiconductor layer 12 and the second doped semiconductor layer 13 in the thickness direction of the semiconductor substrate 11 is the first dielectric portion 19. In other words, in the thickness direction of the semiconductor substrate 11, an arrangement position relationship of the first doped semiconductor layer 12, the second doped semiconductor layer 13, and the first dielectric portion 19 is the first doped semiconductor layer 12, the first dielectric portion 19, and the second doped semiconductor layer 13. In the dielectric layer 14, at least one leakage path 15 is disposed in the first dielectric portion 19. On the third region 18, in a direction from the first region 16 to the second region 17, a width of the first dielectric portion 19 is greater than or equal to a width of one of the first doped semiconductor layer 12 and the second doped semiconductor layer 13 included in the stacked structure that is far away from the semiconductor substrate 11.

The dielectric layer 14 included in the back contact solar cell includes the first dielectric portion 19 disposed between the first doped semiconductor layer 12 and the second doped semiconductor layer 13 in the thickness direction of the semiconductor substrate 11. The first dielectric portion 19 with a width greater than or equal to that of the one of the first doped semiconductor layer 12 and the second doped semiconductor layer 13 included in the stacked structure that is far away from the semiconductor substrate 11 is disposed, to achieve the control of electrical transport between the first doped semiconductor layer 12 and the second doped semiconductor layer 13 included in the stacked structure. At least one leakage path 15 is disposed in the first dielectric portion 19. In this case, the partial region of the first doped semiconductor layer 12 and the partial region of the second doped semiconductor layer 13 in the stacked structure can directly or indirectly achieve the electrical connection by the leakage path 15. Moreover, in the dielectric layer 14, the leakage path 15 is disposed in the first dielectric portion 19. Because the first doped semiconductor layer 12 and the second doped semiconductor layer 13 included in the stacked structure have surface topography approximately parallel to the first surface, the surface topography has simple surface topography compared with the side surfaces of the first doped semiconductor layer 12 and the second doped semiconductor layer 13. Therefore, the leakage path 15 is disposed in the first dielectric portion 19, so that without restriction in structural complexity, it is only necessary to adjust a corresponding leakage path 15 pattern or an arrangement position, and other factors do not need to be considered. For example, compared with conventional etching, during manufacturing of the leakage path 15 using etching, it may be additionally further necessary to adjust an etching angle, to reduce the difficulty of opening the leakage path 15 in the dielectric layer 14 through laser etching or another process, so that while the manufacturing difficulty of the back contact solar cell is reduced, the compatibility of the back contact solar cell provided in the embodiments of the present application with conventional manufacturing processes of a back contact solar cell can be improved, thereby enhancing a method for manufacturing a back contact solar cell. Moreover, the dielectric layer 14 can achieve physical separation, and a function layer having electrically insulating or semi-insulating performance may be chosen to achieve the control of electrical transport between the first doped semiconductor layer 12 and the second doped semiconductor layer 13 in the stacked structure. Therefore, the portion of the dielectric layer 14 in which the leakage path 15 is not disposed can electrically isolate the partial region of the first doped semiconductor layer 12 and the partial region of the second doped semiconductor layer 13 in the stacked structure, so that direct transport and recombination of carriers collected by the first doped semiconductor layer 12 and the second doped semiconductor layer 13 in the stacked structure can be effectively reduced, thereby effectively controlling leakage loss of the back contact solar cell, and providing the back contact solar cell with good operating performance. As can be learned, in the back contact solar cell provided in the embodiments of the present application, while hot-spot risk in back contact solar cells is reduced through the leakage path 15 disposed in the dielectric layer 14, the leakage loss of the back contact solar cell in the forward voltage region can be further effectively controlled through the insulating characteristic of the portion of the dielectric layer 14 in which the leakage path 15 is not disposed. In addition, in the dielectric layer 14, compared with that the leakage path 15 is opened at a corresponding position in the side surface of the one of the first doped semiconductor layer 12 and the second doped semiconductor layer 13 included in the stacked structure that is close to the semiconductor substrate 11 using an etching process, the difficulty and precision of only opening the leakage path 15 in the first dielectric portion 19 between the first doped semiconductor layer 12 and the second doped semiconductor layer 13 disposed in the thickness direction of the semiconductor substrate 11 are higher, so that it is easier to achieve precise control of leakage and insulation, thereby adjusting the reverse breakdown voltage and the operating efficiency corresponding to the back contact solar cell to achieve a balance.

As described in the first group of embodiments of the first aspect, in an actual application process, the material and the conductivity type of the semiconductor substrate are not specifically limited in the embodiments of the present application. For example, the semiconductor substrate may be a silicon substrate. Alternatively, the semiconductor substrate may be a silicon germanium substrate, a germanium substrate, a gallium arsenide substrate, or any other substrate made of a semiconductor material.

Similarly, the distribution of the first region, the second region, and the third region on the first surface, the topography of the first region and the second region on the first surface, the doping types, the materials, the substance arrangement form, and the stack manner of the first doped semiconductor layer and the second doped semiconductor layer, the arrangement position of the first doped semiconductor layer, the material and the thickness of the first interface passivation layer, the arrangement position of the second doped semiconductor layer, the material and the thickness of the second interface passivation layer, the arrangement range of the third region, and the like are as described in the first group of embodiments of the first aspect. Details are not described again.

Similarly, the first region corresponds to a first emitter region, and the second region corresponds to a second emitter region. One of the first region and the second region corresponds to a P region, the other one of the first region and the second region corresponds to an N region, and the third region corresponds to a PN stacked structure.

Figure 27:
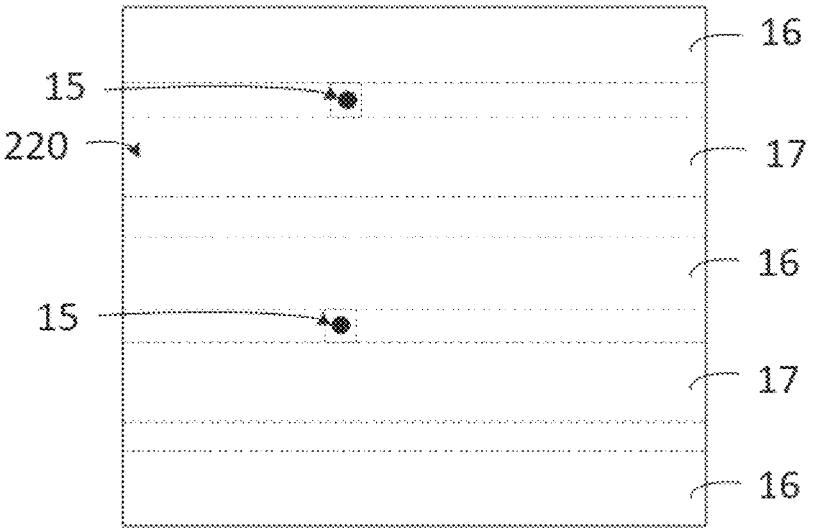
FIG. 27 is a schematic diagram 1 of possible distribution positions of leakage paths in a local region on a side of a first surface in the back contact solar cell according to the second group of embodiments of the present application.

For example, as shown in FIG. 27, the first region 16 and the second region 17 may be alternately spaced apart in a striped pattern. Each of the first region 16 and the second region 17 may include a plurality of digitate regions 220, and the digitate regions 220 included in the first region 16 and the digitate regions 220 included in the second region 17 extend in the first direction and are spaced apart in the second direction. The first direction is different from the second direction. The first direction and the second direction may be any two directions that are parallel to the first surface and are different from each other. In some embodiments, the first direction and the second direction are orthogonal.

Figure 28:
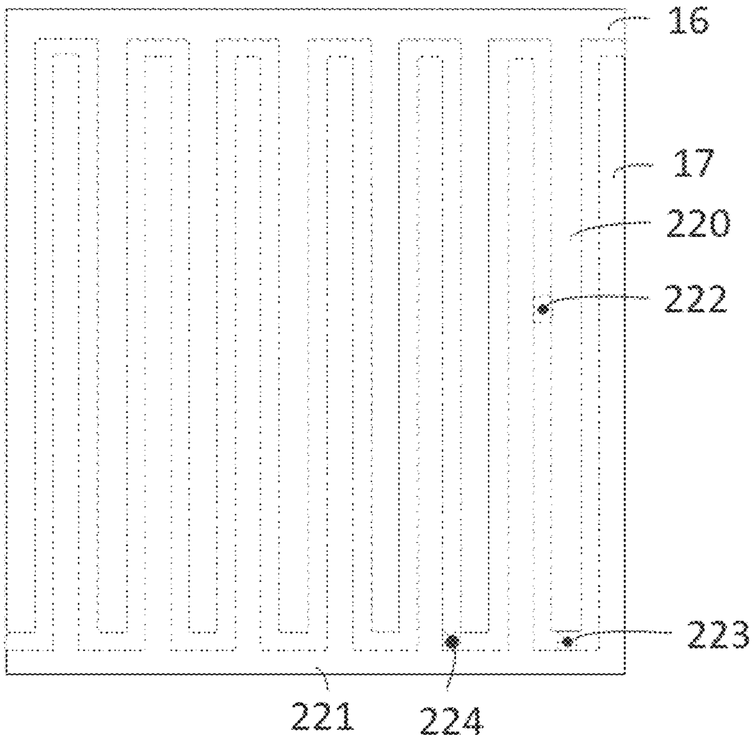
FIG. 28 is a schematic diagram 2 of possible distribution positions of leakage paths in a local region on a side of a first surface in the back contact solar cell according to the second group of embodiments of the present application.

For example, as shown in FIG. 28, the first region 16 and the second region 17 may be alternately spaced apart in an interdigitated pattern. Each of the first region 16 and the second region 17 includes a plurality of digitate regions 220 and at least one connection region 221. The digitate regions 220 included in the first region 16 and the digitate regions 220 included in the second region 17 extend in the first direction and are spaced apart in the second direction. The connection regions 221 included in the first region 16 are connected to the digitate regions 220 included in the first region 16, and the connection regions 221 included in the second region 17 are connected to the digitate regions 220 included in the second region 17. The first direction is different from the second direction. The first direction and the second direction may be any two directions that are parallel to the first surface and are different from each other. In some embodiments, the first direction and the second direction are orthogonal.

Figure 29:
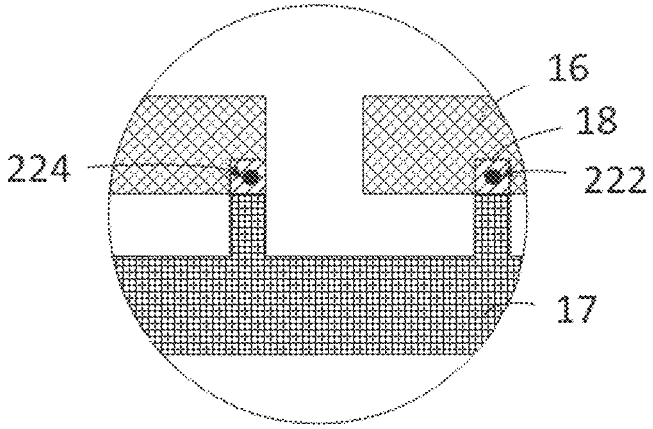
FIG. 29 is a schematic diagram 3 of possible distribution positions of leakage paths in a local region on a side of a first surface in the back contact solar cell according to the second group of embodiments of the present application.
Figure 30:
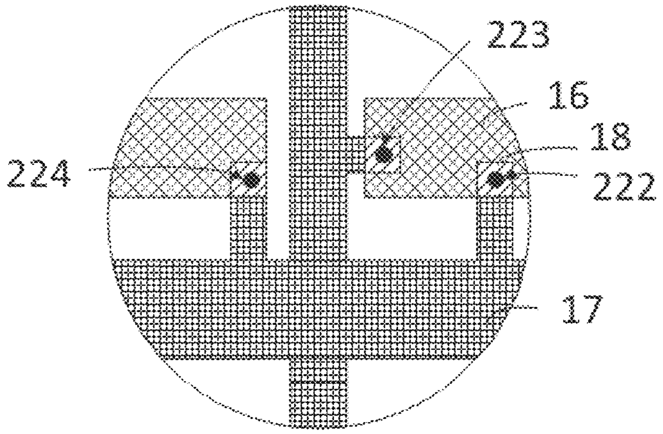
FIG. 30 is a schematic diagram 4 of possible distribution positions of leakage paths in a local region on a side of a first surface in the back contact solar cell according to the second group of embodiments of the present application.

Moreover, as shown in FIG. 27 and FIG. 28, the digitate regions included in the first region 16 and the second region 17 may be regular rectangular regions. Alternatively, each of the first region and the second region may include a non-rectangular region. For example, as shown in FIG. 29 and FIG. 30, in a case that one of the first doped semiconductor layer and the second doped semiconductor layer included in the stacked structure that is close to the semiconductor substrate is the first doped semiconductor layer, at least a portion of the first region 16 and the third region 18 may form a rectangular region. In this case, at least a portion of the first region 16 is a portion of the rectangular region with the third region 18 removed, that is, "a rectangular region with a missing portion". Alternatively, in a case that one of the first doped semiconductor layer and the second doped semiconductor layer included in the stacked structure that is close to the semiconductor substrate is the second doped semiconductor layer, at least a portion of the second region 17 and the third region 18 may form a rectangular region. In this case, at least a portion of the second region 17 is a portion of the rectangular region with the third region 18 removed, that is, "a rectangular region with a missing portion".

Figure 20:
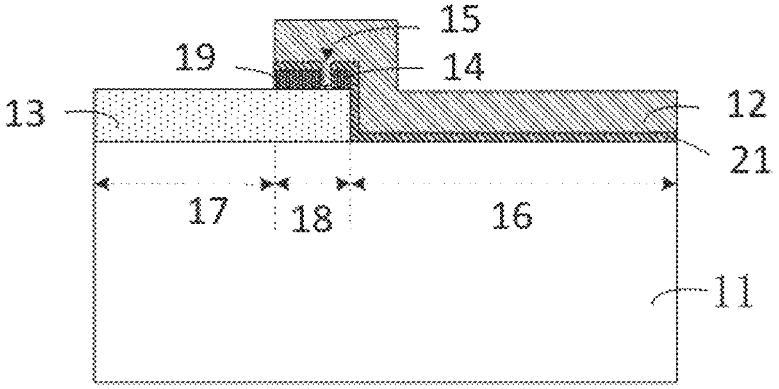
FIG. 20 is a schematic longitudinal cross-sectional view of a fourth structure of the back contact solar cell according to the second group of embodiments of the present application.
Figure 21:
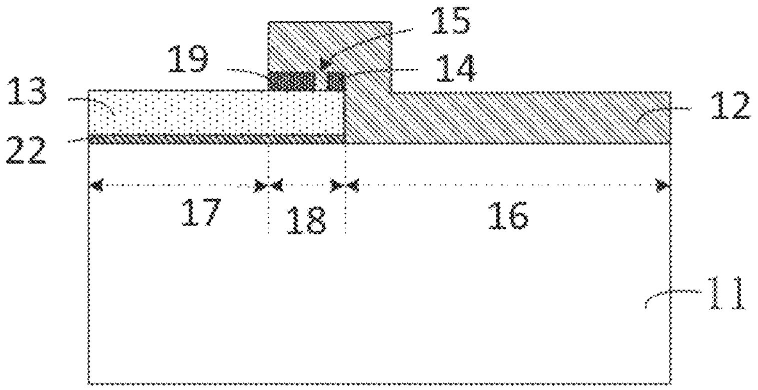
FIG. 21 is a schematic longitudinal cross-sectional view of a fifth structure of the back contact solar cell according to the second group of embodiments of the present application.
Figure 22:
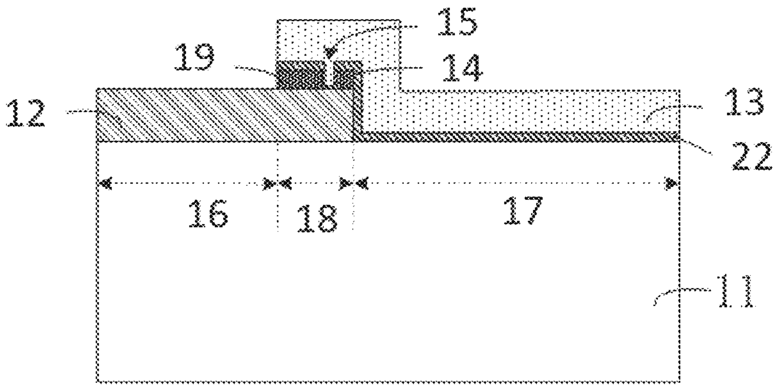
FIG. 22 is a schematic longitudinal cross-sectional view of a sixth structure of the back contact solar cell according to the second group of embodiments of the present application.

In some embodiments, on the third region and in the direction from the first region to the second region, a width of the interface passivation layer corresponding to one of the first doped semiconductor layer and the second doped semiconductor layer included in the stacked structure that is far away from the semiconductor substrate may be equal to a width corresponding the one that is far away from the semiconductor substrate. For example, as shown in FIG. 20, in a case that one of the first doped semiconductor layer 12 and the second doped semiconductor layer 13 included in the stacked structure that is far away from the semiconductor substrate 11 is the first doped semiconductor layer 12, on the third region 18 and in the direction from the first region 16 to the second region 17, a width of the first interface passivation layer 21 may be equal to a width of the first doped semiconductor layer 12. For another example, as shown in FIG. 22, in a case that one of the first doped semiconductor layer 12 and the second doped semiconductor layer 13 included in the stacked structure that is far away from the semiconductor substrate 11 is the second doped semiconductor layer 13, on the third region 18 and in the direction from the first region 16 to the second region 17, a width of the second interface passivation layer 22 may be equal to a width of the second doped semiconductor layer 13.

Figure 23:
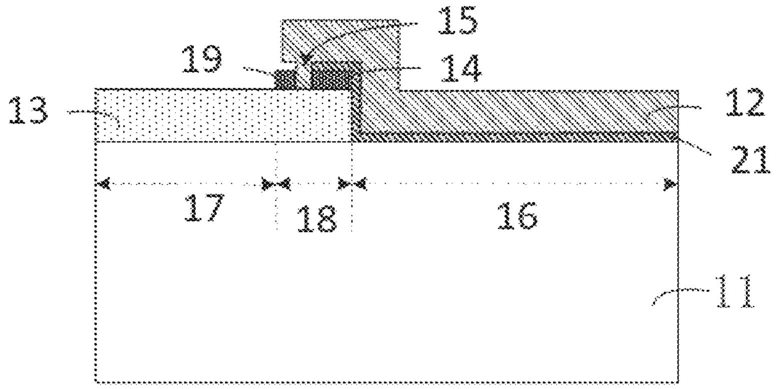
FIG. 23 is a schematic longitudinal cross-sectional view of a seventh structure of the back contact solar cell according to the second group of embodiments of the present application.
Figure 24:
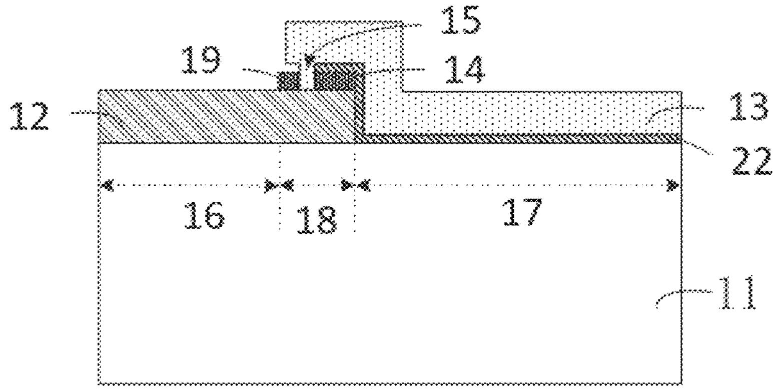
FIG. 24 is a schematic longitudinal cross-sectional view of an eighth structure of the back contact solar cell according to the second group of embodiments of the present application.

Alternatively, on the third region and in the direction from the first region to the second region, the width of the interface passivation layer corresponding to one of the first doped semiconductor layer and the second doped semiconductor layer included in the stacked structure that is far away from the semiconductor substrate may be less than the width corresponding the one that is far away from the semiconductor substrate. For example, as shown in FIG. 23, in a case that one of the first doped semiconductor layer 12 and the second doped semiconductor layer 13 included in the stacked structure that is far away from the semiconductor substrate 11 is the first doped semiconductor layer 12, on the third region 18 and in the direction from the first region 16 to the second region 17, the width of the first interface passivation layer 21 may be less than the width of the first doped semiconductor layer 12. For another example, as shown in FIG. 24, in a case that one of the first doped semiconductor layer 12 and the second doped semiconductor layer 13 included in the stacked structure that is far away from the semiconductor substrate 11 is the second doped semiconductor layer 13, on the third region 18 and in the direction from the first region 16 to the second region 17, the width of the second interface passivation layer 22 may be less than the width of the second doped semiconductor layer 13. On the third region 18, the corresponding interface passivation layer is no longer present between the portions of the first doped semiconductor layer 12 and the second doped semiconductor layer 13 that correspond to the leakage path 15, so that the conduction resistance between the two is reduced, thereby further reducing the reverse breakdown voltage of the back contact solar cell.

On the third region and in the direction from the first region to the second region, the width of the one of the first doped semiconductor layer and the second doped semiconductor layer included in the stacked structure that is far away from the semiconductor substrate affects the proportion of the reverse leakage region on the third region, to further affect the reverse breakdown voltage and the leakage loss of the back contact solar cell. Therefore, the one that is far away from the semiconductor substrate may be determined according to an actual application scenario, provided that it is met that the width of the first dielectric portion is greater than or equal to the width of the one of the first doped semiconductor layer and the second doped semiconductor layer included in the stacked structure that is far away from the semiconductor substrate.

For example, on the third region and in the direction from the first region to the second region, the width of the one of the first doped semiconductor layer and the second doped semiconductor layer included in the stacked structure that is far away from the semiconductor substrate may be greater than or equal to 5 μm and less than or equal to 200 μm. For example, the width of the one that is far away from the semiconductor substrate may be 5 μm, 10 μm, 30 μm, 50 μm, 80 μm, 100 μm, 150 μm, 180 μm, 200 μm, or the like.

For the dielectric layer, in terms of materials, the material of the dielectric layer may include at least one insulating material and/or intrinsic semiconductor material, provided that the dielectric layer can have an insulating or semi-insulating effect. For example, the material of the dielectric layer may include at least one of silicon oxide, silicon nitride, intrinsic amorphous silicon, intrinsic polycrystalline silicon, intrinsic monocrystalline silicon, doped phosphorus glass, doped boron glass, aluminum oxide, aluminum nitride, phosphorus nitride, titanium nitride, or silicon carbide.

In terms of a formation range, a specific arrangement range of the dielectric layer between the first doped semiconductor layer and the second doped semiconductor layer may be determined according to the materials of the first doped semiconductor layer and the second doped semiconductor layer and an actual application scenario, provided that the dielectric layer including the first dielectric portion between the first doped semiconductor layer and the second doped semiconductor layer disposed in the thickness direction of the semiconductor substrate.

For example, as shown in FIG. 17, the dielectric layer 14 may include only the first dielectric portion 19, that is, the dielectric layer 14 may be only disposed between the first doped semiconductor layer 12 and the second doped semiconductor layer 13 in the thickness direction of the semiconductor substrate 11. For example, when the back contact solar cell provided in the embodiments of the present application is a hybrid back contact solar cell or a heterojunction back contact solar cell, the dielectric layer may include only a first dielectric portion. The hybrid back contact solar cell is a back contact solar cell in which an N region and a P region respectively correspond to a tunnel passivation contact structure and a heterogeneous contact structure. For another example, when the back contact solar cell provided in the embodiments of the present application is a back contact solar cell that is combined with a tunnel passivation contact structure, the dielectric layer may include only a first dielectric portion. In this case, the first doped semiconductor layer and the second doped semiconductor layer may be electrically connected in the direction parallel to the first surface, thereby improving the anti-burnout capability of the back contact solar cell in an installation environment with significant shading obstructions such as dust.

Figure 25:
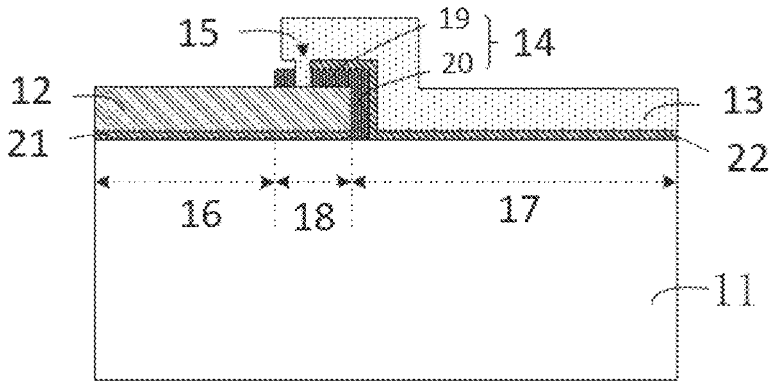
FIG. 25 is a schematic longitudinal cross-sectional view of a ninth structure of the back contact solar cell according to the second group of embodiments of the present application.

For example, as shown in FIG. 25, the dielectric layer 14 may further include the second dielectric portion 20 disposed between the first doped semiconductor layer 12 and the second doped semiconductor layer 13 in the direction parallel to the first surface. In other words, in the direction parallel to the first surface, an arrangement position relationship of the first doped semiconductor layer 12, the second doped semiconductor layer 13, and the second dielectric portion 20 is the first doped semiconductor layer 12, the second dielectric portion 20, and the second doped semiconductor layer 13. For example, when the back contact solar cell provided in the embodiments of the present application is a back contact solar cell that is combined with a tunnel passivation contact structure, the dielectric layer may include a first dielectric portion and a second dielectric portion. The presence of the second dielectric portion may separate the first doped semiconductor layer and the second doped semiconductor layer in the direction parallel to the first surface, to further reduce the leakage loss between the first doped semiconductor layer and the second doped semiconductor layer, thereby improving the operating efficiency of the back contact solar cell in an installation environment with minimal shading obstructions such as dust or bird droppings. Certainly, when another type of back contact solar cell is provided in the embodiments of the present application, the dielectric layer may alternatively further include the second dielectric portion. In some embodiments, in the back contact solar cell provided in the embodiments of the present application, when the third region formed with the stacked structure is disposed between regions of the first region and regions of the second region, the back contact solar cell further includes the second dielectric portion, to further reduce the leakage loss between the first doped semiconductor layer and the second doped semiconductor layer, thereby further improving the operating performance of the back contact solar cell. Because the third region formed with the stacked structure is disposed between the regions of the first region and the regions of the second region, the third region with the stacked structure is formed on all the portions between the first region and the second region. In this case, the stacked structure extends by a long distance. Although the leakage region on the top surface of the doped semiconductor layer of the stacked structure close to the semiconductor substrate that is away from the semiconductor substrate is adjusted through the first dielectric portion, thereby achieving local leakage. However, if both the doped semiconductor layer close to the semiconductor substrate and the side surface in the stacked structure are leakage regions, the leakage loss is high. Therefore, the second dielectric portion is introduced to control the leakage on the side surface, thereby optimizing the performance of the solar cell.

As can be seen from the foregoing content, the arrangement range of the dielectric layer may be determined according to the materials of the first doped semiconductor layer and the second doped semiconductor layer in an actual application scenario and the requirements of the reverse breakdown voltage and the leakage loss of the back contact solar cell in the actual application scenario, and are not specifically limited herein.

For the arrangement width of the first dielectric portion, t may be understood that in a case that the distribution density of the leakage paths in the first dielectric portion has a fixed value, the width of the first dielectric portion is directly proportional to the proportion of the reverse leakage region on the first surface. Based on this, the width of the first dielectric portion may be set according to different environmental requirements, provided that the width of the first dielectric portion is greater than or equal to the width of one of the first doped semiconductor layer and the second doped semiconductor layer included in the stacked structure that is far away from the semiconductor substrate.

For example, on the third region and in the direction from the first region to the second region, the width of the first dielectric portion may be greater than or equal to 10 μm and less than or equal to 200 μm. For example, on the third region and in the direction from the first region to the second region, the width of the first dielectric portion may be 10 μm, 30 μm, 50 μm, 80 μm, 100 μm, 120 μm, 150 μm, 180 μm, 200 μm, or the like. As described above, the width of the first dielectric portion may be set according to different environmental requirements, so that the back contact solar cell has lower hot-spot risk in an installation environment with significant shading obstructions such as dust, or the back contact solar cell has low leakage loss in an installation environment with minimal shading obstructions such as dust, thereby improving the applicability of the back contact solar cell provided in the embodiments of the present application to different actual application scenarios. Moreover, the width of the first dielectric portion is within the foregoing range, so that high difficulty of performing selective etching on a dielectric material caused by a small width of the first dielectric portion can be further prevented, thereby reducing the manufacturing difficulty of the back contact solar cell.

For example, the back contact solar cell may further include a first electrode (not shown in the figure) and a second electrode (not shown in the figure), and the first electrode is electrically connected to the first doped semiconductor layer. The second electrode is electrically connected to the second doped semiconductor layer. A minimum spacing between at least one of the first electrode and the second electrode and the leakage path disposed in the first dielectric portion is greater than or equal to 30 μm and less than or equal to 300 μm. For example, the minimum spacing may be 30 μm, 50 μm, 80 μm, 100 μm, 150 μm, 200 μm, 220 μm, 250 μm, 260 μm, 280 μm, 290 μm, 300 μm, or the like. A specific distance needs to be kept between at least one of the first electrode and the second electrode and the leakage path adjacent thereto to avoid a short circuit caused by contact between electrodes and a leakage region, thereby avoiding affecting the efficiency of the solar cell. In one aspect, because equipment for manufacturing the first electrode and the second electrode usually has specific processing errors in an actual application process, target formation ranges of the first electrode and the second electrode have specific deviations from actual formation ranges. In another aspect, because the manufacturing of the leakage path leads to damage to film layers to some extent, affecting the generation and collection of carriers, if one of the first electrode and the second electrode forms an electrical connection here, carrier collection is affected, and the efficiency of the solar cell is affected. Based on this, a preset distance needs to be reserved.

The leakage path may be arranged in the first dielectric portion in at least the following three manners.

In a first manner, as shown in FIG. 25, the first dielectric portion 19 may be penetrated (i.e., discontinuous) at the at least one leakage path 15. The impact of isolation by the dielectric layer 14 no longer exists between portions of the first doped semiconductor layer 12 and the second doped semiconductor layer 13 that correspond to the leakage path 15, thereby reducing the conduction resistance of a portion of the leakage path 15 corresponding to the two. In addition, in a case that the first doped semiconductor layer 12 and the second doped semiconductor layer 13 included in the stacked structure are formed, the impedance level against diffusion of dopants in one of the first doped semiconductor layer 12 and the second doped semiconductor layer 13 included in the stacked structure that is far away from the semiconductor substrate 11 by the portion of the dielectric layer 14 that corresponds to the leakage path 15 to the opposite side of the dielectric layer 14 through the leakage path 15 can be further reduced, thereby increasing the butt area of the direct electrical connection region or the indirect electrical connection region between the first doped semiconductor layer 12 and the second doped semiconductor layer 13, reducing the reverse breakdown voltage of the back contact solar cell, and further improving the anti-burnout capability of the back contact solar cell in an installation environment with significant shading obstructions such as dust.

Figure 26:
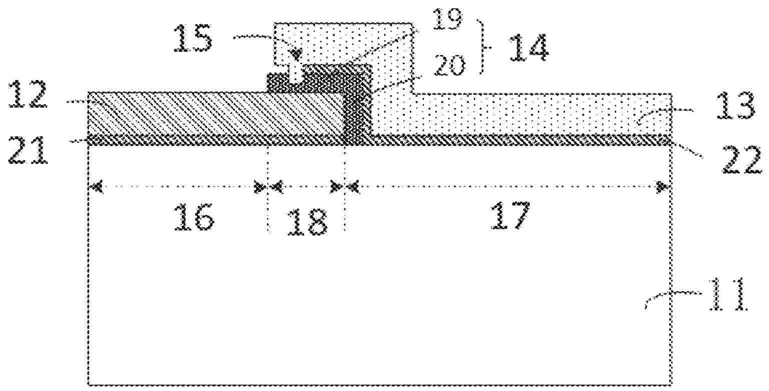
FIG. 26 is a schematic longitudinal cross-sectional view of a tenth structure of the back contact solar cell according to the second group of embodiments of the present application.

In a second manner, as shown in FIG. 26, a thickness of a portion of the first dielectric portion 19 that corresponds to the least one leakage path 15 is less than a thickness of the remaining portion of the first dielectric portion 19. In an actual application process, the impedance level against diffusion of dopants in the one that is far away from the semiconductor substrate 11 by the portion of the dielectric layer 14 that corresponds to the leakage path 15 to the opposite side of the dielectric layer 14 through the leakage path 15 can alternatively be reduced in a manner of removing a partial thickness at a position of the first dielectric portion 19 that corresponds to the leakage path 15, so that while hot-spot risk in back contact solar cells is reduced, a diffusion range of the dopants can be controlled through a partial thickness of the first dielectric portion 19 that remains at the leakage path 15, thereby achieving the control of the butt area of the direct or indirect electrical connection region between the first doped semiconductor layer 12 and the second doped semiconductor layer 13, eventually controlling the reverse breakdown voltage and the leakage loss of the back contact solar cell, and improving the applicability of the back contact solar cell provided in the embodiments of the present application to different application scenarios.

In the second case, it is defined that the thickness of the portion of the first dielectric portion that corresponds to at least one leakage path is H1, and it is defined that a thickness of a portion of the first dielectric portion the does not correspond to the leakage path is H2. A value range of a ratio of H1 to H2 may be determined according to the reverse breakdown voltage and the leakage loss of the back contact solar cell in an actual application scenario, and is not specifically limited herein. For example, the ratio of H1 to H2 may be greater than 0 and less than or equal to 0.5. The high resistance of an electrical connection between the first doped semiconductor layer and the second doped semiconductor layer through the leakage path caused by a large thickness of the remaining portion of the first dielectric layer at the leakage path due to a large ratio of H1 to H2 can be avoided, thereby reducing the transport heat generation power at the leakage path when the back contact solar cell is shaded, thereby further reducing hot-spot risk in back contact solar cells.

In a third manner, a density of a portion of the first dielectric portion that corresponds to the leakage path is less than a density of the remaining portion of the first dielectric portion. Another example may be provided for the arrangement manner of the first dielectric portion at the leakage path. In this case, the portion of the first dielectric portion that corresponds to the leakage path has a small density, and correspondingly the portion of the first dielectric portion that corresponds to the leakage path has low compactness, so that the impedance level against diffusion of dopants in the one that is far away from the semiconductor substrate by the portion of the dielectric layer that corresponds to the leakage path to the opposite side of the dielectric layer through the leakage path can be reduced, thereby reducing hot-spot risk in back contact solar cells. The density of the portion of the first dielectric portion that corresponds to the leakage path and the density of the remaining portion of the first dielectric portion may be determined according to the requirements of the reverse breakdown voltage and the leakage loss of the back contact solar cell in an actual application scenario, and are not specifically limited herein.

For the leakage path disposed in the first dielectric portion, in terms of the arrangement quantity and sizes, the quantity and sizes of the leakage paths disposed in the first dielectric portion affect the proportion of the reverse leakage region on the third region, and further affects the reverse breakdown voltage and the leakage loss of the back contact solar cell. Therefore, the arrangement quantity and sizes of the leakage paths in the first dielectric portion may be determined according to actual application scenarios, and are not specifically limited herein. Only one leakage path may be disposed or a plurality of leakage paths may be disposed in the first dielectric portion. In addition, the meaning specifically represented by the size of the leakage path may be determined according to specific topography of the leakage path, and is not specifically limited herein. Generally, the size of the leakage path is a cross-sectional size in a direction perpendicular to the first doped semiconductor layer to the second doped semiconductor layer. For example, when the cross-sectional shape of the leakage path is a circle, the size of the leakage path may be a radius or diameter of the circle. For another example, when the cross-sectional shape of the leakage path is a square, the size of the leakage path may be a side length of the square. Next, apart from the circle or square, the cross-sectional shape of the leakage path may alternatively be an ellipse, a triangle, a rhombus, a trapezoid, a parallelogram, a rectangle, or another shape.

For example, a total size of the leakage paths may be greater than or equal to 50 μm and is less than or equal to 200 μm. For example, the total size of the leakage paths may be 50 μm, 60 μm, 80 μm, 100 μm, 120 μm, 150 μm, 180 μm, 200 μm, or the like. (It needs to be noted that when only one leakage path is opened in the first dielectric portion, the total size of the leakage paths is the size of the single leakage path. When a plurality of leakage paths are opened in the first dielectric portion, the total size of the leakage paths is a sum of the sizes of the plurality of leakage paths.) When the back contact solar cell provided in the embodiments of the present application is disposed in an installation environment with minimal shading obstructions such as bird droppings, leaves, or dust, the total size of the leakage paths may be set within a small range, to reduce the proportion of the reverse leakage region between the first region and the second region, thereby further reducing the leakage loss of the back contact solar cell in the forward voltage region, and ensuring that the back contact solar cell has high operating efficiency. When the back contact solar cell provided in the embodiments of the present application is disposed in an installation environment with significant shading obstructions such as bird droppings, leaves, or dust, the total size of the leakage paths may be set within a large range, to increase the proportion of the reverse leakage region between the first region and the second region, thereby reducing the reverse breakdown voltage of the back contact solar cell, and ensuring that the back contact solar cell has low hot-spot risk. However, the excessively large total size of the leakage paths is prone to localized overheating and affects hot spot prevention, and this problem is particularly pronounced especially in the case of a single leakage path. Therefore, the control of the total size of the leakage paths within the foregoing range is conducive to improving the hot-spot resistance of the back contact solar cell. As can be learned, the total size of the leakage paths may be set according to different environmental requirements, thereby improving the applicability of the back contact solar cell provided in the embodiments of the present application to different actual application scenarios. The size of the single leakage path is a distance between two points on the edges of the leakage path in a direction, and the largest size in this dimension is typically selected. The total size of the leakage paths is a sum of the sizes of the leakage paths obtained in the same direction.

For example, in a case that the plurality of leakage paths are disposed in the first dielectric portion, a size of at least one leakage path is greater than or equal to 5 μm and less than or equal to 80 μm. For example, in a case that a plurality of leakage paths are disposed in the first dielectric portion, the size of at least one leakage path may be 5 μm, 10 μm, 20 μm, 30 μm, 40 μm, 50 μm, 60 μm, 70 μm, 80 μm, or the like. In this way, the applicability of the back contact solar cell provided in the embodiments of the present application to different actual application scenarios is improved. For the application principle of the beneficial effects in this case, refer to the application principle of the beneficial effects of that the total size of the leakage paths is greater than or equal to 50 μm and less than or equal to 200 μm above. Details are not described herein again. Moreover, the size of the single leakage path is reduced, so that hot-spot overheating can be avoided, thereby enhancing the risk resilience of the back contact solar cell. Multi-point configuration can ensure timely and effective dispersion of leakage current, thereby ensuring that the back contact solar cell has low hot-spot risk.

Moreover, in a case that the plurality of leakage paths are disposed in the first dielectric portion, the distribution of different leakage paths affects the distribution density of reverse leakage regions on the third region and the scattering level of the reverse leakage regions on the third region, and further affects the anti-burnout capability and operating efficiency of the back contact solar cell. Therefore, the distribution of different leakage paths may be determined according to the requirements of the back contact solar cell for the foregoing cases in an actual application scenario, and is not specifically limited herein.

For example, in a case that the plurality of leakage paths are disposed in the first dielectric portion, a spacing between two adjacent leakage paths may be greater than or equal to 1 μm and less than or equal to 200 μm. For example, the spacing between two adjacent leakage paths may be 1 μm, 5 μm, 10 μm, 20 μm, 50 μm, 80 μm, 100 μm, 150 μm, 200 μm, or the like. The spacing between two adjacent leakage paths is a distance between edges of two adjacent leakage paths that are close to each other, and typically the shortest distance is selected as the spacing. It may be understood that in a case that the size of the leakage path is fixed, a spacing between geometric centers of two adjacent leakage paths is inversely proportional to a distribution density of the leakage paths in the first dielectric portion, and the spacing between two adjacent leakage paths is also inversely proportional to the distribution density of the leakage paths in the first dielectric portion. The distribution density of the leakage paths in the first dielectric portion is approximately directly proportional to the leakage loss of the back contact solar cell in the forward voltage region, and is inversely proportional to the reverse breakdown voltage of the back contact solar cell. Based on this, when the back contact solar cell provided in the embodiments of the present application is disposed in an installation environment with minimal shading obstructions such as bird droppings, leaves, or dust, the spacing between the geometric centers of two adjacent leakage paths or the spacing between two adjacent leakage paths may be set within a large range, to reduce the proportion of the reverse leakage region between the first region and the second region, thereby further reducing the leakage loss of the back contact solar cell in the forward voltage region, and ensuring that the back contact solar cell has high operating efficiency. When the back contact solar cell provided in the embodiments of the present application is disposed in an installation environment with significant shading obstructions such as bird droppings, leaves, or dust, the spacing between the geometric centers of two adjacent leakage paths or the spacing between two adjacent leakage paths may be set within a small range, to increase the proportion of the reverse leakage region between the first region and the second region, thereby reducing the reverse breakdown voltage of the back contact solar cell, and ensuring that the back contact solar cell has low hot-spot risk. Moreover, a spacing between two adjacent hot spots may also be controlled by controlling the spacing between the geometric centers of two adjacent leakage paths or the spacing between two adjacent leakage paths, and hot spots are scattered by adjusting the spacing, to avoid overlapping of hot spots and avoid localized overheating. As can be learned, the spacing between the geometric centers of two adjacent leakage paths or the spacing between two adjacent leakage paths may be set according to different environmental requirements, thereby improving the applicability of the back contact solar cell provided in the embodiments of the present application to different actual application scenarios.

Next, in a case that the plurality of leakage paths are disposed in the first dielectric portion, spacings between every two adjacent leakage paths may be equal or may be not equal. When the spacings between every two adjacent leakage paths are equal, spacings between adjacent leakage points between the first doped semiconductor layer and the second doped semiconductor layer in the stacked structure are equal, so that reverse leakage regions are evenly distributed on the third region, hot regions are scattered, and a burn-out problem caused by localized heat concentration of the back contact solar cell is prevented, thereby further improving the anti-burnout capability of the back contact solar cell, and effectively improving the safety performance of the back contact solar cell.

For example, a minimum spacing between the leakage path and an edge of the first dielectric portion may be greater than or equal to 5 μm and less than or equal to 50 μm. For example, the minimum spacing between the leakage path and the edge of the first dielectric portion may be 5 μm, 10 μm, 20 μm, 25 μm, 30 μm, 35 μm, 40 μm, 45 μm, 50 μm, or the like. In an actual manufacturing process, the leakage path may be disposed in the first dielectric portion by using laser etching, wet etching, or another etching process. Based on this, a range of the minimum spacing is specified, so that damage caused to a portion of the first doped semiconductor layer disposed on the first region that is close to the third region and/or a portion of the second doped semiconductor layer disposed on the second region that is close to the third region by an excessively small distance between the leakage path and the edge of the first dielectric portion in a process of manufacturing the leakage path can be avoided, to avoid affecting carrier collection, thereby avoiding affecting the efficiency of the solar cell. A low distribution density of the leakage paths in the first dielectric portion caused by a large minimum spacing can be further prevented, so that the reverse leakage region has a specific proportion on the third region, thereby ensuring that the back contact solar cell has low hot-spot risk. Moreover, in an actual manufacturing process, the minimum spacing between the leakage path and the edge of the first dielectric portion falls within the foregoing range, so that the impact of the etching process on other structures close to the edge of the first dielectric portion due to a small minimum spacing can be prevented. For example, in a case that the leakage path is formed by using a laser etching process, high-temperature laser can be prevented from causing damage to the portion of the first doped semiconductor layer disposed on the first region that is close to the third region and/or the portion of the second doped semiconductor layer disposed on the second region that is close to the third region, thereby ensuring that the first doped semiconductor layer disposed on the first region and the second doped semiconductor layer disposed on the second region have high carrier collection capability, and further improving the operating performance of the back contact solar cell. Moreover, a low distribution density of the leakage paths in the first dielectric portion caused by a large minimum spacing can be further prevented, so that the reverse leakage region has a specific proportion on the third region, thereby ensuring that the back contact solar cell has low hot-spot risk.

The specific distribution of the leakage path between the first region and the second region may be determined according to the topography of the first region and the second region and an actual application scenario, and is not specifically limited herein.

Figure 33:
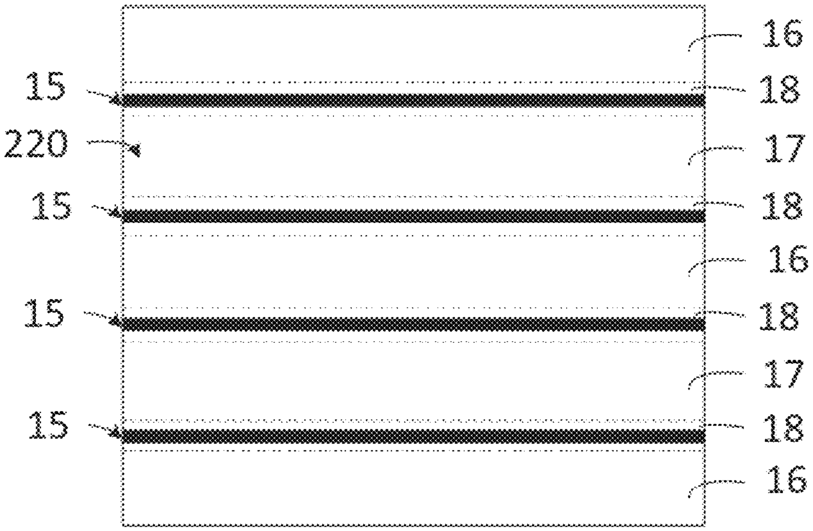
FIG. 33 is a schematic diagram 7 of possible distribution positions of leakage paths in a local region on a side of a first surface in the back contact solar cell according to the second group of embodiments of the present application.
Figure 34:
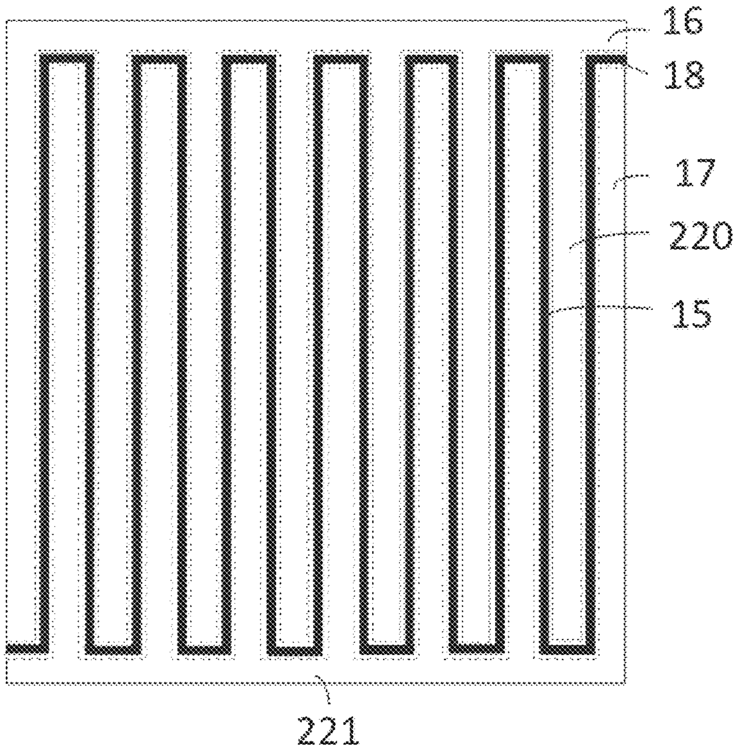
FIG. 34 is a schematic diagram 8 of possible distribution positions of leakage paths in a local region on a side of a first surface in the back contact solar cell according to the second group of embodiments of the present application.

As shown in FIG. 33 and FIG. 34, in a single stacked structure, in a possible implementation, in a single stacked structure, in an extension direction of the stacked structure, the leakage path 15 is continuously distributed. In this way, the butt area of the electrical connection region between the first doped semiconductor layer and the second doped semiconductor layer through the leakage path 15 is increased, to increase the area proportion of the reverse leakage region on the first surface, thereby further improving the anti-burnout capability of the back contact solar cell. In addition, when the leakage path 15 is continuously distributed in the extension direction of the stacked structure in the single stacked structure, the size of the leakage path 15 is a width in the direction from the first region 16 to the second region 17. For example, in a case that the first region 16 and the second region 17 are spaced apart in a striped pattern, the size of the leakage path 15 is a width of the leakage path 15 in a distribution direction of different digitate regions 220. For another example, in a case that the first region 16 and the second region 17 are spaced apart in an interdigitated pattern, the size of the leakage path 15 is a width of the leakage path 15 in the direction from the first region 16 to the second region 17. For example, the size of the leakage path may be greater than or equal to 50 μm and is less than or equal to 200 μm. For example, the size of the leakage path may be 50 μm, 60 μm, 70 μm, 80 μm, 100 μm, 120 μm, 150 μm, 200 μm, or the like.

Figure 31:
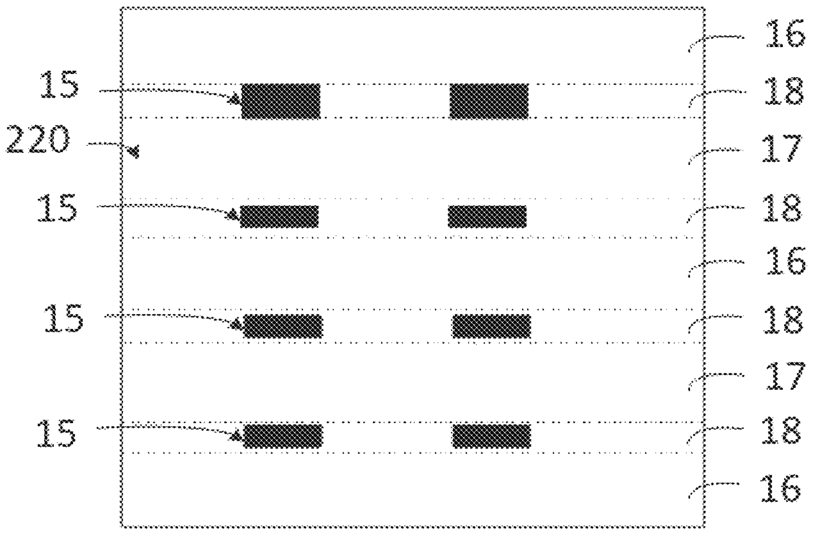
FIG. 31 is a schematic diagram 5 of possible distribution positions of leakage paths in a local region on a side of a first surface in the back contact solar cell according to the second group of embodiments of the present application.
Figure 32:
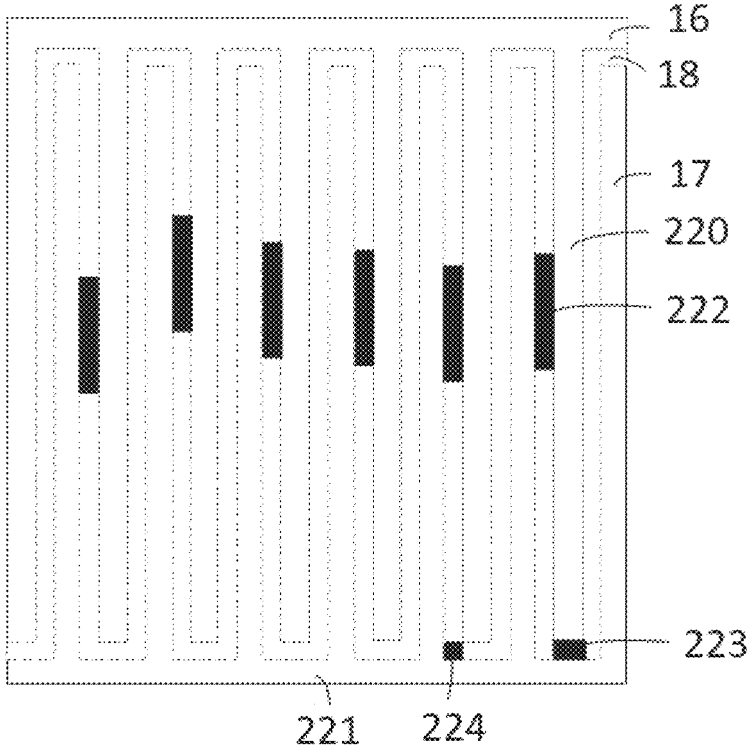
FIG. 32 is a schematic diagram 6 of possible distribution positions of leakage paths in a local region on a side of a first surface in the back contact solar cell according to the second group of embodiments of the present application.
Figure 35:
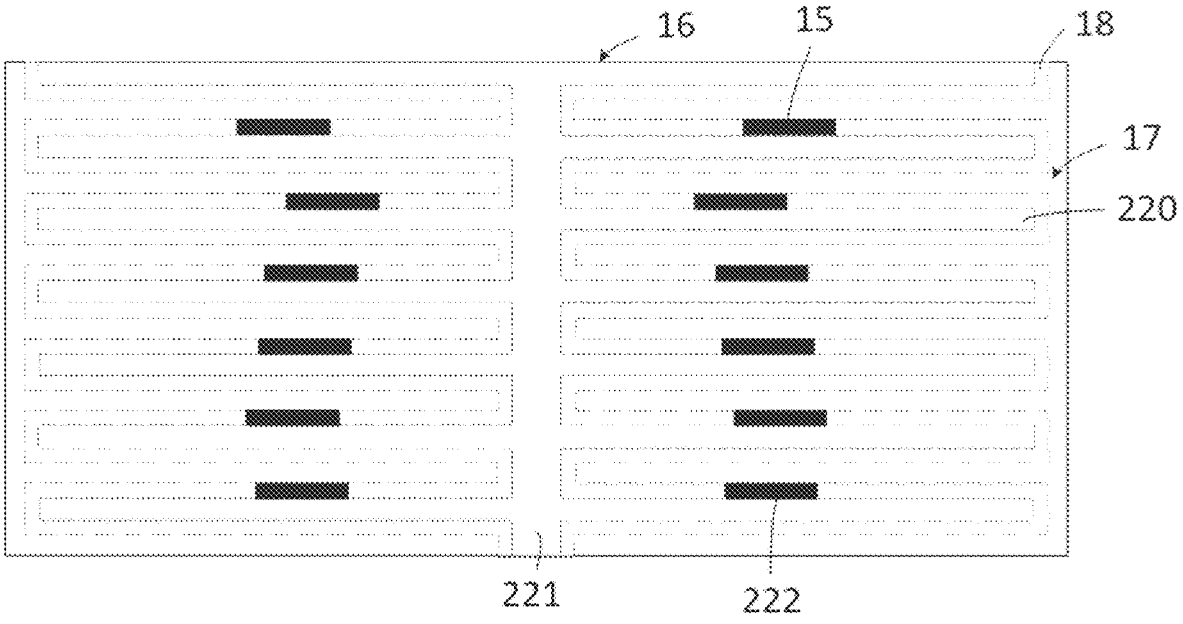
FIG. 35 is a schematic diagram 9 of possible distribution positions of leakage paths in a local region on a side of a first surface in the back contact solar cell according to the second group of embodiments of the present application.

Alternatively, as shown in FIG. 31, FIG. 32, and FIG. 35, a plurality of leakage paths 15 that are distributed at intervals may be disposed in the first dielectric portion located in the single stacked structure. Compared with the continuous distribution of the leakage path 15, a portion of the first dielectric portion at a gap between adjacent leakage paths 15 has an insulating or semi-insulating effect, so that the first doped semiconductor layer and the second doped semiconductor layer having opposite conductivity types can be electrically isolated. Therefore, compared with the continuously distributed leakage path, when the plurality of leakage paths that are distributed at intervals are disposed in the first dielectric portion located in the single stacked structure, the butt area of the electrical connection region between the first doped semiconductor layer and the second doped semiconductor layer through the leakage path 15 is reduced, to reduce the area proportion of the reverse leakage region on the first surface, thereby further enhancing the operating performance of the back contact solar cell. Moreover, with such an arrangement, leakage current is more dispersed, and hot spots are more scattered, to prevent a burn-out problem caused by localized heat concentration, thereby further improving the anti-burnout capability of the back contact solar cell. The direction in which the different leakage paths 15 disposed in the first dielectric portion located in the single stacked structure are distributed at intervals may be set according to actual requirements, and are not specifically limited herein. For example, the direction in which the different leakage paths 15 disposed in the first dielectric portion located in the single stacked structure are distributed at intervals may be parallel to the extension direction of the stacked structure, or may be parallel to the direction from the first region 16 to the second region 17, or may be parallel to a diagonal direction of the third region 18.

For example, as shown in FIG. 27, when the first region 16 and the second region 17 are alternately spaced apart in a striped pattern, an orthographic projection of the leakage path 15 onto the first surface is located between a digitate region 220 included in the first region 16 and an adjacent digitate region 220 included in the second region 17.

For example, when the first region and the second region are spaced apart in an interdigitated pattern, as shown in FIG. 28, the leakage path may include at least one first leakage path 222, and an orthographic projection of the first leakage path 222 onto the first surface is located between a digitate region 220 included in the first region 16 and an adjacent digitate region 220 included in the second region 17. In addition/Alternatively, as shown in FIG. 28, the leakage path includes at least one second leakage path 223, and an orthographic projection of the second leakage path 223 onto the first surface is located between a connection region 221 included in one of the first region 16 and the second region 17 and a digitate region 220 included in the other one of the first region 16 and the second region 17. In addition/Alternatively, as shown in FIG. 28, the leakage path further may include at least one third leakage path 224. In an extension direction of the diagonal of the digitate region 220, an orthographic projection of the third leakage path 224 in the first surface is located between a vertex angle of a digitate region 220 included in one of the first region 16 and the second region 17 and the other one of the first region 16 and the second region 17. In a case that the first region 16 and the second region 17 are spaced apart in an interdigitated pattern, the arrangement position of the leakage path between the first region 16 and the second region 17 has at least the foregoing three optional examples, so that the applicability of the back contact solar cell provided in the present application to different application scenarios is improved, and it is also not necessary to strictly control manufacturing precision or add an additional operation step to form the leakage path at a fixed position, thereby reducing the manufacturing difficulty of the back contact solar cell and simplifying the manufacturing procedure of the back contact solar cell. (It needs to be noted that when the possible distribution of the leakage path on a side of the first surface is described by using limited figures, both FIG. 27 and FIG. 28 show various possible distribution positions of the leakage path in the same figure. This does not represent that the leakage paths are definitely disposed at the various possible distribution positions simultaneously in the figure in an actual application process.)

In a case that the first region and the second region are spaced apart in an interdigitated pattern, when the leakage path includes at least one first leakage path, in the first direction, the length of the digitate region is larger than the width of the digitate region. Therefore, the first leakage path disposed between a digitate region included in the first region and an adjacent digitate region included in the second region has a large arrangement range in the first direction. Spacings between positions of a short side and a vertex angle of a digitate region included in one of the first region and the second region and a connection region included in the other one of the first region and the second region is small, making it easier manufacture a conductive material at the second leakage path and the third leakage path. Compared with a lengthwise spacing between two adjacent digitate regions and a spacing between a digitate region and a connection region that is spaced apart from and adjacent to the digitate region, the spacing between a vertex angle of a digitate region included in one of the first region and the second region in the extension direction of the diagonal and the other one of the first region and the second region is large. A width between a vertex angle of a digitate region included in one of the first region and the second region disposed in the stacked structure and the other one of the first region and the second region is also large. In this case, a third leakage path with a large cross-sectional area in the direction parallel to the first surface may be disposed. In other words, the cross-sectional area of the third leakage path in the direction parallel to the first surface may be greater than the cross-sectional area of the at least one of the first leakage path and the second leakage path in the direction parallel to the first surface. The leakage path with a large cross-sectional area may be disposed on the stacked structure with a large width, so that while it is ensured that the back contact solar cell has a low reverse breakdown voltage, it is not necessary to arrange the at least one of the first leakage path and the second leakage path with a large cross-sectional area at the position of the spacing to increase the proportion of the reverse leakage region on the first surface, so that process difficulty is reduced, thereby improving the yield of the back contact solar cell.

Certainly, the cross-sectional area of the third leakage path in the direction parallel to the first surface may alternatively be less than or equal to the cross-sectional area of the at least one of the first leakage path and the second leakage path in the direction parallel to the first surface.

For example, as shown in FIG. 29 and FIG. 30, as described above, in a case that one of the first doped semiconductor layer and the second doped semiconductor layer included in the stacked structure that is close to the semiconductor substrate is the first doped semiconductor layer, at least a portion of the first region 16 and the third region 18 form a rectangular region; or, in a case that one of the first doped semiconductor layer and the second doped semiconductor layer included in the stacked structure that is close to the semiconductor substrate is the second doped semiconductor layer, at least portions of the second region 17 and the third region 18 form a rectangular region. A single rectangular region includes at least two first sides (i.e., long sides of the rectangular region) extending in a first direction. The single rectangular region includes at least two second sides (i.e., the short sides of the rectangular region) extending in a second direction. The first direction is parallel to an extension direction of a long side of the rectangular region, and the second direction is parallel to an extension direction of a short side of the rectangular region. In addition, the single rectangular region, at least one first side and an adjacent second side form a vertex angle of the rectangular region. (When the rectangular region is a regular rectangular region with vertex angles being right angles, a vertex angle of rectangular region is formed by connecting only a first side and an adjacent second side of the single rectangular region. When the rectangular region is includes a rectangular region with a chamfer, and a vertex angle of the rectangular region is formed by connecting a first side of the single rectangular region, an adjacent second side, and an adjacent chamfer side.) It may be understood that the stacked structure is disposed on the third region 18, and the first dielectric portion with the leakage path is disposed between the first doped semiconductor layer and the second doped semiconductor layer included in the stacked structure. Based on this, when at least a portion of the first region 16 and the third region 18 form a rectangular region, the leakage path is disposed in a range of the third region 18 corresponding to the rectangular region. Alternatively, when at least a portion of the second region 17 and the third region 18 form a rectangular region, the leakage path is disposed in a range of the third region 18 corresponding to the rectangular region.

In the foregoing case, the leakage path may include at least one first leakage path 222, and the first leakage path 222 is disposed at the at least one first side in the first direction included in the rectangular region; and/or, the leakage path may further include at least one second leakage path 223, and the second leakage path 223 is disposed at the at least one second side in the second direction included in the rectangular region.

Next, the leakage path may further include at least one third leakage path 224. The third leakage path 224 is disposed at at least one vertex angle of the rectangular region.

As can be learned, the arrangement position of the leakage path in the rectangular region has at least the foregoing three optional examples, so that the applicability of the back contact solar cell provided in the embodiments of the present application to different application scenarios is improved, and it is also not necessary to strictly control manufacturing precision or add an additional operation step to form the leakage path at a fixed position, thereby reducing the manufacturing difficulty of the back contact solar cell and simplifying the manufacturing procedure of the back contact solar cell.

The leakage path may include only at least one of the first leakage path, the second leakage path, and the third leakage path, or may include any two of the foregoing three, or may include all the foregoing three. A specific arrangement position of the leakage path may be determined according to the distribution of the first region, the second region, and the third region. (It needs to be noted that when the possible distribution of the leakage path on a side of the first surface is described by using limited figures, both FIG. 29 and FIG. 30 show various possible distribution positions of the leakage path in the same figure. This does not represent that the leakage paths are definitely disposed at the various possible distribution positions simultaneously in the figure in an actual application process.)

An example in which at least a portion of the first region and the third region form a rectangular region is used for description.

For example, as shown in FIG. 29, when the entire first region 16 and the third region 18 form a rectangular region, which is alternately spaced apart with a portion of the second region 17 in a striped pattern, the leakage path may include at least one first leakage path 222, and/or, the at least one leakage path includes at least one third leakage path 224.

For another example, as shown in FIG. 30, when a portion of the first region 16 and the third region 18 form a rectangular region and the remaining region of the first region 16 and a portion of the second region 17 are alternately spaced apart in an interdigitated, the leakage path may include at least one first leakage path 222, and/or, the leakage path may include at least one second leakage path 223, and/or, the leakage path may further include at least one third leakage path 224.

It should be noted that as shown in FIG. 29 and FIG. 30, when the leakage path includes at least one first leakage path 222, in the first direction, the length of the rectangular region is larger than the width of the rectangular region. Therefore, an arrangement range of the first leakage path 222 on the long side of the rectangular region is large. At the positions of a short side and a vertex angle of the rectangular region, it is easier to manufacture a conductive material at the second leakage path 223 and the third leakage path 224. Next, compared with a spacing between the long side of the rectangular region and an electrode and a spacing between the short side of the rectangular region and the electrode, a spacing between the vertex angle of the rectangular region and the electrode is larger. In this case, the third leakage path 224 with a large cross-sectional area in the direction parallel to the first surface may be disposed. In other words, the cross-sectional area of the third leakage path 224 in the direction parallel to the first surface may be greater than the cross-sectional area of the at least one of the first leakage path 222 and the second leakage path 223 in the direction parallel to the first surface. In this way, the leakage path with a large cross-sectional area may be disposed on the stacked structure with a large width, so that while it is ensured that the back contact solar cell has a low reverse breakdown voltage, it is not necessary to arrange the at least one of the first leakage path 222 and the second leakage path 223 with a large cross-sectional area at the position of the spacing to increase the proportion of the reverse leakage region on the first surface, so that process difficulty is reduced, thereby improving the yield of the back contact solar cell.

Certainly, the cross-sectional area of the third leakage path in the direction parallel to the first surface may alternatively be less than or equal to the cross-sectional area of the at least one of the first leakage path and the second leakage path in the direction parallel to the first surface.

Moreover, it needs to be noted that as described above, in a case that the third region and at least a portion of one of the first region and the second region form a rectangular region, as shown in FIG. 33, the third region 18 may be located between regions of the first region 16 and regions of the second region 17. In this case, the first region 16 and the second region 17 are spaced apart in a striped pattern. Alternatively, the third region 18 may be located between only a portion of the first region 16 and only a portion of the second region 17. In this case, the distribution of the first region 16 and the second region 17 may be set according to actual requirements. For example, the first region and the second region may be spaced apart in a striped pattern, or may be spaced apart in an interdigitated pattern.

Optionally, embodiments of the present application provide a method for manufacturing a back contact solar cell. The method for manufacturing a back contact solar cell may include the following steps.

First, a semiconductor substrate is provided. The semiconductor substrate includes a first surface and a second surface. The first surface includes a first region and a second region that are spaced apart and a third region that is located between the first region and the second region. For the material and the conductivity type of the semiconductor substrate and the distribution of the first region, the second region, and the third region on the first surface, refer to the above. Details are not described herein again.

Next, a first doped semiconductor layer disposed on the first region and the third region is formed.

For example, an integral continuous intrinsic semiconductor layer across the first surface may be formed by using chemical vapor deposition or another process. The intrinsic semiconductor layer may then be doped by using diffusion, ion implantation, or another doping process, to enable the intrinsic semiconductor layer to form the first doped semiconductor layer. It needs to be noted that when a material of the first doped semiconductor layer includes silicon and the first doped semiconductor layer is formed by using a diffusion process, after the first doped semiconductor layer is formed, a doped silicon glass layer is further formed on a side of the first doped semiconductor layer away from the semiconductor substrate. Next, in an actual manufacturing process, in other cases, if the doped silicon glass layer is not formed after the first doped semiconductor layer is formed, the mask layer needs to be formed on the side of the first doped semiconductor layer away from the semiconductor substrate by using chemical vapor deposition or another process. The doped silicon glass layer or the mask layer may then be selectively etched by using laser or another process to remove a portion of the doped silicon glass layer or the mask layer that is located on the second region (or portions corresponding to a local region of the first region and the second region, or portions corresponding to the second region and the third region; or portions corresponding to the second region, the third region, and a fourth region; or portions corresponding to a local region of the first region, the second region, and the third region; or portions corresponding to a local region of the first region, the second region, the third region, and the fourth region). Next, under the protection of the doped silicon glass layer or the mask layer, the first doped semiconductor layer in a region that is not covered by the doped silicon glass layer or the mask layer is removed.

It needs to be noted that, in a case that the dielectric layer does not include the doped silicon glass layer or the mask layer, the doped silicon glass layer or the mask layer further needs to be removed before the second doped semiconductor layer is formed.

Moreover, in a case that the manufactured back contact solar cell further includes the first interface passivation layer, a first interface passivation layer further needs to be formed on a side of the first surface before the first doped semiconductor layer is formed. After an integral continuous first doped semiconductor layer is formed across the first interface passivation layer, the first interface passivation layer and the first doped semiconductor layer may then be selectively etched based on the same doped silicon glass layer or mask layer. Alternatively, the first interface passivation layer may be selectively etched separately through corresponding masking before the first doped semiconductor layer is formed.

Next, a dielectric layer disposed at least on a portion of the first doped semiconductor layer that corresponds to the third region is formed.

For example, the dielectric layer is fabricated from the doped silicon glass layer or the mask layer, the leakage path may be opened in the first dielectric portion by using a laser etching process, a wet etching process, or a process having an etching effect. In a case that the dielectric layer includes the doped silicon glass layer or the mask layer and further includes other dielectric film layers or the dielectric layer does not include the doped silicon glass layer or the mask layer, an integral continuous dielectric layer needs to be formed across the first doped semiconductor layer and the second region by using chemical vapor deposition or another process, and a portion of the dielectric layer that does not correspond to the third region is then removed by using laser or another etching process. In addition, the leakage path can further be opened in the first dielectric portion included in the dielectric layer.

Next, a second doped semiconductor layer disposed on the second region and the third region is formed. A conductivity type of the second doped semiconductor layer is opposite to that of the first doped semiconductor layer. On the third region, the first doped semiconductor layer and the second doped semiconductor layer overlap in a thickness direction of the semiconductor substrate to form a stacked structure. A portion of the dielectric layer that is disposed between the first doped semiconductor layer and the second doped semiconductor layer in the thickness direction of the semiconductor substrate is the first dielectric portion. In the dielectric layer, at least one leakage path is disposed in the first dielectric portion. On the third region, in a direction from the first region to the second region, a width of the first dielectric portion is greater than or equal to a width of one of the first doped semiconductor layer and the second doped semiconductor layer included in the stacked structure that is far away from the semiconductor substrate.

For example, an integral continuous intrinsic semiconductor layer may be at least formed across the first doped semiconductor layer and the second region by using chemical vapor deposition or another process. The intrinsic semiconductor layer may then be doped by using diffusion, ion implantation, or another doping process, to enable the intrinsic semiconductor layer to form the second doped semiconductor layer. Next, the mask layer needs to be formed on a side of the second doped semiconductor layer away from the semiconductor substrate by using chemical vapor deposition or another process (in a case that after the second doped semiconductor layer is formed, the doped silicon glass layer is formed on the side of the second doped semiconductor layer away from the semiconductor substrate, and the doped silicon glass layer may be used as the mask layer, it is not necessary to additionally form the mask layer by using a chemical vapor deposition process). The mask layer may then be selectively etched by using laser or another process to remove a portion of the mask layer that is located on the first region (or a portion of the second doped semiconductor layer that covers the first region corresponding to the first doped semiconductor layer and a portion of the second doped semiconductor layer that covers the fourth region). Next, under the protection of the mask layer, the first region corresponding to the second doped semiconductor layer is at least removed (if the second doped semiconductor layer is not formed on the fourth region, a portion of the second doped semiconductor layer that corresponds to the fourth region further needs to be removed). Finally, the mask layer may be removed by using wet etching or another process.

It needs to be noted that in a case that the manufactured back contact solar cell further includes a second interface passivation layer, an integral continuous second interface passivation layer further needs to be formed in the first doped semiconductor layer and the second region before the second doped semiconductor layer is formed. After an integral continuous second doped semiconductor layer is formed across the second interface passivation layer, the second interface passivation layer and the second doped semiconductor layer may then be selectively etched based on the same mask layer. Alternatively, the second interface passivation layer may be selectively etched separately through corresponding masking before the second doped semiconductor layer is formed.

According to a second aspect, embodiments of the present application provide a photovoltaic module. The photovoltaic module includes a solar cell string and an encapsulation layer. The solar cell string is formed by connecting a plurality of back contact solar cells provided in the first aspect and various embodiments thereof. The encapsulation layer is used for covering a surface of the solar cell string.

For beneficial effects of the second aspect and various implementations of the second aspect in the embodiments of the present application, refer to the analysis of the beneficial effects of the first aspect and various implementations of the first aspect. Details are not described herein again.

In the foregoing descriptions, technical details such as patterning and etching of the layers are not described in detail. However, a person skilled in the art should understand that a layer, a region, and the like of a required shape may be formed through various technical means. In addition, to form the same structure, a person skilled in the art may further design a method that is not exactly the same as the method described above. In addition, although the embodiments are separately described above, this does not mean that the measures in the embodiments cannot be advantageously used in combination.

The embodiments of the present application are described above. However, these embodiments are merely for clearer description and are not intended to limit the scope of the present application. The scope of the present application is defined by the appended claims and equivalents thereof. A person skilled in the art may make various substitutions and modifications without departing from the scope of the present application, and the substitutions and modifications shall fall within the scope of the present application. Unless there is a technical obstacle or contradiction, the technical features disclosed in the present application may be freely combined to form other embodiments, and these other embodiments all fall within the scope of protection of the present application.

The invention claimed is:

1. A back contact solar cell, comprising:

a semiconductor substrate, wherein the semiconductor substrate comprises a first surface and a second surface that are opposite to each other, and wherein the first surface comprises a first region and a second region that are spaced apart and a third region located between the first region and the second region;

a first doped semiconductor layer, disposed on the first region and the third region;

a second doped semiconductor layer, disposed on the second region and the third region, wherein doping types of the first doped semiconductor layer and the second doped semiconductor layer are opposite, and wherein on the third region, the first doped semiconductor layer and the second doped semiconductor layer overlap along a thickness direction of the semiconductor substrate to form a stacked structure; and a dielectric layer, disposed at least between the first doped semiconductor layer and the second doped semiconductor layer, wherein at least one leakage path is disposed in the dielectric layer, and wherein a thickness of a portion of the dielectric layer that is absent of a leakage path is greater than or equal to 13 nm, wherein one of the first doped semiconductor layer and the second doped semiconductor layer comprised in the stacked structure that is closer to the semiconductor substrate comprises:

a top surface away from the semiconductor substrate, a bottom surface close to the semiconductor substrate, and a side surface connecting the bottom surface and the top surface, and wherein one of the first doped semiconductor layer and the second doped semiconductor layer comprised in the stacked structure that is farther from the semiconductor substrate covers a portion of the top surface and a portion of the side surface;

wherein the dielectric layer comprises a first dielectric portion and a second dielectric portion; and wherein the first dielectric portion is disposed between the one of the first doped semiconductor layer and the second doped semiconductor layer comprised in the stacked structure that is farther from the semiconductor substrate and the top surface, and the second dielectric portion is disposed between the one of the first doped semiconductor layer and the second doped semiconductor layer comprised in the stacked structure that is farther from the semiconductor substrate and the side surface.

2. The back contact solar cell according to claim 1, wherein the dielectric layer is discontinuous at the at least one leakage path; or wherein a thickness of a portion of the dielectric layer in which a leakage path is disposed is less than or equal to 7 nm.

3. The back contact solar cell according to claim 1, wherein the first doped semiconductor layer and the second doped semiconductor layer are connected through the dielectric layer.

4. The back contact solar cell according to claim 1, wherein the back contact solar cell further comprises:

a third doped semiconductor portion, located between the first doped semiconductor layer and the second doped semiconductor layer, wherein the third doped semiconductor portion is connected to the first doped semiconductor layer and the second doped semiconductor layer.

5. The back contact solar cell according to claim 4, wherein material of the third doped semiconductor portion comprises at least one doping element, wherein a doping type of the third doped semiconductor portion is same as one of the doping types of the first doped semiconductor layer and the second doped semiconductor layer, and wherein a doping concentration of doping elements in the third doped semiconductor portion is less than a doping concentration of doping elements in the one of the first doped semiconductor layer and the second doped semiconductor layer having a same doping type as the third doped semiconductor portion.

6. The back contact solar cell according to claim 4, wherein the dielectric layer is disposed between the third doped semiconductor portion and at least one of the first doped semiconductor layer and the second doped semiconductor layer, and wherein at least one end of the third doped semiconductor portion is connected to the first doped semiconductor layer or the second doped semiconductor layer through the dielectric layer.

7. The back contact solar cell according to claim 6, wherein at least one Group IIIA doping element and at least one Group VA doping element are doped in a portion of the third doped semiconductor portion close to the dielectric layer.

8. The back contact solar cell according to claim 4, wherein at least one of a butt surface of a connection region between the third doped semiconductor portion and the first doped semiconductor layer and a butt surface of a connection region between the third doped semiconductor portion and the second doped semiconductor layer forms an included angle of less than 90° with the first surface of the semiconductor substrate.

9. The back contact solar cell according to claim 4, wherein a size of a grain in the third doped semiconductor portion is smaller than a size of a grain in at least one of the first doped semiconductor layer and the second doped semiconductor layer comprised in the stacked structure.

10. The back contact solar cell according to claim 1, wherein the first doped semiconductor layer comprised in the stacked structure is closer to the semiconductor substrate than the second doped semiconductor layer, and a surface of the third region is higher than a surface of the second region in a direction from the second surface to the first surface of the semiconductor substrate, and wherein the dielectric layer further extends at least between a sidewall of the third region transitioning to the second region and the second doped semiconductor layer; or wherein the second doped semiconductor layer comprised in the stacked structure is closer to the semiconductor substrate than the first doped semiconductor layer, and a surface of the third region is higher than a surface of the first region in a direction from the second surface to the first surface, and wherein the dielectric layer further extends at least between a sidewall of the third region transitioning to the first region and the first doped semiconductor layer.

11. The back contact solar cell according to claim 1, wherein a size of the leakage path is greater than or equal to 12 nm.

12. The back contact solar cell according to claim 1, wherein the dielectric layer is disposed between a portion of the first doped semiconductor layer and the first region comprised in the first surface, and the at least one leakage path is disposed in a portion of the dielectric layer that corresponds to the first region; and the dielectric layer is disposed between a portion of the second doped semiconductor layer and the second region comprised in the first surface, and the at least one leakage path is disposed in a portion of the dielectric layer that corresponds to the second region.

13. The back contact solar cell according to claim 1, wherein at least one of the at least one leakage path is located in the first dielectric portion; and at least one of the at least one leakage path is located in the second dielectric portion; and at least one of the at least one leakage path is located between the first dielectric portion and the second dielectric portion.

14. A photovoltaic module, wherein the photovoltaic module comprises:

a solar cell string, wherein the solar cell string is formed by connecting a plurality of back contact solar cells; and an encapsulation layer, wherein the encapsulation layer is configured to cover a surface of the solar cell string, wherein a back contact solar cell of the plurality of back contact solar cells comprises:

a semiconductor substrate, wherein the semiconductor substrate comprises a first surface and a second surface that are opposite to each other, and wherein the first surface comprises a first region and a second region that are spaced apart and a third region located between the first region and the second region;

a first doped semiconductor layer, disposed on the first region and the third region;

a second doped semiconductor layer, disposed on the second region and the third region, wherein doping types of the first doped semiconductor layer and the second doped semiconductor layer are opposite, and wherein on the third region, the first doped semiconductor layer and the second doped semiconductor layer overlap along a thickness direction of the semiconductor substrate to form a stacked structure; and a dielectric layer, disposed at least between the first doped semiconductor layer and the second doped semiconductor layer, wherein at least one leakage path is disposed in the dielectric layer, and wherein a thickness of a portion of the dielectric layer that is absent of a leakage path is greater than or equal to 13 nm, wherein one of the first doped semiconductor layer and the second doped semiconductor layer comprised in the stacked structure that is closer to the semiconductor substrate comprises:

a top surface away from the semiconductor substrate, a bottom surface close to the semiconductor substrate, and a side surface connecting the bottom surface and the top surface, and wherein one of the first doped semiconductor layer and the second doped semiconductor layer comprised in the stacked structure that is farther from the semiconductor substrate covers a portion of the top surface and a portion of the side surface;

wherein the dielectric layer comprises a first dielectric portion and a second dielectric portion; and wherein the first dielectric portion is disposed between the one of the first doped semiconductor layer and the second doped semiconductor layer comprised in the stacked structure that is farther from the semiconductor substrate and the top surface, and the second dielectric portion is disposed between the one of the first doped semiconductor layer and the second doped semiconductor layer comprised in the stacked structure that is farther from the semiconductor substrate and the side surface.

15. The back contact solar cell according to claim 1, further comprising:

a first electrode, electrically connected to the first doped semiconductor layer; and a second electrode, electrically connected to the second doped semiconductor layer.

* * * * *